(12) United States Patent
Park et al.

(10) Patent No.: US 12,431,257 B2
(45) Date of Patent: Sep. 30, 2025

(54) ELIMINATION OF WAVEGUIDE MODES IN ORGANIC LIGHT-EMITTING DIODES USING AN ULTRATHIN TRANSPARENT CONDUCTOR

(71) Applicant: THE REGENTS OF THE UNIVERSITY OF MICHIGAN, Ann Arbor, MI (US)

(72) Inventors: Yongbum Park, Ann Arbor, MI (US); Changyeong Jeong, Ann Arbor, MI (US); Lingjie Jay Guo, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 387 days.

(21) Appl. No.: 18/019,607

(22) PCT Filed: Aug. 3, 2021

(86) PCT No.: PCT/US2021/044306
§ 371 (c)(1),
(2) Date: Feb. 3, 2023

(87) PCT Pub. No.: WO2022/031676
PCT Pub. Date: Feb. 10, 2022

(65) Prior Publication Data
US 2023/0292542 A1    Sep. 14, 2023

Related U.S. Application Data

(60) Provisional application No. 63/060,536, filed on Aug. 3, 2020.

(51) Int. Cl.
*H01B 1/02*    (2006.01)
*H10K 50/81*   (2023.01)
(Continued)

(52) U.S. Cl.
CPC .............. *H01B 1/02* (2013.01); *H10K 50/81* (2023.02); *H10K 50/816* (2023.02);
(Continued)

(58) Field of Classification Search
None
See application file for complete search history.

(56) References Cited

U.S. PATENT DOCUMENTS

| | | |
|---|---|---|
| 4,224,082 A | 9/1980 | Jacobson |
| 4,331,829 A | 5/1982 | Palazzetti et al. |

(Continued)

FOREIGN PATENT DOCUMENTS

| | | |
|---|---|---|
| CN | 207701042 U | 8/2018 |
| JP | 2003346521 A | 12/2003 |

(Continued)

OTHER PUBLICATIONS

International Search Report regarding International Application No. PCT/US2021/047268 Dated Dec. 21, 2021.
(Continued)

*Primary Examiner* — Anthony Ho
(74) *Attorney, Agent, or Firm* — Harness, Dickey & Pierce, P.L.C.

(57) ABSTRACT

A method of increasing light emission efficiency in an organic light emitting diode (OLED) eliminates or reduces at least one waveguide mode selected from the group consisting of: transverse electric (TE0) mode, transverse magnetic (TM1) mode, and combinations thereof by disposing an ultrathin electrically conductive transparent metallic electrode having a first polarity within the OLED. The OLED has a transparent substrate on which the ultrathin electrically conductive transparent metallic electrode is disposed. It also has an emissive active assembly for generating photons defining first and second opposite sides. A conduc-
(Continued)

tive transparent metallic electrode is disposed along the first side. A second transparent electrode having a second polarity opposite to the first polarity disposed adjacent to the second side of emissive active assembly. The methods include increasing an external quantum efficiency of the organic light emitting diode to ≥about 20%. OLEDs with such a design are also contemplated.

39 Claims, 58 Drawing Sheets

(51) Int. Cl.
  *H10K 50/816* (2023.01)
  *H10K 50/828* (2023.01)
  *H10K 50/85* (2023.01)
  *H10K 50/854* (2023.01)
  *H10K 102/00* (2023.01)
  *H10K 102/10* (2023.01)

(52) U.S. Cl.
  CPC ........... *H10K 50/828* (2023.02); *H10K 50/85* (2023.02); *H10K 50/854* (2023.02); *H10K 2102/10* (2023.02); *H10K 2102/351* (2023.02)

(56) References Cited

U.S. PATENT DOCUMENTS

| | | |
|---|---|---|
| 4,338,480 A | 7/1982 | Antypas et al. |
| 4,441,143 A | 4/1984 | Richardson, Jr. |
| 4,746,370 A | 5/1988 | Woolf |
| 5,068,865 A | 11/1991 | Ohshima et al. |
| 5,110,368 A | 5/1992 | Otto et al. |
| 6,014,196 A | 1/2000 | Anzaki et al. |
| 6,060,658 A | 5/2000 | Yoshida et al. |
| 6,223,675 B1 | 5/2001 | Watt et al. |
| 7,797,939 B2 | 9/2010 | Green |
| 8,146,527 B2 | 4/2012 | Pellen |
| 8,553,742 B1 | 10/2013 | Wu |
| 8,664,514 B2 | 3/2014 | Watters |
| 8,787,420 B2 | 7/2014 | Kimoto et al. |
| 8,860,165 B2 | 10/2014 | Okaniwa et al. |
| 8,963,704 B2 | 2/2015 | Adami |
| 9,048,609 B2 | 6/2015 | Kim |
| 9,059,558 B2 | 6/2015 | Zhu et al. |
| 9,158,178 B2 | 10/2015 | Smeeton et al. |
| 9,172,207 B2 | 10/2015 | Chen |
| 9,180,551 B2 | 11/2015 | Paganelli |
| 9,203,212 B2 | 12/2015 | Kurobe et al. |
| 9,592,742 B1 | 3/2017 | Sosinov et al. |
| 9,608,228 B2 | 3/2017 | Kuroki |
| 9,806,294 B2 | 10/2017 | Sekine |
| 9,818,962 B2 | 11/2017 | Li |
| 10,027,412 B2 | 7/2018 | Eroglu et al. |
| 10,475,548 B2 | 11/2019 | Guo et al. |
| 11,145,046 B2 | 10/2021 | Lakshmanan et al. |
| 11,245,469 B2 | 2/2022 | Lakshmanan et al. |
| 2002/0037414 A1 | 3/2002 | Cunningham |
| 2004/0149988 A1 | 8/2004 | Shiozaki et al. |
| 2006/0266407 A1 | 11/2006 | Lichy et al. |
| 2007/0012353 A1 | 1/2007 | Fischer et al. |
| 2008/0000518 A1 | 1/2008 | Basol |
| 2008/0038529 A1 | 2/2008 | Nakayama et al. |
| 2008/0138013 A1 | 6/2008 | Parriaux |
| 2008/0245401 A1 | 10/2008 | Winston et al. |
| 2008/0289682 A1 | 11/2008 | Adriani et al. |
| 2009/0009847 A1 | 1/2009 | Sasagawa et al. |
| 2009/0040750 A1 | 2/2009 | Myer |
| 2009/0046362 A1 | 2/2009 | Guo et al. |
| 2009/0153029 A1 | 6/2009 | Khalfin |
| 2009/0272424 A1 | 11/2009 | Ortabasi |
| 2009/0272425 A1 | 11/2009 | Green |
| 2010/0212717 A1 | 8/2010 | Whitlock et al. |
| 2010/0236609 A1 | 9/2010 | Tweedie |
| 2011/0017256 A1 | 1/2011 | Stevens |
| 2011/0061717 A1 | 3/2011 | Kwon et al. |
| 2011/0290296 A1 | 12/2011 | Daniel et al. |
| 2011/0305010 A1 | 12/2011 | Leadford et al. |
| 2012/0080078 A1 | 4/2012 | Farrelly et al. |
| 2012/0168753 A1 | 7/2012 | Sanga |
| 2012/0240982 A1 | 9/2012 | Corneille |
| 2013/0038919 A1 | 2/2013 | Gibson et al. |
| 2013/0112239 A1 | 5/2013 | Liptac et al. |
| 2013/0174896 A1 | 7/2013 | Ardo et al. |
| 2013/0192656 A1 | 8/2013 | Hardin et al. |
| 2013/0192662 A1 | 8/2013 | Snidow |
| 2013/0200709 A1 | 8/2013 | Kirchner et al. |
| 2013/0346166 A1 | 12/2013 | Chihara |
| 2014/0130851 A1 | 5/2014 | Osamura et al. |
| 2015/0034147 A1 | 2/2015 | Le Perchec et al. |
| 2015/0063392 A1 | 3/2015 | Takayama |
| 2015/0101761 A1 | 4/2015 | Moslehi et al. |
| 2015/0144191 A1 | 5/2015 | Declerck et al. |
| 2015/0179982 A1 | 6/2015 | Yonehara et al. |
| 2015/0311475 A1 | 10/2015 | Lee et al. |
| 2015/0336669 A1 | 11/2015 | Kantor et al. |
| 2016/0049799 A1 | 2/2016 | Takatsu et al. |
| 2016/0254492 A1 | 9/2016 | Wu et al. |
| 2017/0174092 A1 | 6/2017 | Kohnke |
| 2019/0013497 A1 | 1/2019 | So et al. |
| 2019/0252565 A1 | 8/2019 | Lyons |
| 2019/0323733 A1 | 10/2019 | Lv |
| 2022/0060142 A1 | 2/2022 | Akhavan-Tafti |

FOREIGN PATENT DOCUMENTS

| | | |
|---|---|---|
| KR | 10-2010-0027379 A | 3/2010 |
| KR | 100973774 B1 | 8/2010 |
| KR | 20120013745 A | 2/2012 |
| KR | 20120098739 A | 9/2012 |
| KR | 20140018621 A | 2/2014 |
| KR | 20140028179 A | 3/2014 |
| KR | 20160015716 A | 2/2016 |
| KR | 20160026774 A | 3/2016 |
| KR | 20160043902 A | 4/2016 |
| KR | 20160133838 A | 11/2016 |
| KR | 20160142014 A | 12/2016 |
| KR | 20170010820 A | 2/2017 |
| KR | 20170024300 A | 3/2017 |
| KR | 20190118689 A | 10/2019 |
| WO | WO-2012/166048 A1 | 12/2012 |
| WO | 2014097901 A1 | 6/2014 |
| WO | 2014098014 A1 | 6/2014 |
| WO | 2014156714 A1 | 10/2014 |
| WO | 2014192902 A1 | 12/2014 |
| WO | 2015015993 A1 | 2/2015 |
| WO | 2015115175 A1 | 8/2015 |
| WO | WO-2015196296 A1 | 12/2015 |
| WO | WO-2017-097772 A1 | 6/2017 |

OTHER PUBLICATIONS

International Search Report and Written Opinion of the International Searching Authority regarding International Patent Application No. PCT/US2022/016614, dated May 31, 2022.

International Search Report and Written Opinion mailed Apr. 29, 2020 regarding PCT/US2019/026580.

International Search Report and Written Opinion of the International Searching Authority issued in PCT/US2018/049880, mailed Nov. 21, 2018; ISA/US.

"3M Ultra Barrier Solar Film 510-F." 3M™ Ultra Barrier Solar Film 510-F, 3M, Oct. 2016, https://multimedia.3m.com/mws/media/12854700/3m-ultra-barrier-solar-film-510-f.pdf. (Year: 2016).

Liu, Ji-Tao, et al. "Curing Determination of EVA for Solar Panel Application by DSC." Curing Determination of EVA for Solar Panel Application, PerkinElmer, Inc, 2010, https://www.s4science.at/wordpress/wp-content/uploads/2018/10/EVA-Curing-for-Solar-Panels_DSC8000_APP .pdf. (Year: 2010).

Tomoyoshi Motohiro et al,"Concept of the solar-pumped laser-photovoltaics combined system and its application to laser beam

(56) References Cited

OTHER PUBLICATIONS power feeding to electric vehicles", Japanese Journal of Applied Physics, 2017.
International Search Report and Written Opinion of the International Searching Authority issued in PCT/US2020/059262, mailed Feb. 26, 2021, ISA/US.
D.-R. Kim, S.-H. Yang, H.-S. Kim, Y.-H. Son, and S.-K. Han, "Outdoor Visible Light Communication for inter-vehicle communication using Controller Area Network," in 2012 Fourth International Conference on Communications and Electronics (ICCE), Hue, Vietnam, Aug. 2012, pp. 31-34. doi: 10.1109/CCE.2012.6315865.
Wang, Yiguang, Xingxing Huang, Jianyang Shi, Yuan-quan Wang, and Nan Chi. "Long-Range High-Speed Visible Light Communication System over 100-m Outdoor Transmission Utilizing Receiver Diversity Technology." Optical Engineering 55, No. 5 (May 2016): 056104.
Kim, Yong Hyeon, Willy Anugrah Cahyadi, and Yeon Ho Chung. "Experimental Demonstration of VLC-Based Vehicle-to-Vehicle Communications Under Fog Conditions." *IEEE Photonics Journal* 7, No. 6 (Dec. 2015): 1-9.
Rodríguez, Juan, Diego G. Lamar, Daniel G. Aller, Pablo F. Miaja, and Javier Sebastian. "Efficient Visible Light Communication Transmitters Based on Switching-Mode Dc-Dc Converters." *Sensors* 18, No. 4 (Apr. 2018): 1127.
Vega-Colado, César, Belén Arredondo, Juan Carlos Torres, Eduardo López-Fraguas, Ricardo Vergaz, Diego Martín-Martín, Gonzalo Del Pozo, et al. "An All-Organic Flexible Visible Light Communication System." *Sensors* 18, No. 9 (Sep. 2018): 3045.
Gordon Povey, "An IEEE Standard For Visible Light Communications", Visible Light Communications, Apr. 7, 2011.
"Shedding Light on LiFi", Pure LiFi, Aug. 2017.
"Deok Rae Kim et al., ""Outdoor Visible Light Communication For Inter-Vehicle Communication Using Control Area Network"", ICCE, 2012 (pp. 31-34)."
Harald Haas, "LiFi is a Paradigm-Shifting 5G Technology", Reviews in Physics, Oct. 27, 2017.
Mohamed Sufyan Islim et al., "The Impact of Solar Irradiance on Visible Light Communications", Journal of Lightwave Technology, vol. 36, No. 12, Jun. 15, 2018.
Saeed Ur Rehman et al., "Visible Light Communication: A System Perspective—Overview and Challenges", Sensors, Mar. 7, 2019.
Bugra Turan et al., "Vehicular Visible Light Communications", Intech, 2017.
Alin-Mihai Cailean et al.,"A Survey on the Usage of DSRC and VLC in Communication-Based Vehicle Safety Applications", IEEE, 2014.
Cen Liu, "Enabling Vehicular Visible Light Communication (V2LC) Networks", VANET' 11, Sep. 23, 2011.
Arnez Pramesti Ardi et al., "VLC-Based Car-to-Car Communication", Jurnal Elecktronika dan Telekomunikasi (JET), vol. 20, No. 1, Aug. 2020, pp. 16-22.

Trong-Hop Do et al., "Potentialities and Challenges of VLC Based Outdoor Positioning", IEEE, 2015.
Hossien B. Eldeeb et al., "Vehicle-to-Vehicle Light Communication: How to Select Receiver Locations for Optimal Performance", IEEE.
Mohammed Elamassie et at., "Effect of Fog and Rain on the Performance of Vehicular Visible Light Communications", IEEE, 2018.
Hossien B. Eldeeb et al., "MAC Layer Performance of Multi-Hop Vehicular VLC Networks with CSMA/CA", 12th International Symposium on Communication Systems, Networks and Digital Signal Processing, 2020.
Harald Haas et al.,"What is LiFi?", Journal of Lightwave Technology, IEEE, 2015.
Harald Haas et al., "Introduction to Indoor Networking Concepts and Challenges in LiFi", Journal of Optical Communications and Networking, vol. 12, No. 2, Feb. 2020.
Pable Palacios Jativa et al., "Performance Analysis of OFDM-Based VLC Schemes in NLOS Channels", IEEE, Downloaded May 16, 2021.
S. Sivaguru,"A High Speen Open Access Visible Light Communication System Based on Intensity Modulation", International Journal of Science Technology & Engineering, vol. 3, Issue 08, Feb. 2017.
Rahul R. Sharma et al., "Implementation of a Simple Li-Fi Based System", International Journal of Computing and Technology, vol. 1, Issue 9, Oct. 2014.
Tahmid H. Talukdar et al., "Small Scale Wireless Data Transmission via Light Using Light Source", Proceedings of the International Conference on Engineering Research, Innovation, and Education 2017.
Soumyajit Chatterjee, "Point-to-Point Digital Communication using VLC (Visible Light Communication) and LiFi Technology", IEEE.
European Search Report for European Application No. 21853181 issued Jul. 4, 2024; 6 pages.
First Office Action issued Jan. 2, 2025, for Korean Application No. 10-2023-7007360; 18 pages.
Nadia Formica et al., "Ultrastable and Atomically Smooth Ultrathin Silver Films Grown on a Copper Seed Layer", ACS Applied Materials & Interfaces, vol. 5, No. 8, 2013, pp. 3048-3053.
Cheng Zhang et al., "High-Performance Large-Scale Flexible Optoelectronics Using Ultrathin Silver Films with Tunable Properties", ACS Applied Materials & Interfaces, vol. 11, No. 30, 2019, pp. 27216-27225.
William M. Abbott et al., "Less is More: Improved Thermal Stability and Plasmonic Response in Au Films via the Use of SubNanometer Ti Adhesion Layers", ACS Applied Materials & Interfaces, vol. 11, pp. 7607-7614 (2019).
International Search Report and Written Opinion regarding International Application No. PCT/US2021/044306, dated Nov. 9, 2021; ISA/US.
First Office Action issued May 20, 2025, for Japanese Application No. 2023-507383; 49 pages.
Notice of Allowance issued Jun. 10, 2025, for Korean Application No. 10-2023-7007360; 4 pages.
First Office Action issued Jun. 16, 2025, for corresponding European Patent Application No. 21853181.2; 6 pages.

Analytical analysis to find mode cut-off conditions

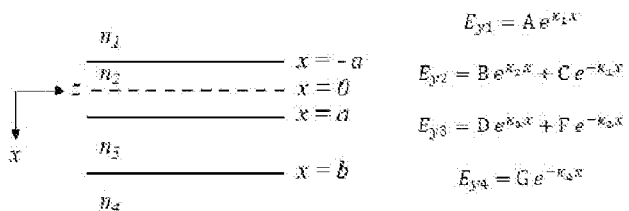

$E_{y1} = A e^{\kappa_1 x}$ $E_{y2} = B e^{\kappa_2 x} + C e^{-\kappa_2 x}$ $E_{y3} = D e^{\kappa_3 x} + F e^{-\kappa_3 x}$ $E_{y4} = G e^{-\kappa_4 x}$ $$e^{2(a-b)\kappa_3} = \underbrace{\phantom{\frac{((-1+K_{12})(-1+K_{23})+e^{4a\kappa_2}(1+K_{12})(1+K_{23}))(1+K_{43})}{(e^{4a\kappa_2}(1+K_{12})(-1+K_{23})+(-1+K_{12})(1+K_{23}))(-1+K_{43})}}}_{y_1} \underbrace{\frac{((-1+K_{12})(-1+K_{23})+e^{4a\kappa_2}(1+K_{12})(1+K_{23}))(1+K_{43})}{(e^{4a\kappa_2}(1+K_{12})(-1+K_{23})+(-1+K_{12})(1+K_{23}))(-1+K_{43})}}_{y_2}$$

Eigen solution is found when $y_1 = y_2$ $E_y = A e^{\kappa x} + B e^{-\kappa x}$
$\kappa_i^2$ (or $a_x^2$) $= k_z^2 - \omega^2 \mu_i \varepsilon_i$ $k_z$ can be obtained from this relation $K_{ij} = \dfrac{\kappa_j}{\kappa_i}$ for TE $K_{ij} = \dfrac{\varepsilon_i \kappa_j}{\varepsilon_j \kappa_i}$ for TM Structure for waveguide mode analysis

*Fig-12*

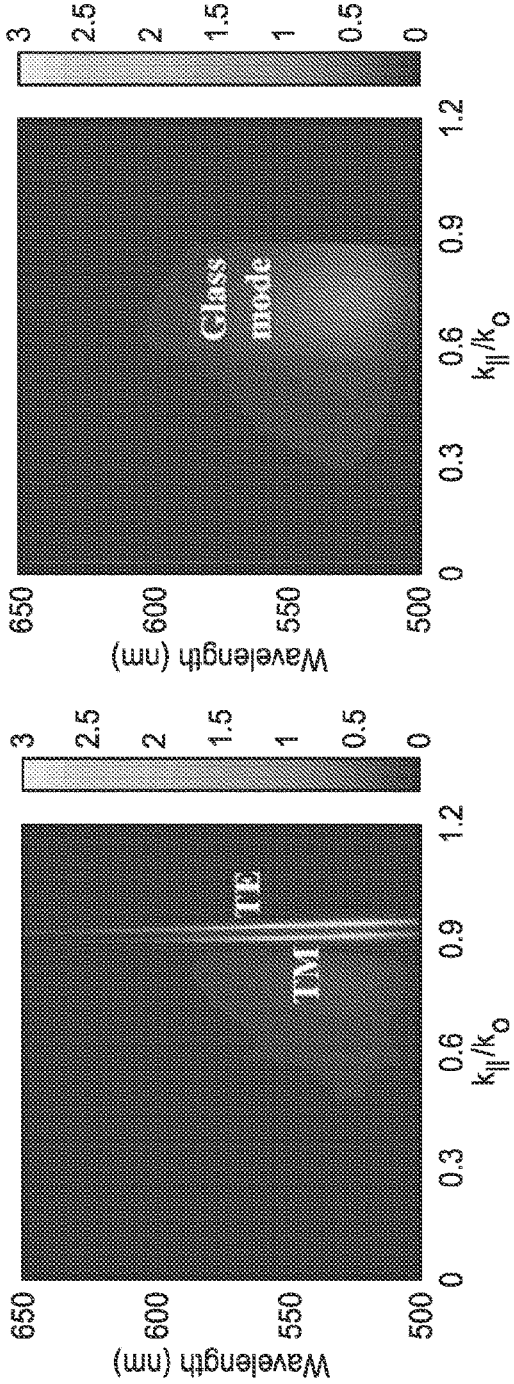
*Fig-32A*, *Fig-32B*, *Fig-32C*, *Fig-32D*

ELIMINATION OF WAVEGUIDE MODES IN ORGANIC LIGHT-EMITTING DIODES USING AN ULTRATHIN TRANSPARENT CONDUCTOR

CROSS-REFERENCE TO RELATED APPLICATIONS

This application is a U.S. National Phase Application under 35 U.S.C. 371 of International Application No. PCT/US2021/044306, filed on Aug. 3, 2021, which claims the benefit of U.S. Provisional Application No. 63/060,536, filed on Aug. 3, 2020. The entire disclosures of the above applications are incorporated herein by reference.

FIELD

The present disclosure relates to methods of increasing light emission efficiency in an organic light emitting diode (OLED) by eliminating or reducing at least one waveguide mode selected from the group consisting of: transverse electric ($TE_0$) mode, transverse magnetic ($TM_1$) mode, and combinations thereof to increase an external quantum efficiency of the OLED.

BACKGROUND

This section provides background information related to the present disclosure which is not necessarily prior art.

Transparent conductive electrodes (TCEs) are used in many optoelectronic devices, such as flat panel televisions, touch panels, smart phones, smart glass, solar cells, and organic light-emitting diodes (OLEDs). Organic light emitting diodes (OLEDs) have attracted a great deal of attention as light emitting cells for flexible and transparent displays, due to their excellent flexibility and aesthetics, low production cost, excellent compatibility with other optoelectronic devices, and the like. OLEDs have successfully achieved 100% internal quantum efficiency (IQE) with the use of iridium complexes, proving their great potential for future energy efficient displays. However, a major shortcoming of currently available OLEDS is low external quantum efficiency (EQE) due to poor outcoupling efficiency from the device, which occurs for several reasons.

Generally, there are three major factors that limit EQE of OLEDs. First, generated photons in the emissive material layer assembly (EML) are lost at the interface between contact metal and organic stacks by exciting a surface plasmon polariton (SPP) mode. Second, light resides in a substrate due to total internal reflection at air/substrate interface. Third, light is trapped in the form of waveguide mode, because organic stacks that form the EML and thick transparent conductors (TC) together serve as an optical waveguide. In fact, several waveguide modes are present in conventional OLED designs that employ thick transparent conductive electrodes, like indium tin oxide (ITO). ITO is the most widely used in commercial transparent electrodes. Thus, while many conventional OLEDs can achieve a high internal light generating efficiency in the emissive material layer assembly (EML), they suffer from an inability to transfer that generated light efficiently to outside of the OLED from the desired display surface(s).

There has been extensive research on means to suppress plasmonic modes and efficiently extract trapped light from the substrate. Extracting or minimizing guided modes in OLEDs remains the biggest challenge, because formation of the optical modes is inevitable when light is generated in a sufficiently thick structure. Thus, there is a tradeoff between having thicker EML structures to generate a desired amount of photons and light intensity from the OLED, but increasing the thickness also increases undesirable waveguide modes and light trapping due to the thicker materials. The same is true for the conventional thick transparent conductive oxides (TCO) that serve as an anode to ensure low film resistivity, but such a thickness further increases modal confinement.

There have been efforts to extract waveguide modes using grating, grids, and corrugation structures in the OLED. However, these methods can easy protrude into organic layers or result in non-planar surfaces, negatively affecting surface smoothness or electrical properties of OLEDs. Further, these approaches also require several additional fabrication steps that are not compatible with conventional OLEDs fabrication processes, increasing the cost. Therefore, it would be desirable to find new methods of effectively improving outcoupling efficiency of light for OLEDs. More specifically, it would be desirable to an efficient waveguide mode decoupler that is simple, scalable, and yet readily compatible with the conventional fabrication processes for commercial display products.

SUMMARY

This section provides a general summary of the disclosure, and is not a comprehensive disclosure of its full scope or all of its features.

In certain aspects the present disclosure relates to a method of increasing light emission efficiency in an organic light emitting diode. The method may comprise eliminating or reducing at least one waveguide mode selected from the group consisting of: transverse electric ($TE_0$) mode, transverse magnetic ($TM_1$) mode, and combinations thereof by disposing an ultrathin electrically conductive transparent electrode having a first polarity within an organic light emitting diode. The organic light emitting diode comprises a transparent substrate on which the ultrathin electrically conductive transparent electrode is disposed. An emissive active assembly for generating photons that defines a first side and a second opposite side, wherein the ultrathin electrically conductive transparent electrode is disposed along the first side. A second electrode having a second polarity opposite to the first polarity disposed adjacent to the second side of emissive active assembly. The method thus further comprises increasing an external quantum efficiency of the organic light emitting diode to greater than or equal to about 30%.

In one aspect, the organic light emitting diode is free of indium tin oxide.

In one aspect, the second electrode is a transparent electrode comprising a conductive oxide film or a conductive metallic film.

In one aspect, the ultrathin electrically conductive transparent electrode is metallic and comprises silver (Ag).

In one further aspect, the ultrathin electrically conductive transparent electrode further comprises copper, aluminum (Al), titanium (Ti), nickel (Ni), chromium (Cr), gold (Au), magnesium (Mg), tantalum (Ta), germanium (Ge), Palladium (Pd), or combinations thereof In one aspect, the ultrathin electrically conductive transparent electrode is metallic and comprises a first layer and a second layer. The first layer comprises a first material selected from a group consisting of: copper (Cu), titanium (Ti), nickel (Ni), chromium (Cr), gold (Au), magnesium (Mg), tantalum (Ta), germanium (Ge), Palladium (Pd), and combinations thereof. The second layer comprises a second material selected from a group consisting of: silver (Ag), copper (Cu), gold (Au), platinum (Pt), and combinations thereof.

In one aspect, the ultrathin electrically conductive transparent electrode has a thickness of less than or equal to about 12 nm.

In one aspect, the ultrathin electrically conductive transparent electrode has a thickness of greater than or equal to about 2 nm to less than or equal to about 10 nm.

In one aspect, a thickness of the emissive active assembly is greater than or equal to 20 nm.

In one aspect, the EQE is greater than or equal to about 40%.

In one aspect, the ultrathin electrically conductive transparent electrode is metallic and has a transparency of greater than or equal to about 60% for a portion of an electromagnetic spectrum having a range of predetermined wavelengths.

In one further aspect, the portion of the electromagnetic spectrum having the range of predetermined wavelengths emitted from the organic light emitting diode displays minimal angle dependence, for example, the first range of predetermined wavelengths varies less than or equal to about 20 nm at an viewing angle ranging from about 0° to about 60° with respect to the organic light emitting diode.

In one aspect, the emissive active assembly comprises:
an emissive active layer;
a first charge transport layer disposed between the emissive active layer and the ultrathin electrically conductive transparent electrode; and
a second charge transport layer disposed between the emissive active layer and the second electrode.

In one aspect, a combined thickness of the emissive layer, the first charge transport layer, and the second charge transport layer is greater than or equal to 100 nm.

In certain other aspects the present disclosure relates to a method of increasing light emission efficiency in an organic light emitting diode. The method may comprise eliminating a transverse electric ($TE_0$) mode and a transverse magnetic ($TM_1$) mode in the organic light emitting diode by disposing an ultrathin electrically conductive transparent metallic electrode having a first polarity within the organic light emitting diode. The organic light emitting diode comprises a transparent substrate on which the ultrathin electrically conductive transparent metallic electrode is disposed. The organic light emitting diode also comprises an emissive active assembly for generating photons that defines a first side and a second opposite side, wherein the ultrathin electrically conductive transparent metallic electrode is disposed along the first side. A second electrode has a second polarity opposite to the first polarity disposed adjacent to the second side of emissive active assembly, wherein the organic light emitting diode is free of indium tin oxide (ITO). The method further includes increasing an external quantum efficiency of the organic light emitting diode to greater than or equal to about 30%.

In one aspect, the ultrathin electrically conductive transparent metallic electrode comprises silver (Ag).

In one aspect, the ultrathin electrically conductive transparent metallic electrode further comprises a material selected from the group consisting of: copper (Cu), aluminum (Al), titanium (Ti), nickel (Ni), chromium (Cr), gold (Au), magnesium (Mg), tantalum (Ta), germanium (Ge), palladium (Pd), and combinations thereof.

In one aspect, the ultrathin electrically conductive transparent metallic electrode comprises a first layer and a second layer. The first layer comprises a first material selected from a group consisting of: copper (Cu), titanium (Ti), nickel (Ni), chromium (Cr), gold (Au), magnesium (Mg), tantalum (Ta), germanium (Ge), palladium (Pd), and combinations thereof. The second layer comprises a second material selected from a group consisting of: silver (Ag), copper (Cu), gold (Au), platinum (Pt), and combinations thereof.

In one aspect, the ultrathin electrically conductive transparent metallic electrode has a thickness of less than or equal to about 12 nm.

In one aspect, the ultrathin electrically conductive transparent metallic electrode has a thickness of greater than or equal to about 2 nm to less than or equal to about 10 nm.

In one aspect, the EQE is greater than or equal to about 40%.

In one aspect, the emissive active assembly comprises:
an emissive active layer;
a first charge transport layer disposed between the emissive active layer and the ultrathin electrically conductive transparent metallic electrode; and
a second charge transport layer disposed between the emissive active layer and the second electrode.

In one aspect, a combined thickness of the emissive active layer, the first charge transport layer, and the second charge transport layer is greater than or equal to 100 nm.

In yet other aspects, the present disclosure relates to an organic light emitting diode device comprising:
a transparent substrate;
an ultrathin electrically conductive transparent metallic electrode having a first layer comprising copper and a second layer comprising silver disposed over the first layer;
an emissive active layer defining a first side and a second opposite side;
a first charge transport layer disposed on the first side between the emissive active layer and the ultrathin electrically conductive transparent metallic electrode;
a second charge transport layer disposed on the second side of the;
a second electrode having a second polarity opposite to the first polarity disposed adjacent to the second charge transport layer, wherein the organic light emitting diode device is free of a transverse electric ($TE_0$) waveguide mode and has an external quantum efficiency of the organic light emitting diode device to greater than or equal to about 30%.

In one aspect, the second electrode is a transparent electrode comprising a conductive oxide film or a conductive metallic film.

In one aspect, the second electrode is transparent and comprises a second ultrathin electrically conductive transparent metallic electrode to form a dual-side emitting organic light emitting diode.

In one aspect, the ultrathin electrically conductive transparent electrode has a transparency of greater than or equal to about 60% for a portion of an electromagnetic spectrum having a range of predetermined wavelengths.

In one aspect, the ultrathin electrically conductive transparent metallic electrode is adjacent to at least one dielectric layer and forms part of an assembly having an electrode design selected from the group consisting of: dielectric-metal, metal-dielectric, and dielectric-metal-dielectric.

In one aspect, the organic light emitting diode device is also free of a transverse magnetic ($TM_1$) mode waveguide mode.

In one aspect, the organic light emitting diode device is free of indium tin oxide (ITO).

In one aspect, the ultrathin electrically conductive transparent metallic electrode comprises silver (Ag).

In one aspect, the second layer of the ultrathin electrically conductive transparent metallic electrode further comprises a metal selected from the group consisting of: copper (Cu), titanium (Ti), nickel (Ni), chromium (Cr), gold (Au), magnesium (Mg), tantalum (Ta), germanium (Ge), palladium (Pd), and combinations thereof.

In one aspect, the first layer of the ultrathin electrically conductive transparent metallic electrode consists essentially of copper (Cu) and the second layer consists essentially of silver (Ag).

In one aspect, the ultrathin electrically conductive transparent metallic electrode has a thickness of less than or equal to about 12 nm.

In one aspect, the ultrathin electrically conductive transparent metallic electrode has a thickness of greater than or equal to about 2 nm to less than or equal to about 10 nm.

In one aspect, the EQE is greater than or equal to about 40%.

In one aspect, the ultrathin electrically conductive transparent metallic electrode has a transparency of greater than or equal to about 60% for a portion of an electromagnetic spectrum having a range of predetermined wavelengths and the portion of the electromagnetic spectrum having the range of predetermined wavelengths emitted from the organic light emitting diode displays minimal angle dependence, for example, the first range of predetermined wavelengths varies less than or equal to about 80 nm at an incidence angle ranging from about 0° to about 60° with respect to the organic light emitting diode.

In one aspect, a combined thickness of the emissive layer, the first charge transport layer, and the second charge transport layer is greater than or equal to 100 nm.

In one aspect, the transparent substrate comprises at least one light scattering element selected from the group consisting of: an index matched fluid, a microlens, a scatterer-embedded fluid, and combinations thereof.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 is a schematic of an example of an organic light emitting diode (OLED) device prepared in accordance with certain aspects of the present disclosure.

FIGS. 2A-2E show film characterization (optical and electrical) for silver-based thin films and silver-copper bilayer thin films. FIG. 2A shows a sheet resistance versus seed layer thickness. FIG. 2B shows a sheet resistance versus film thickness. FIG. 2C shows an average absolute transmittance ($T_{AVE}$) versus film thickness. FIG. 2D shows Haake's figure of merit ($\phi_{TC}=(T_{550})^{10}/R_{sh}$) for measured and calculated OTC of FTCs (Cu—Ag, bare Ag, and ITO films) as a function of film thickness. FIG. 2E shows transmittance and reflectance spectra versus wavelength of ultrathin Cu—Ag films on a glass substrate (black dashed) and embedded in an OLED structure as an anode (red dashed-dot). Experimental, simulated, and simulated in the OLED device values are provided.

FIGS. 3A-3E show theoretical/simulation analysis of waveguide modes. FIGS. 3A-3B show two organic light emitting diode (OLED) waveguide modes, $TE_0$ and $TM_1$ modes respectively, and their effective indices ($n_{eff,TE0}$ and $n_{eff,TM1}$) as functions of organic active layer thickness ($t_{organic}$) at the wavelength of 530 nm. FIGS. 3C-3D show spectral power dissipations of a comparative OLED device having an ITO and an OLED having a Cu—Ag film prepared in accordance with certain aspects of the present disclosure. FIG. 3E shows fraction (%) of the power transferred to each mode, calculated by integrating the spectral power dissipation over entire wavelength range for each mode. The modes include fraction of air, glass substrate (Subs), waveguide (W/G), and surface plasmon polariton (SPP), respectively.

FIGS. 4A-4C show experimental verification of waveguide (WG) mode removal. FIG. 4A shows a schematic of a top-down and cross-section view of an experimental setup to test the waveguide modes. FIG. 4B shows measured intensities of the guided light in the waveguides on a comparative OLED device having an ITO and an OLED having a Cu—Ag film prepared in accordance with certain aspects of the present disclosure as a function of excitation intensity. FIG. 4C shows observed light from the cross-section view of the striped sample in the ITO and Cu—Ag samples without and with index matched fluid (IMF).

FIGS. 5A-5C show OLED device performance FIG. 5A shows external quantum efficiency (EQE) versus current density for a comparative OLED device having an ITO and an OLED having a Cu—Ag film prepared in accordance with certain aspects of the present disclosure. FIG. 5B shows current density-voltage characteristic of the ITO and Cu—Ag devices. FIG. 5C shows angle dependent electroluminescence spectra of ITO and Cu—Ag devices.

FIGS. 6A-6F show seed layer selection criteria for various conductive metal films. Aluminum (Al), germanium (GE), and copper (Cu) seed materials were tested. An 8 nm thick Ag layer was deposited on 0.5 nm seed layer. FIG. 6A shows an average surface roughness ($R_A$) by three-dimensional (3D) tapping-mode AFM images of an Al-seeded Ag film with a thickness of 9.3 nm, FIG. 6B of a Ge-seeded Ag film at a thickness of 9.9 nm, and FIG. 6C of a Cu-seeded Ag film with a thickness of 9.0 nm. The scan size is 500 nm×500 nm. FIG. 6D shows absolute transmittance versus wavelengths for the three films (Al—Ag, Ge—Ag, and Cu—Ag). FIG. 6E shows permittivity ($\varepsilon_2$) versus wavelength for the three films. FIG. 6F shows resistivity for each of the three films.

FIGS. 7A-7F assess seed layer stability. The film has bilayers formed with a seed layer followed by a second layer which is an 8 nm of Ag film. The first layer which is a seed layer has a thickness of 0.5 nm and comprises Al, Ge, or Cu layer. FIGS. 7A-7C show relative transmittance versus wavelength at various times, including in FIGS. 7A and 7C, as deposited, at 1 day, 7 days, 12.5 days, 39.5 days, 64.5 days, 85.5 days, 113.5 days, while FIG. 7B shows testing as deposited, at 1.5 days, 8 days, 28.5 days, 53.5 days, 74.5 days, and 102.5 days. FIG. 7D shows a sheet resistance versus exposure time in air for an aluminum-doped silver film, FIG. 7E shows a sheet resistance versus exposure time in air for a germanium-doped silver film, and FIG. 7F shows a sheet resistance versus exposure time in air for a copper-doped silver film.

FIGS. 8A-8C show characteristics of 5 nm thick Ag film deposited on 0.5 nm of Cu seed layer. FIG. 8A shows a rough mean squared (RMS) surface roughness versus seed layer thickness for a Cu—Ag film. A 5 nm Ag film was deposited on a Cu seed layer, where the seed layer thickness was varied to find the optimum thickness. FIG. 8B shows a reflectance (RAVE) versus film thickness for a silver film (simulated and experimental) and a copper-silver bilayer (simulated and experimental), while FIG. 8C shows absorbance ($A_{AVE}$) versus film thickness for a silver film (simulated and experimental) and a copper-silver bilayer (simulated and experimental).

FIGS. 9A-9B show a theoretical model for indium tin oxide (ITO) as a transparent conductive electrode. FIG. 9A shows a sheet resistance versus thickness for ITO (theoretical and experimental). FIG. 9B shows transmittance and reflectance spectra versus wavelength for a 150 nm ITO film.

FIGS. 10A-10B show theoretical figure of merit (FOM) calculations. FIG. 10A shows a calculated sheet resistance versus Ag film thickness and a calculated transmittance versus Ag film thickness for an ideal silver film. The thickness of Ag film can range from 0 to 40 nm.

FIG. 10B shows a calculated sheet resistance versus ITO film thickness and a transmittance versus ITO film thickness for an indium tin oxide (ITO) layer.

FIGS. 11A-11B show power distribution calculations for OLEDs with a comparative ITO anode and a Cu—Ag bilayer anode prepared in accordance with certain aspects of the present disclosure. FIG. 11A shows fraction (%) of the power transferred to each mode for different wavelengths, calculated by integrating the spectral power dissipation over entire wavelength range for each mode. The modes include fraction of glass substrate (Subs), air, surface plasmon polariton (SPP), and waveguide (W/G), and respectively.

FIG. 12 shows calculations for waveguide mode analysis.

FIG. 13A shows real part of $y_1$ and $y_2$ shown in FIG. 12 versus calculated effective index ($n_{eff}$) of $TE_0$ mode, while FIG. 13B shows imaginary part of $y_1$ and $y_2$ shown in FIG. 12 versus calculated effective index ($n_{eff}$) of $TE_0$ mode.

Figure 14A:
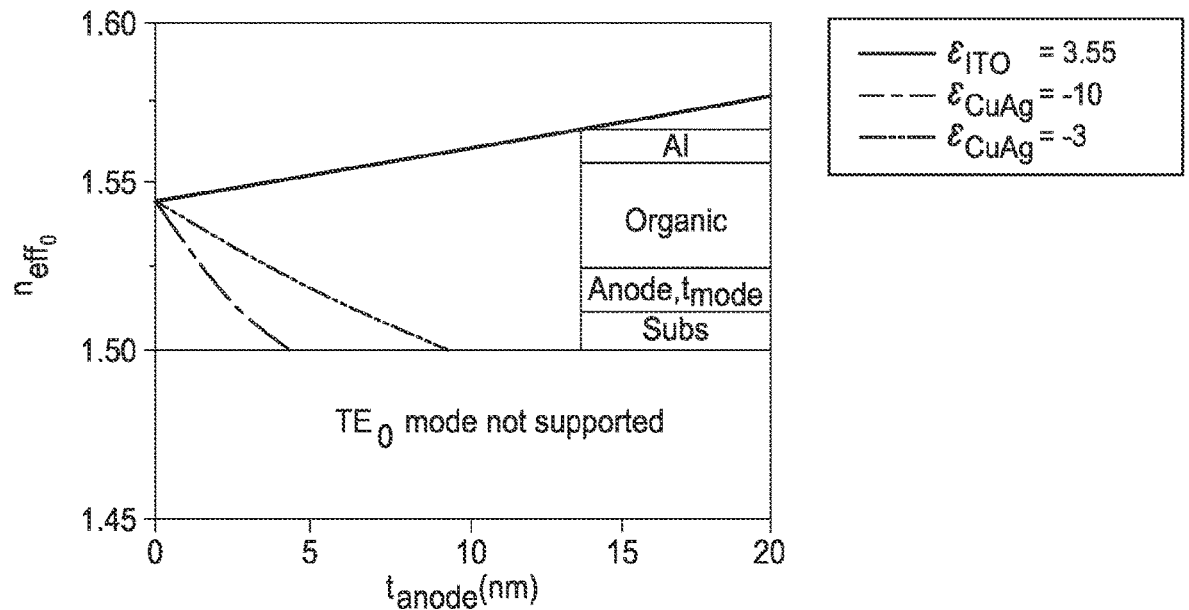
Figure 14B:
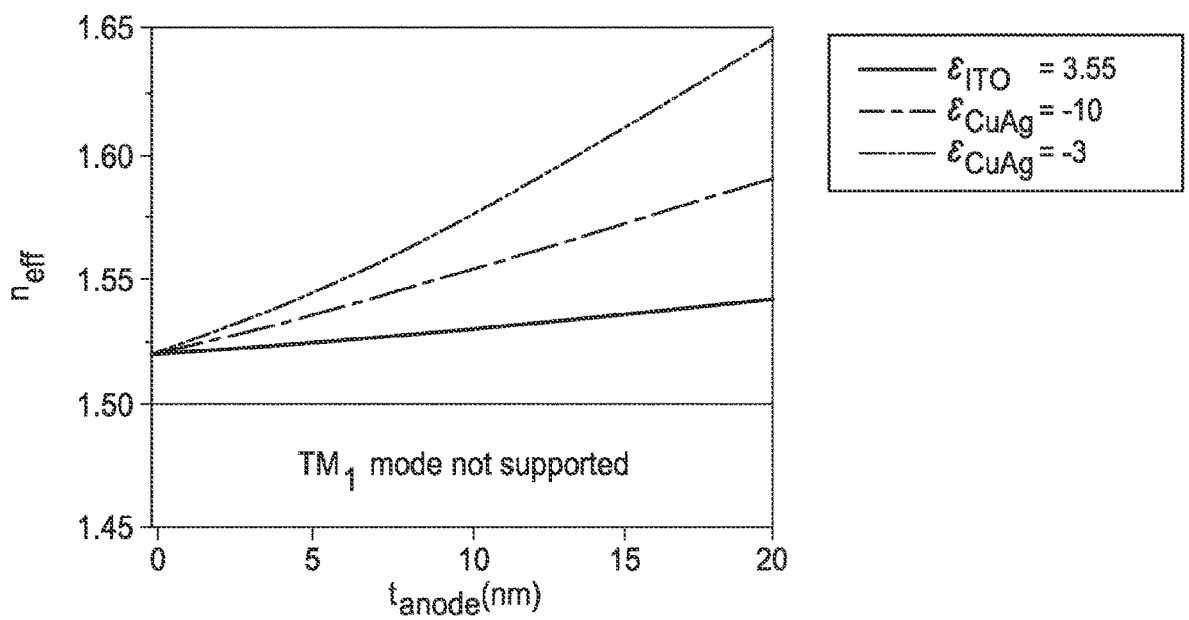

FIGS. 14A-14B. FIG. 14A shows physical analysis of transverse electric $TE_0$ mode and removal for $TE_0$ mode, where a thickness of an organic layer was fixed to 200 nm. FIG. 14B shows physical analysis of transverse magnetic $TM_1$ mode and removal for $TM_1$ mode, where organic layer thickness was fixed to 300 nm.

Figure 15A:
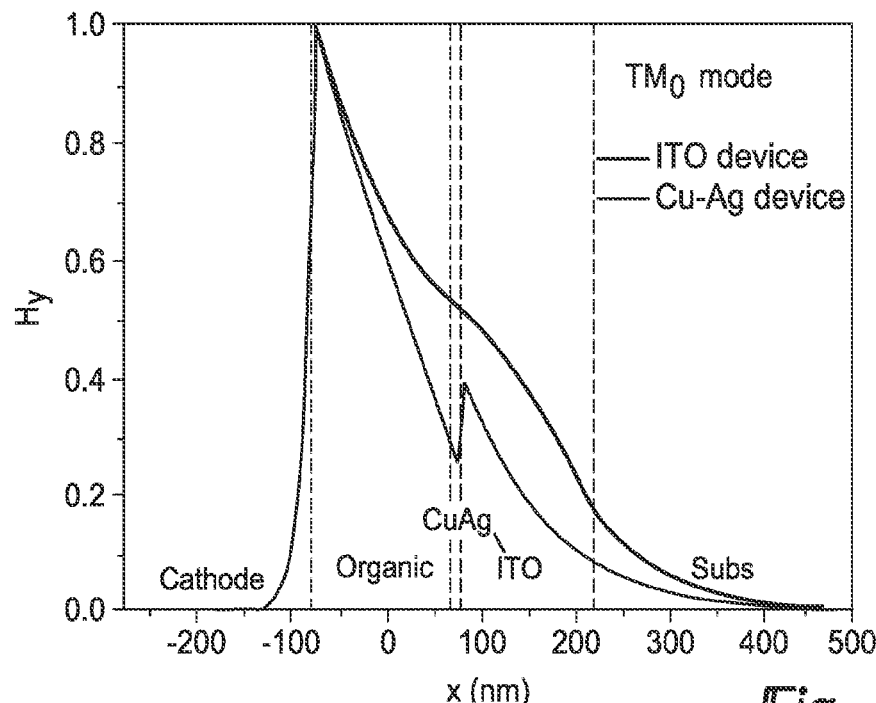
Figure 15B:
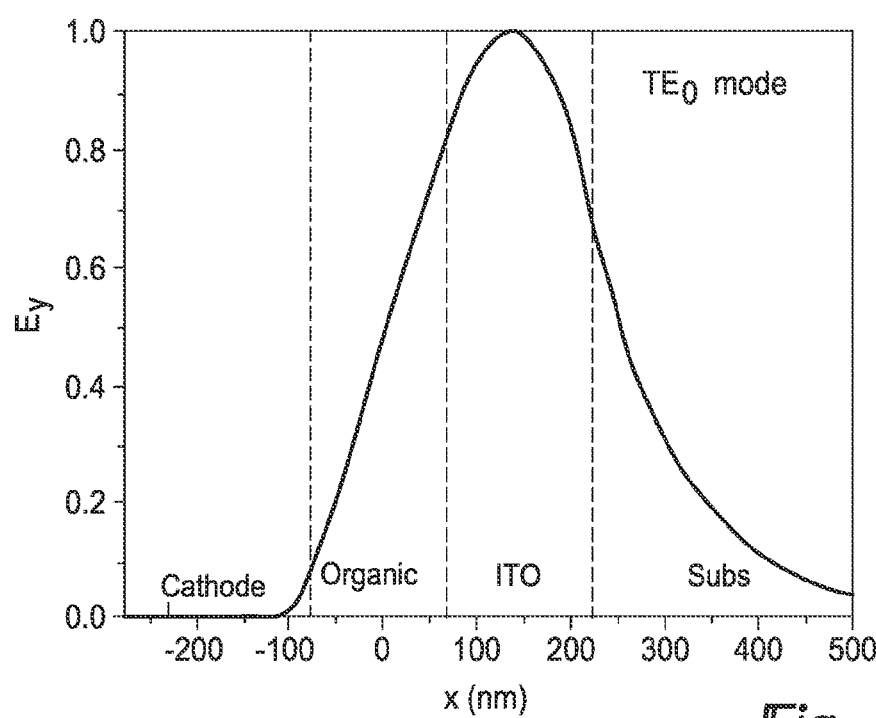

FIGS. 15A-15D show one-dimensional (1D) mode profile. Each device has either a Cu—Ag bilayer or an ITO as an anode. FIG. 15A shows $TM_0$ mode of ITO and Cu—Ag OLEDs. $TM_0$ mode is surface plasmon polariton (SPP) mode. FIG. 15B shows $TE_0$ mode of ITO device.

Figure 15C:
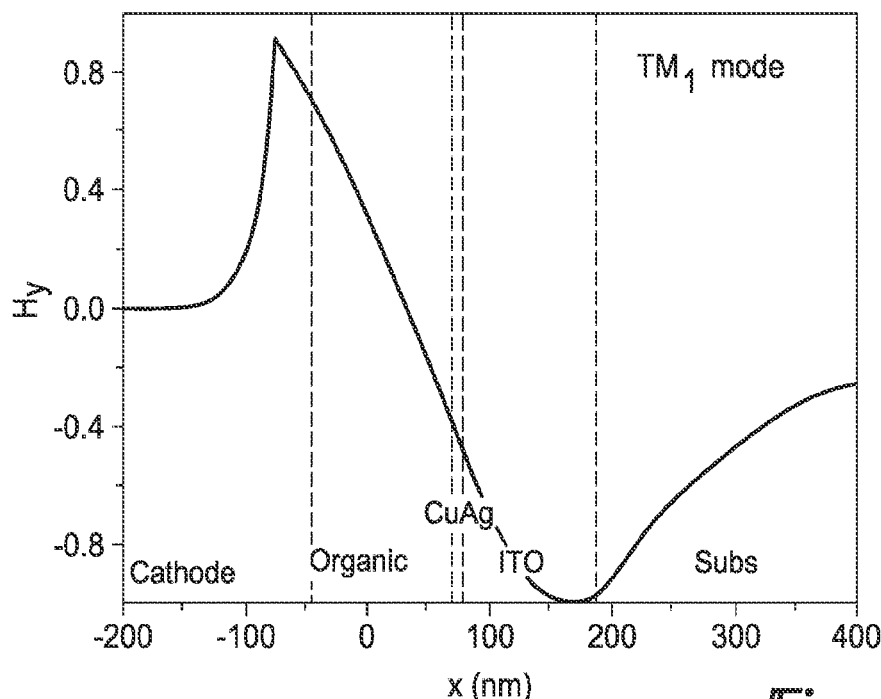
Figure 15D:
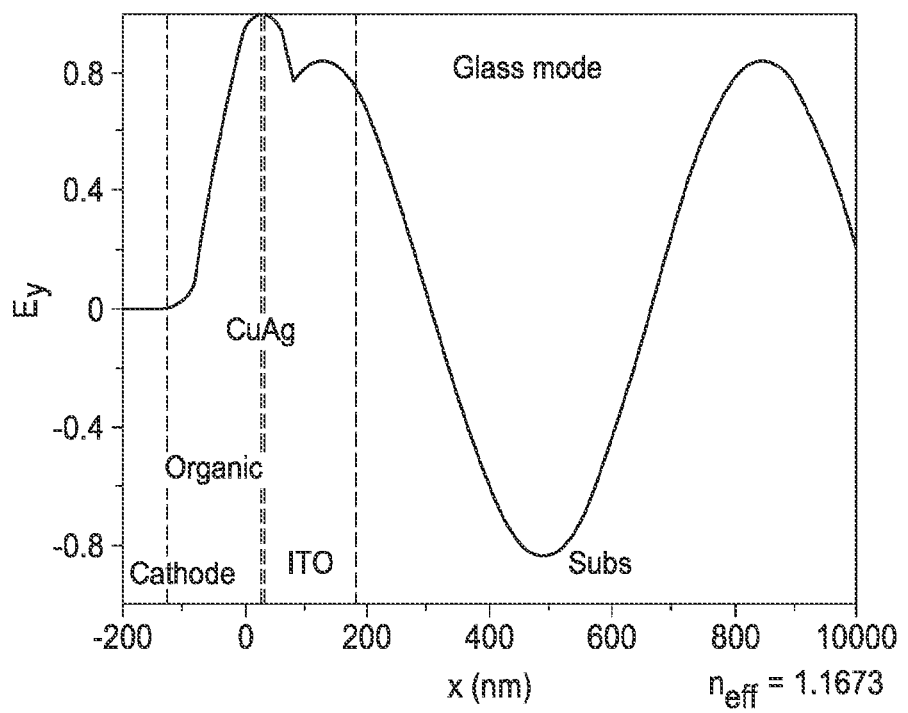

FIG. 15C shows $TM_1$ mode of ITO device. FIG. 15D shows substrate (glass) mode in the Cu—Ag device, which was calculated by mathematical solution and shows field oscillation in the substrate. The glass mode looks the same for ITO device, which is not shown here. ITO device has all SPP, $TE_0$, $TM_1$, and substrate modes, whereas $TE_0$ and $TM_1$ modes do not exist in the Cu—Ag device. Effective index (net) is 1.1673.

Figure 16A:
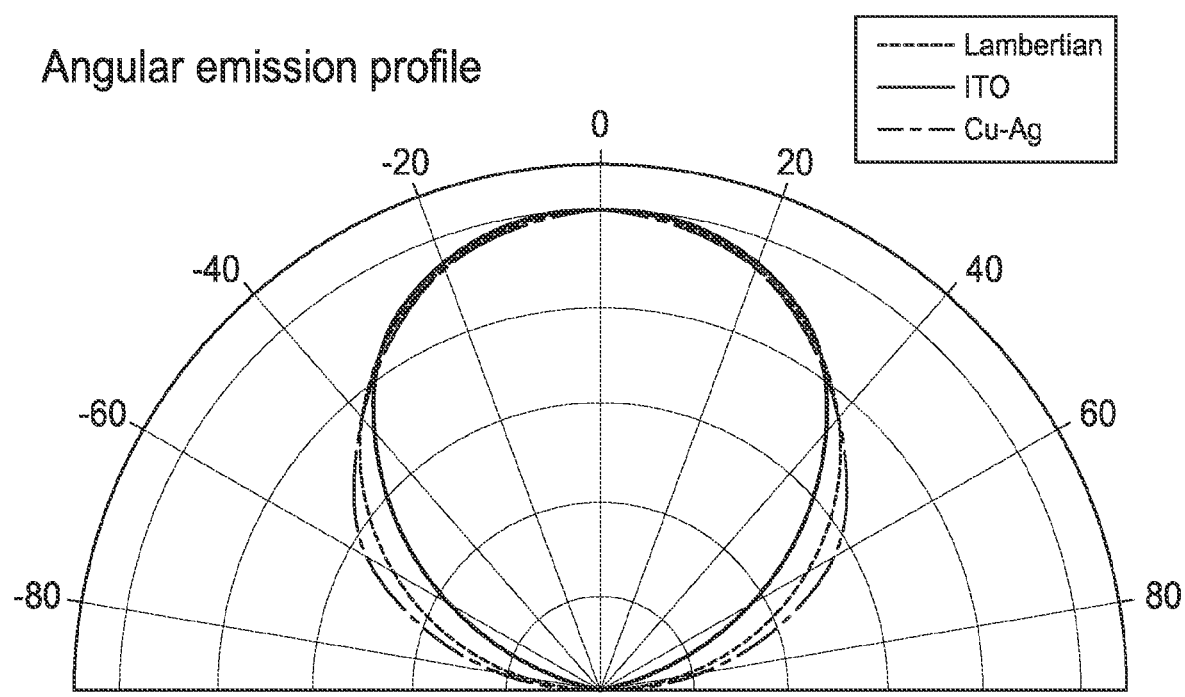
Figure 16B:
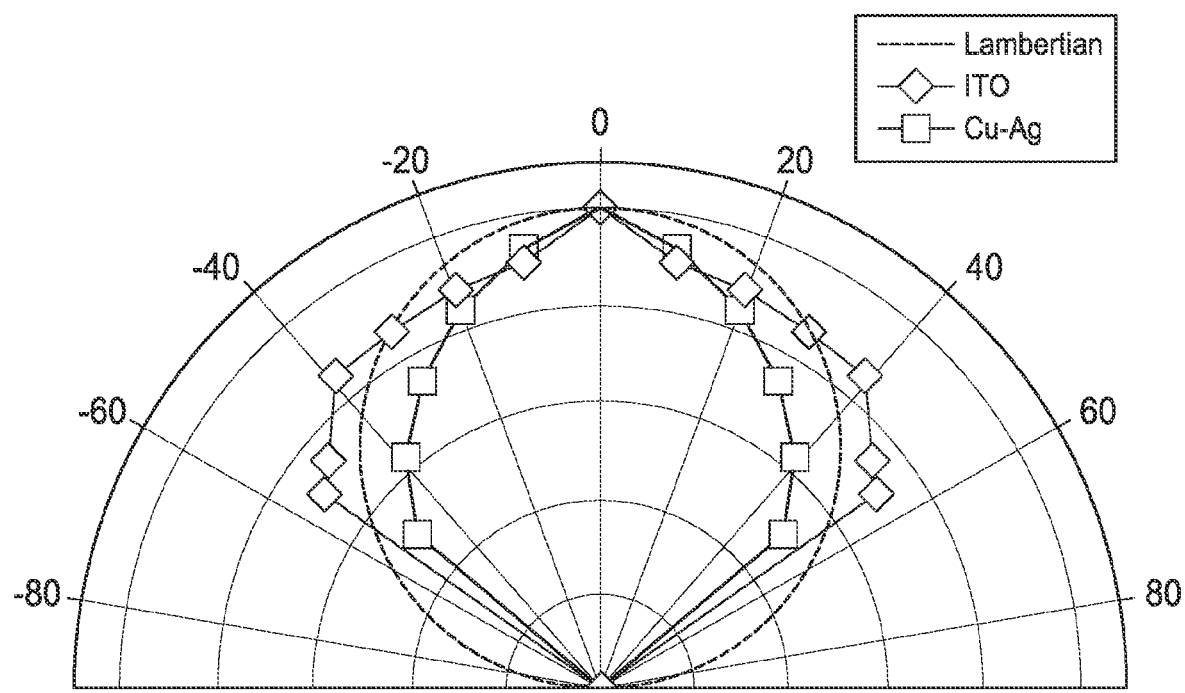

FIGS. 16A-16B show calculated and measured emission profiles of ITO and Cu—Ag OLEDs, respectively.

Figure 17A:
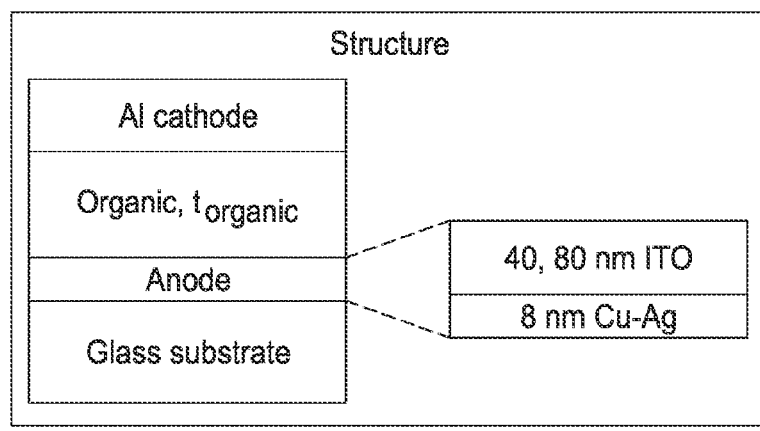
Figure 17B:
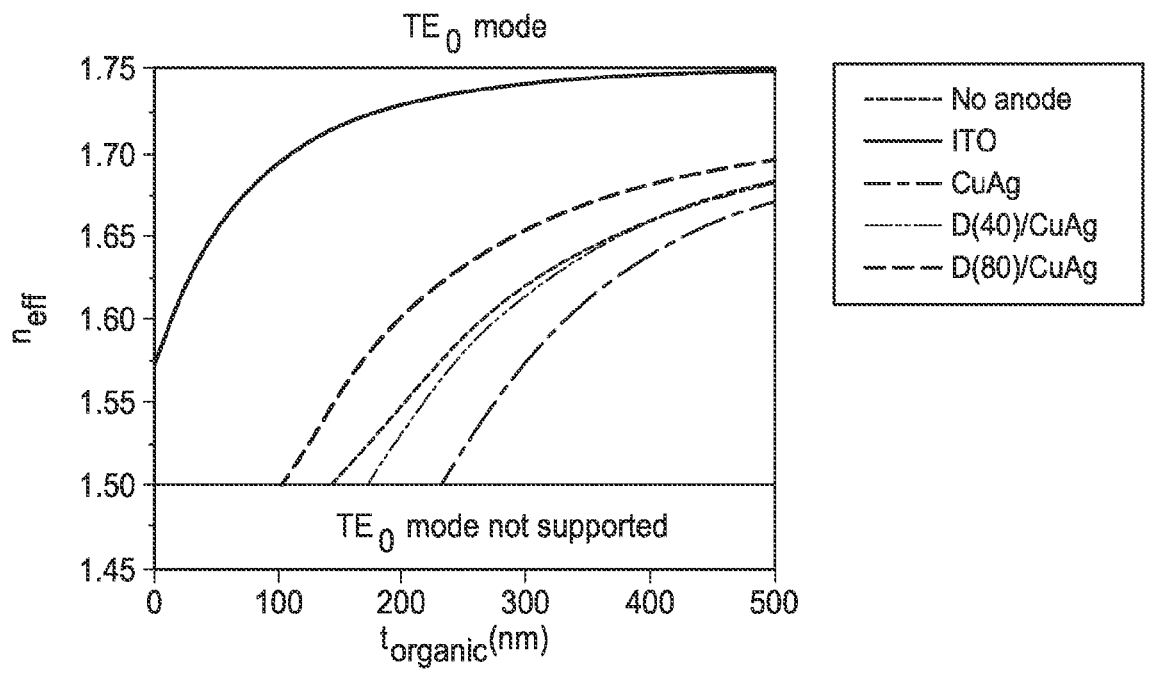
Figure 17C:
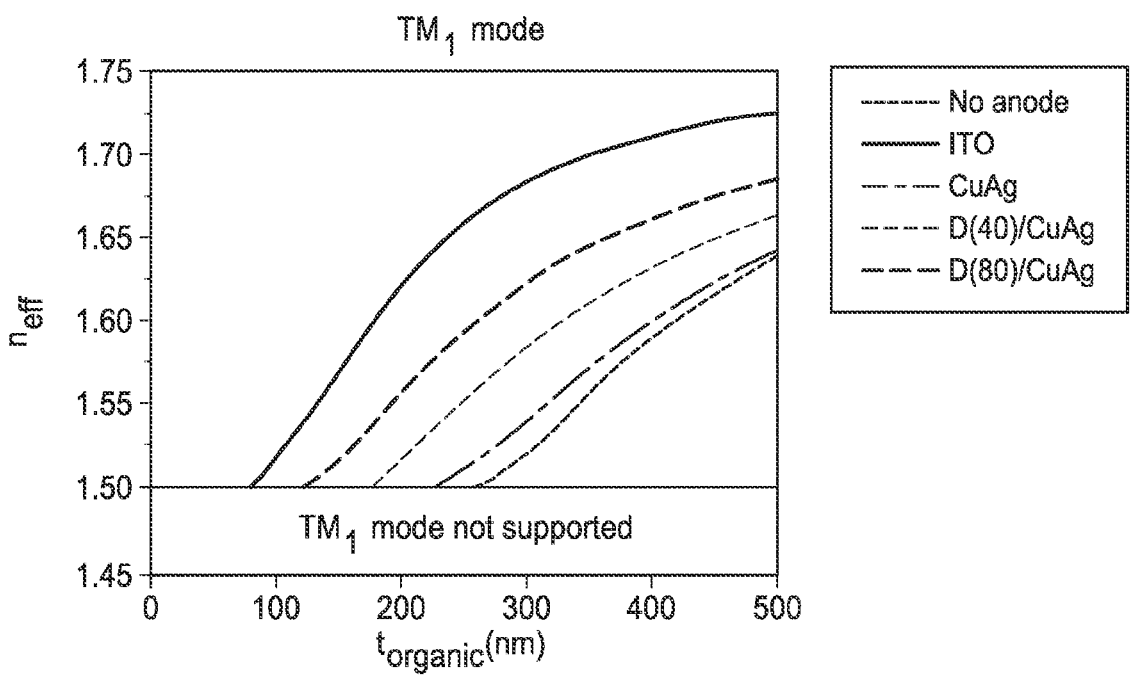

FIGS. 17A-17C reflect an analysis of waveguide modes in OLEDs with a dielectric-metal (DM) anode. FIG. 17A shows a structure that is used for the calculations. 40 nm and 80 nm thicknesses of ITO were used for dielectric, and 8 nm thick Cu—Ag film was used for metal conductor. Semi-infinite Al cathode and glass substrate were used. Calculated effective index ($n_{eff}$) of FIG. 17B $TE_0$ and FIG. 17C $TM_1$ modes as functions of organic layer thickness, $t_{organic}$. The operating wavelength is 530 nm.

Figure 18A:
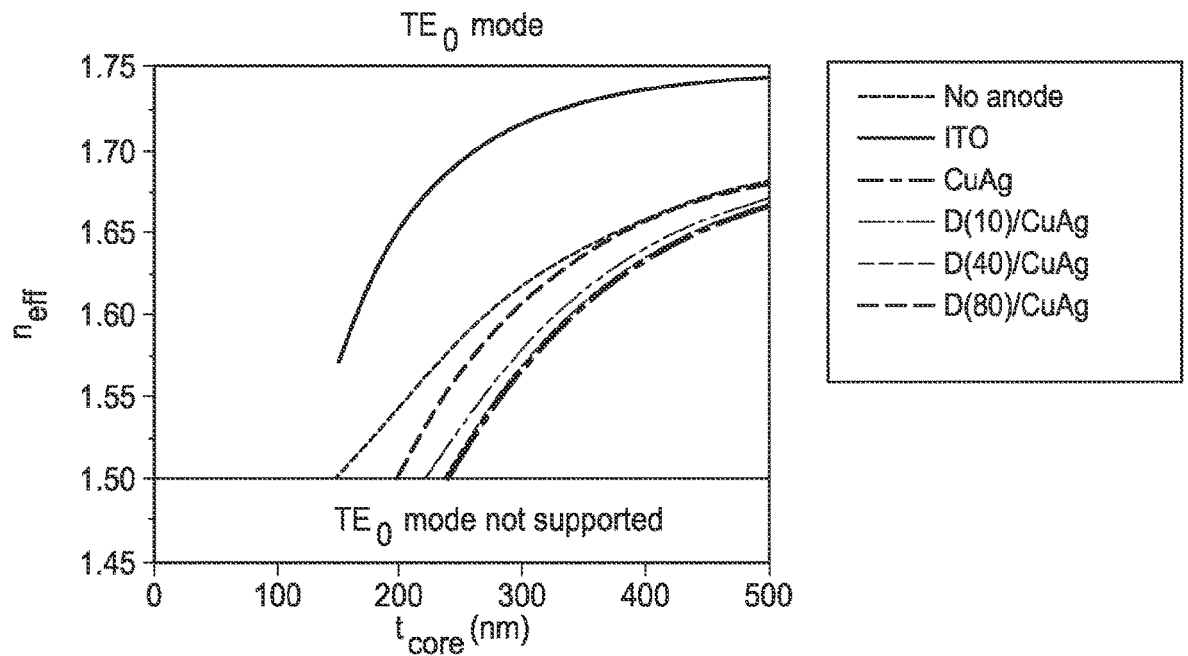
Figure 18B:
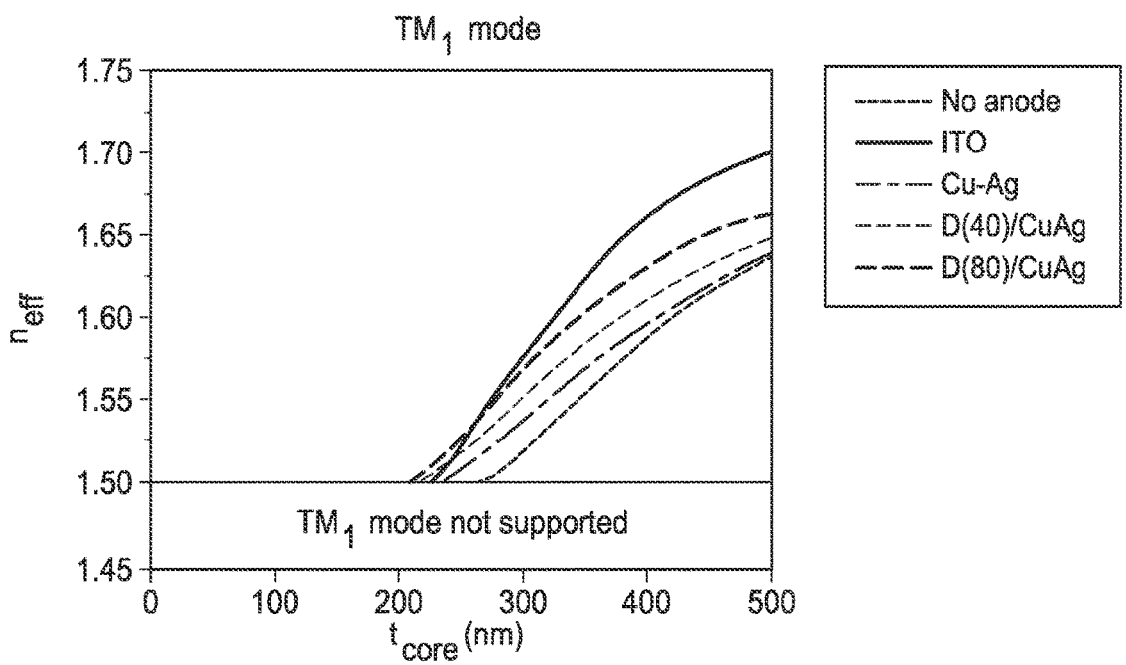

FIGS. 18A-18B are an analysis of waveguide modes in OLEDs with dielectric-metal (DM) anode. Calculated effective index ($n_{eff}$) of FIG. 18A for $TE_0$ mode and FIG. 18B for $TM_1$ mode as functions of waveguide core thickness, $t_{core}=t_{organic}+t_{anode}$. Operating wavelength is 530 nm. The plot was obtained by varying organic layer thickness. Comparative ITO and Cu—Ag prepared in accordance with certain aspects of the present disclosure were fixed to thicknesses 150 nm and 8 nm, respectively.

Figure 19A:
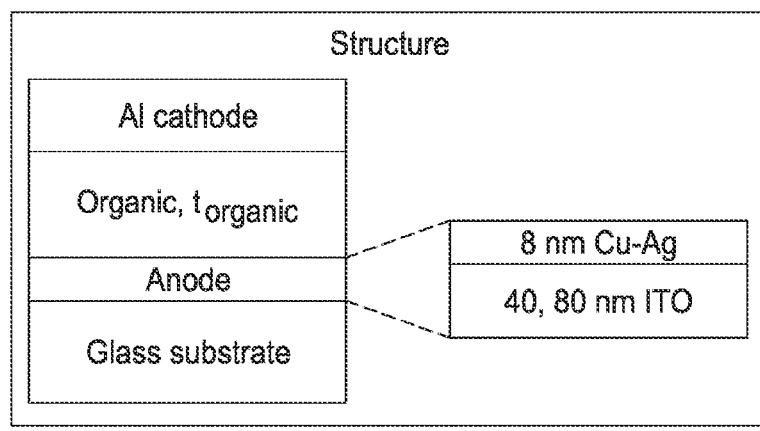
Figure 19B:
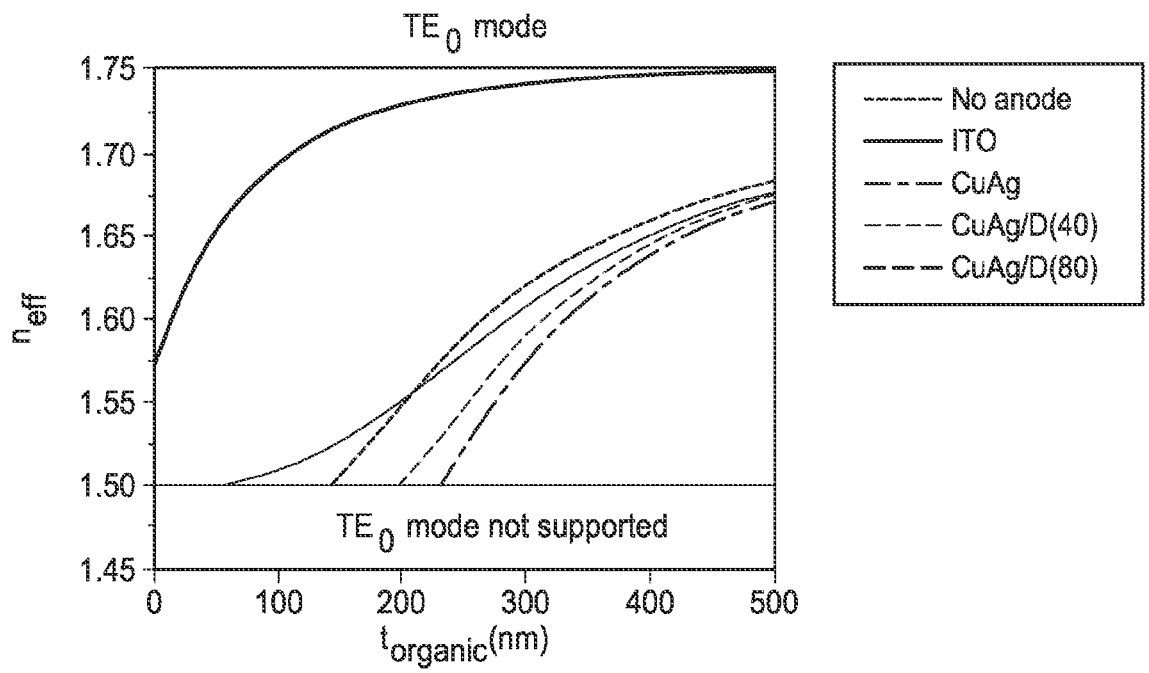
Figure 19C:
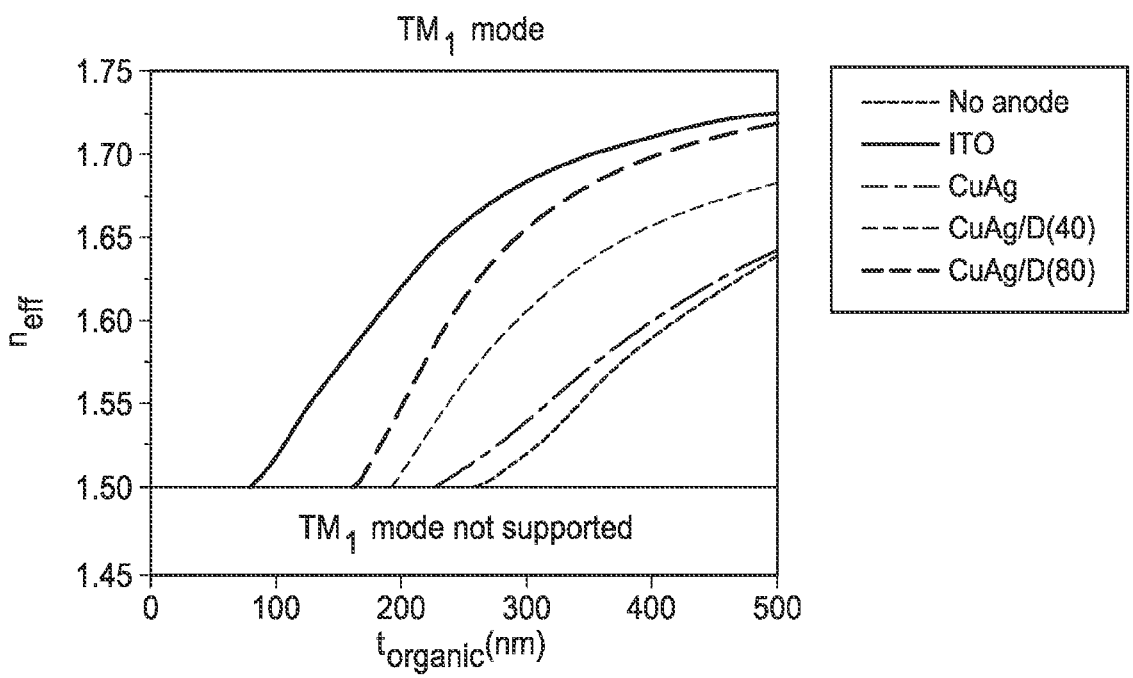

FIGS. 19A-19C show an analysis of waveguide modes in OLEDs with metal-dielectric (MD) anode. FIG. 19A shows a structure that is used for the calculations. Thicknesses of 40 nm and 80 nm ITO were used for dielectric and 8 nm Cu—Ag was used for metal. Calculated effective index ($n_{eff}$) of FIG. 19B $TE_0$ and FIG. 19C $TM_1$ modes as functions of organic layer thickness, $t_{organic}$. The operating wavelength is 530 nm.

Figure 20A:
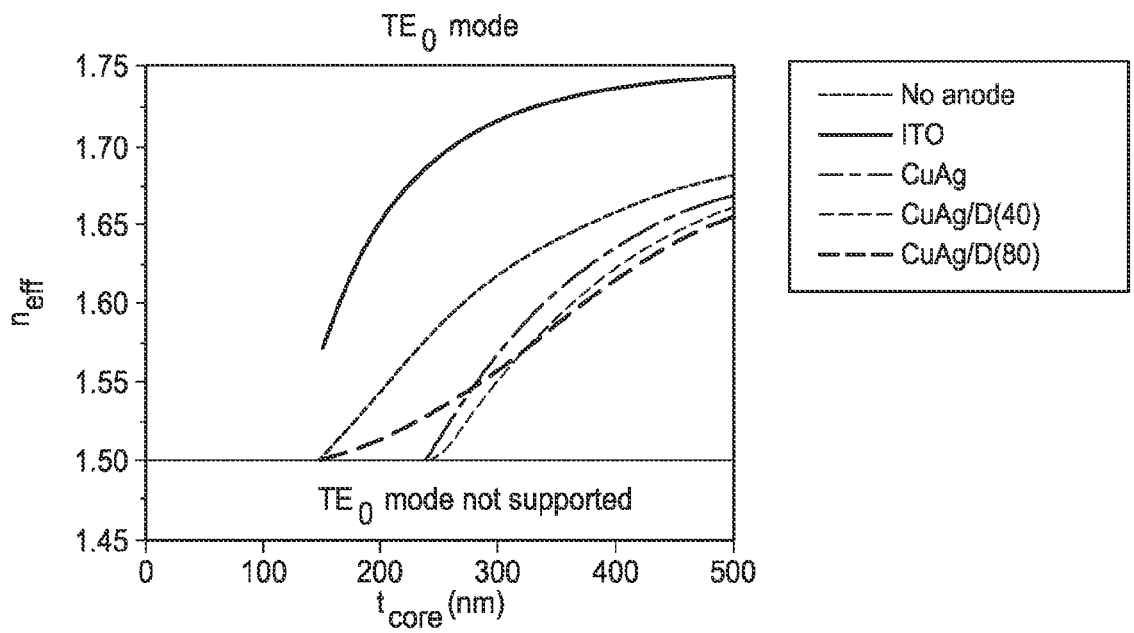
Figure 20B:
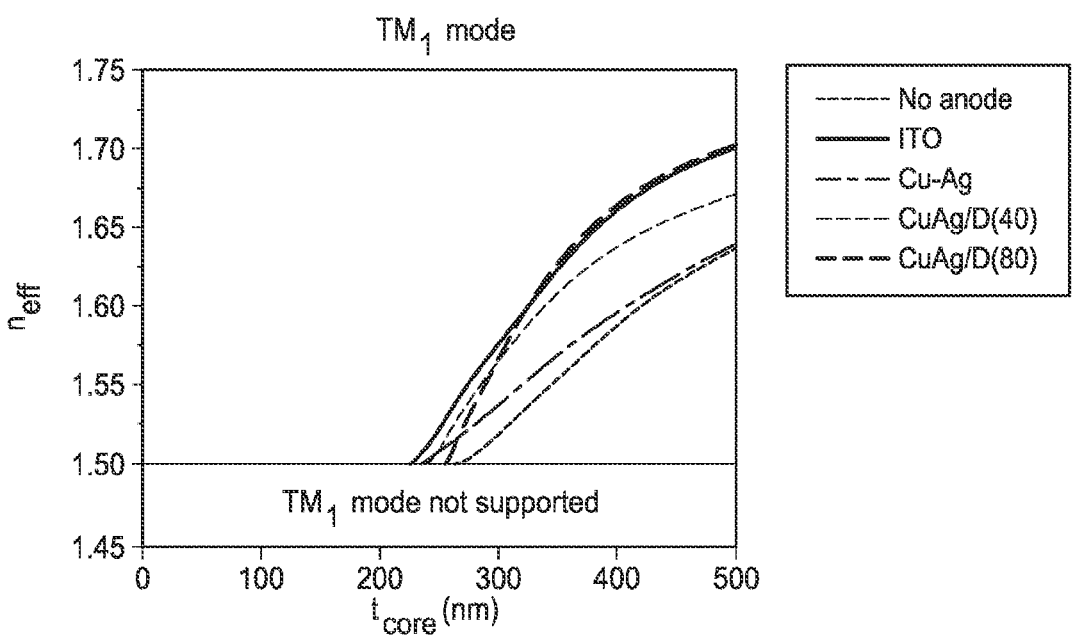

FIGS. 20A-20B show an analysis of waveguide modes in OLEDs with dielectric-metal (MD) anode. Calculated effective index ($n_{eff}$) of FIG. 20A with $TE_0$ mode and FIG. 20B with $TM_1$ mode as functions of waveguide core thickness. The operating wavelength is 530 nm. The plot was obtained by varying organic layer thickness.

Figure 21A:
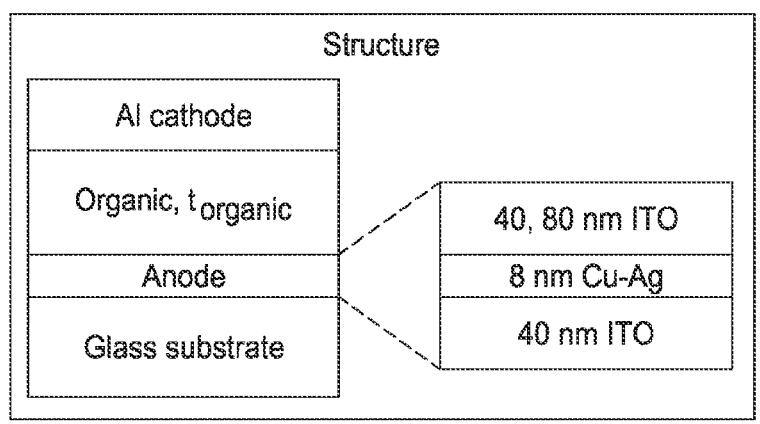
Figure 21B:
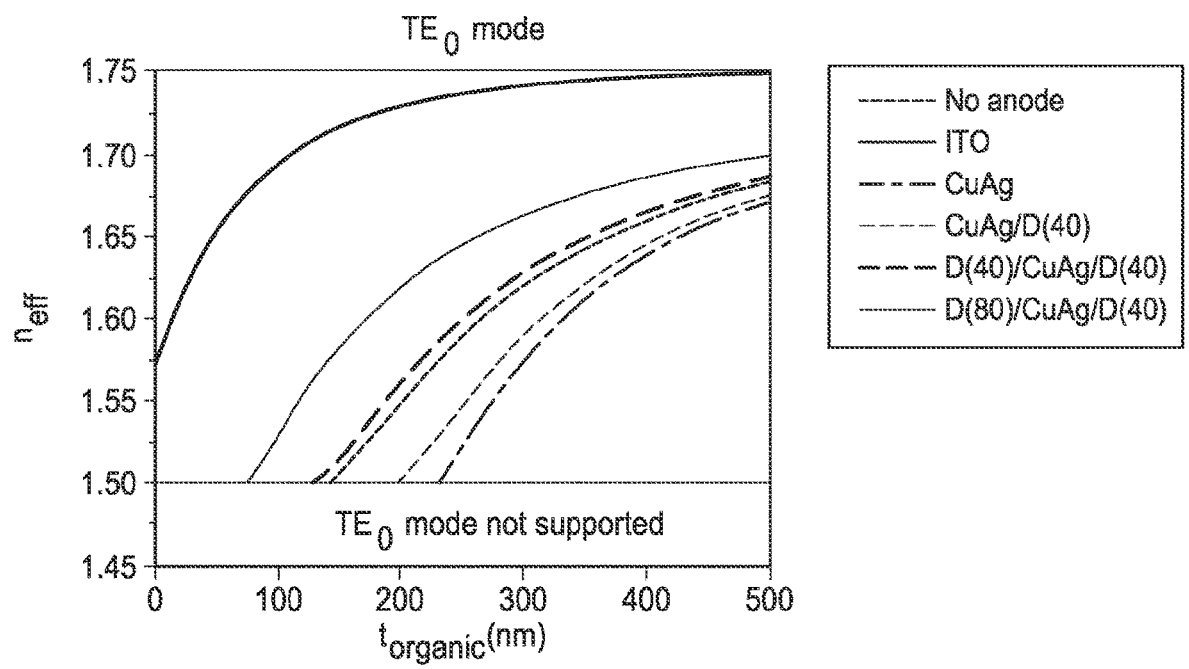
Figure 21C:
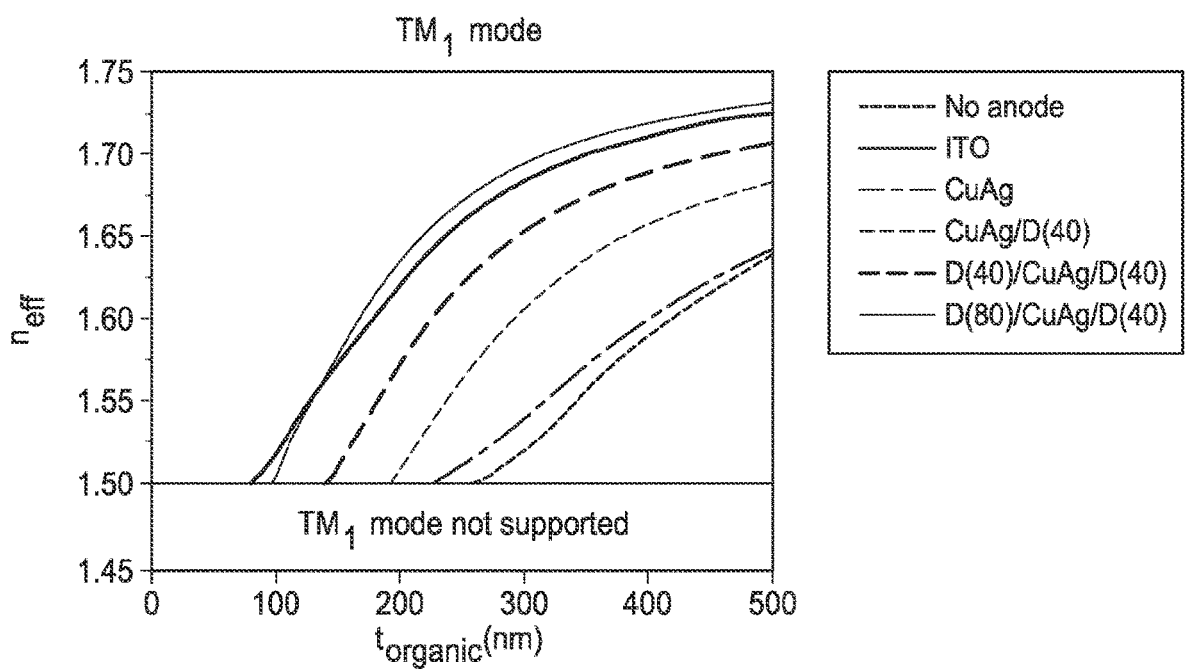

FIGS. 21A-21C show an analysis of waveguide modes in OLEDs with dielectric-metal-dielectric (DMD) anode. FIG. 21A shows a structure that is used for the calculations. A bottom ITO was fixed to a thickness of 40 nm, and 40 nm and 80 nm ITO thicknesses were used for top dielectric. 8 nm Cu—Ag was used for metal conductor. Semi-infinite aluminum (Al) cathode and glass substrate were used. Calculated effective index ($n_{eff}$) of FIG. 21B show $TE_0$ mode and FIG. 21C show $TM_1$ mode as functions of organic layer thickness, $t_{organic}$. The operating wavelength is 530 nm.

Figure 22A:
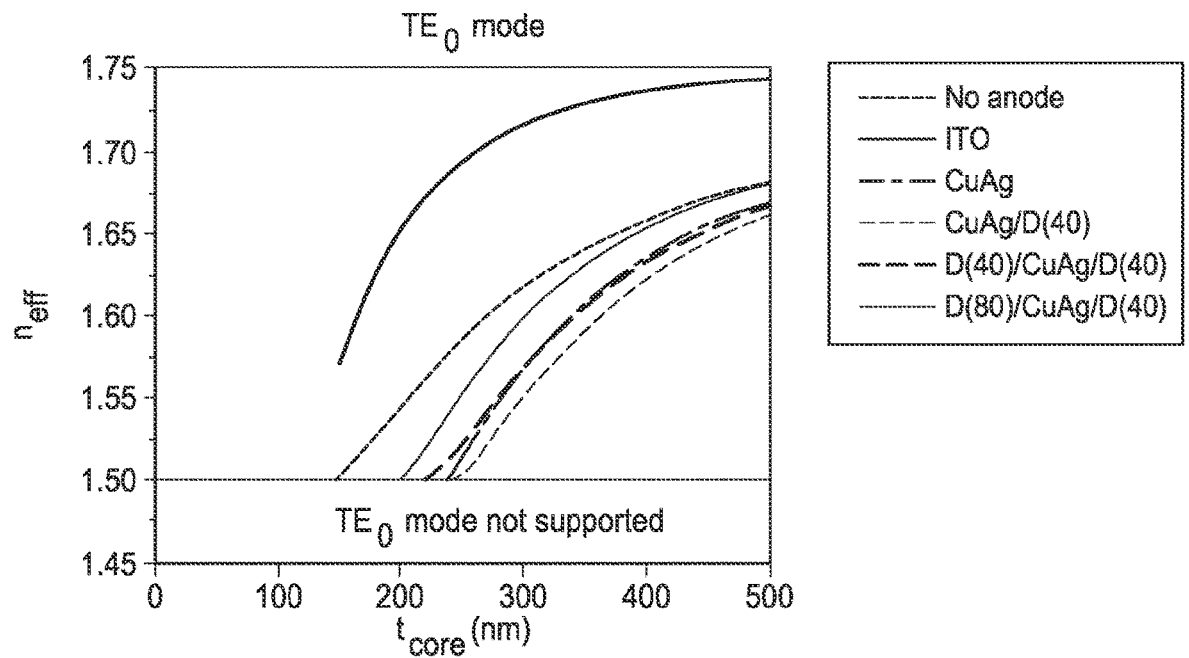
Figure 22B:
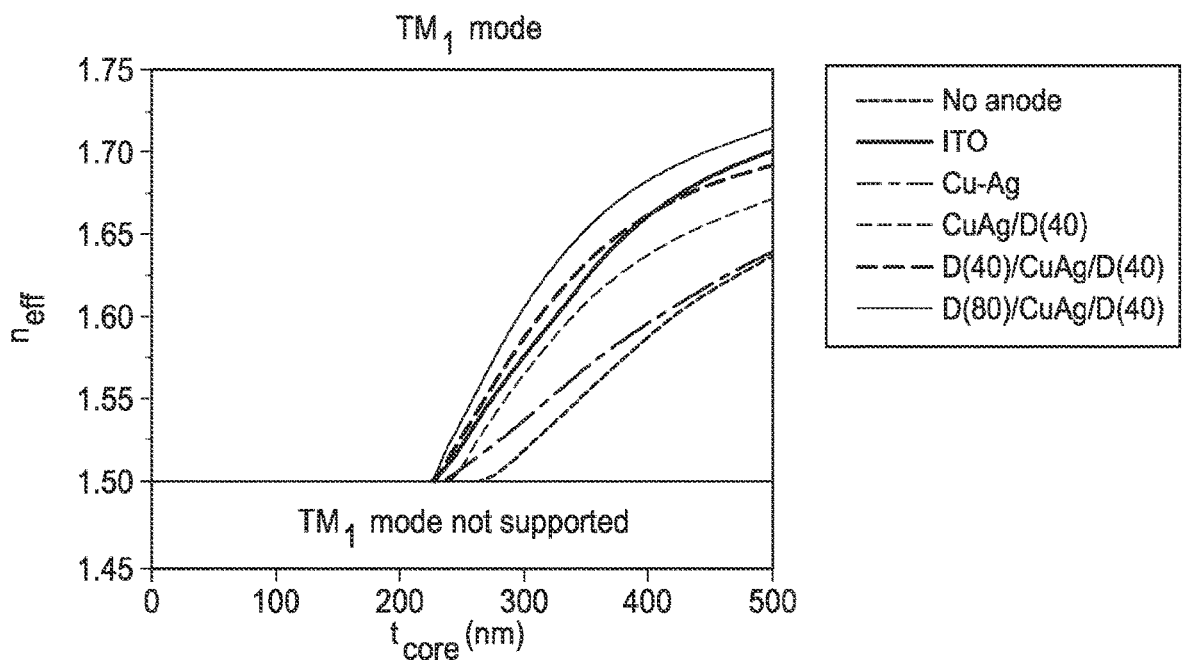

FIGS. 22A-22B show an analysis of waveguide modes in OLEDs with dielectric-metal-dielectric (DMD) anode. Calculated effective index ($n_{eff}$) of FIG. 22A shows $TE_0$ mode and FIG. 22B shows $TM_1$ mode as functions of waveguide core thickness. The operating wavelength is 530 nm. The plot was obtained by varying organic layer thickness. A bottom ITO layer was fixed to a 40 nm thickness, while 40 nm and 80 nm ITO thick layers were used for top dielectric. 8 nm Cu—Ag thick film was used for a metal conductor.

Figure 23A:
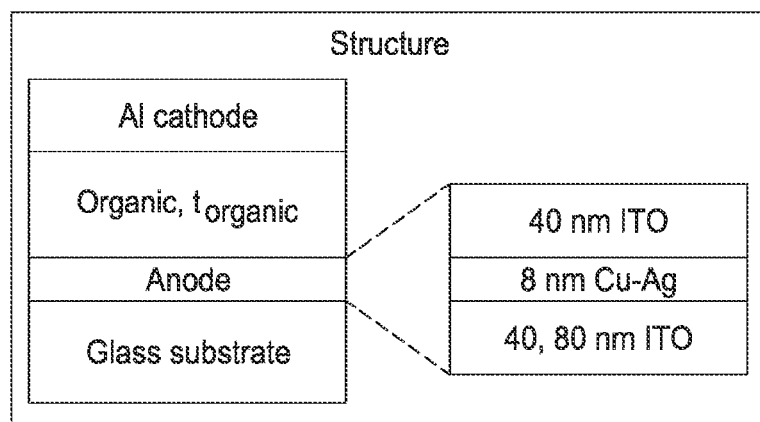
Figure 23B:
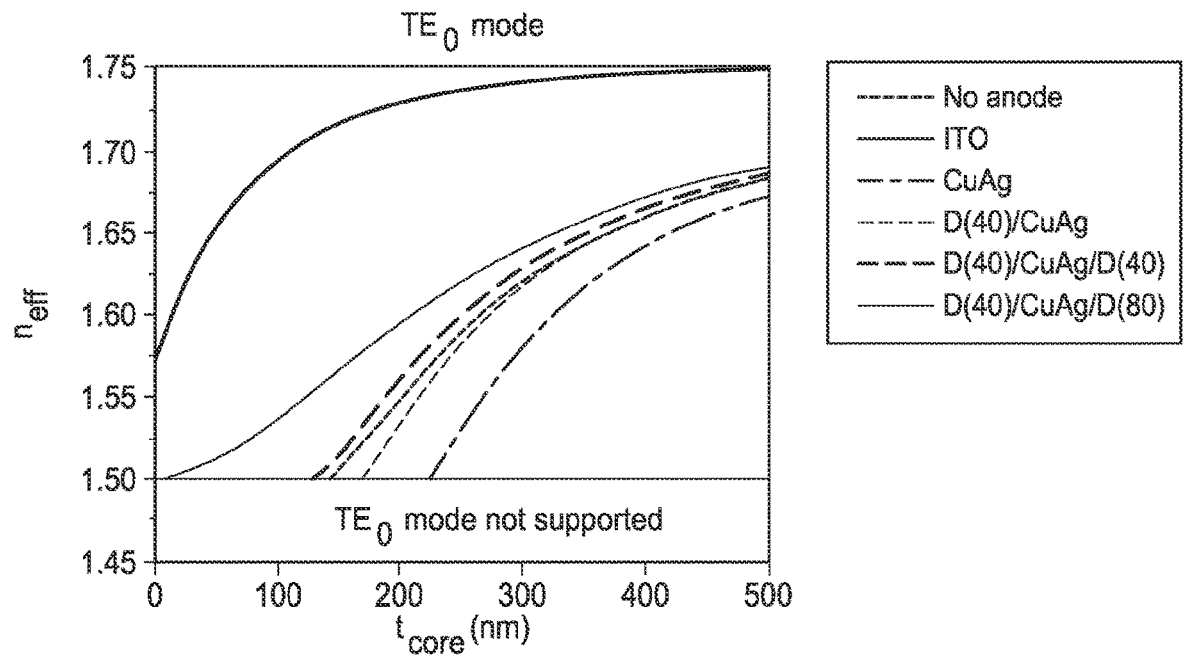
Figure 23C:
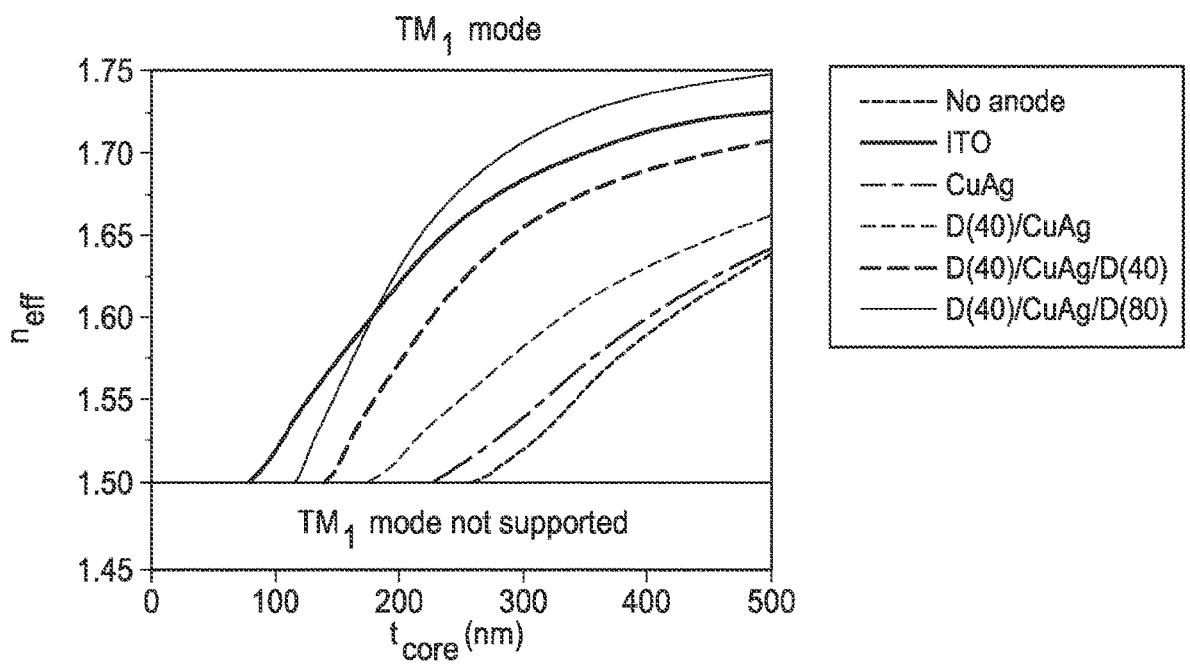

FIGS. 23A-23C show an analysis of waveguide modes in OLEDs with dielectric-metal-dielectric (DMD) anode. FIG. 23A shows a structure that is used for the calculations. A 40 nm thick ITO was used for top dielectric. Thicknesses of 40 nm and 80 nm ITO were used for bottom dielectric, and an 8 nm thick Cu—Ag was used for metal conductor. Semi-infinite Al cathode and glass substrate were used. Calculated effective index ($n_{eff}$) of FIG. 23B show $TE_0$ mode and FIG. 23C show $TM_1$ mode as functions of organic layer thickness, $t_{organic}$ The operating wavelength is 530 nm.

Figure 24A:
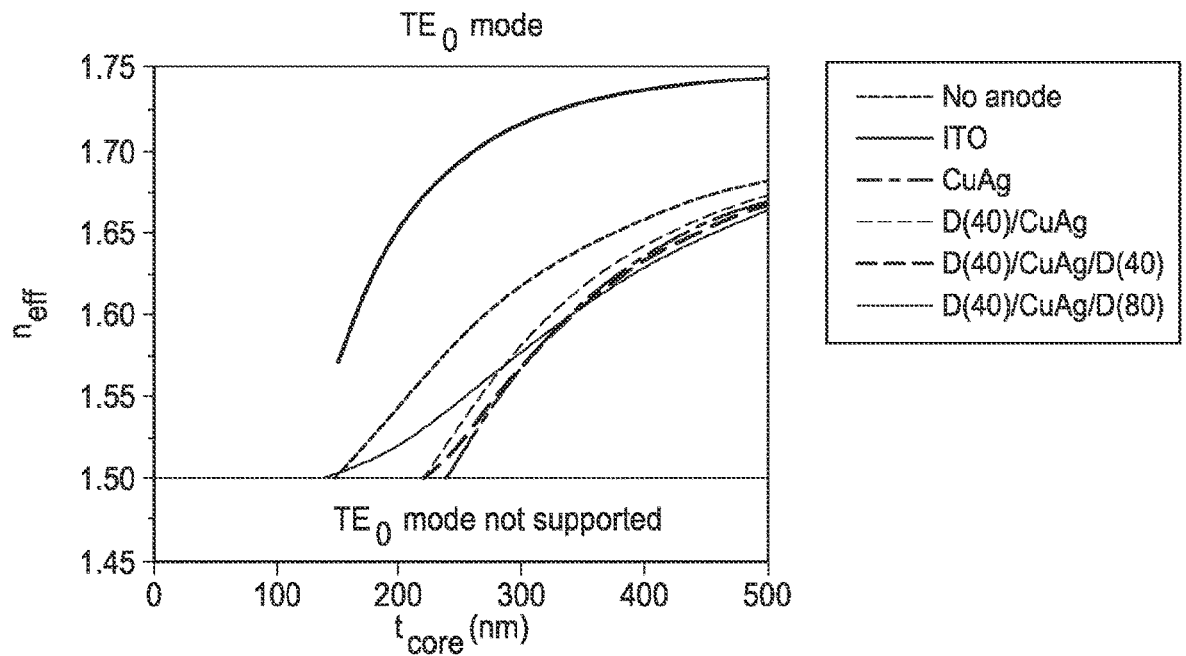
Figure 24B:
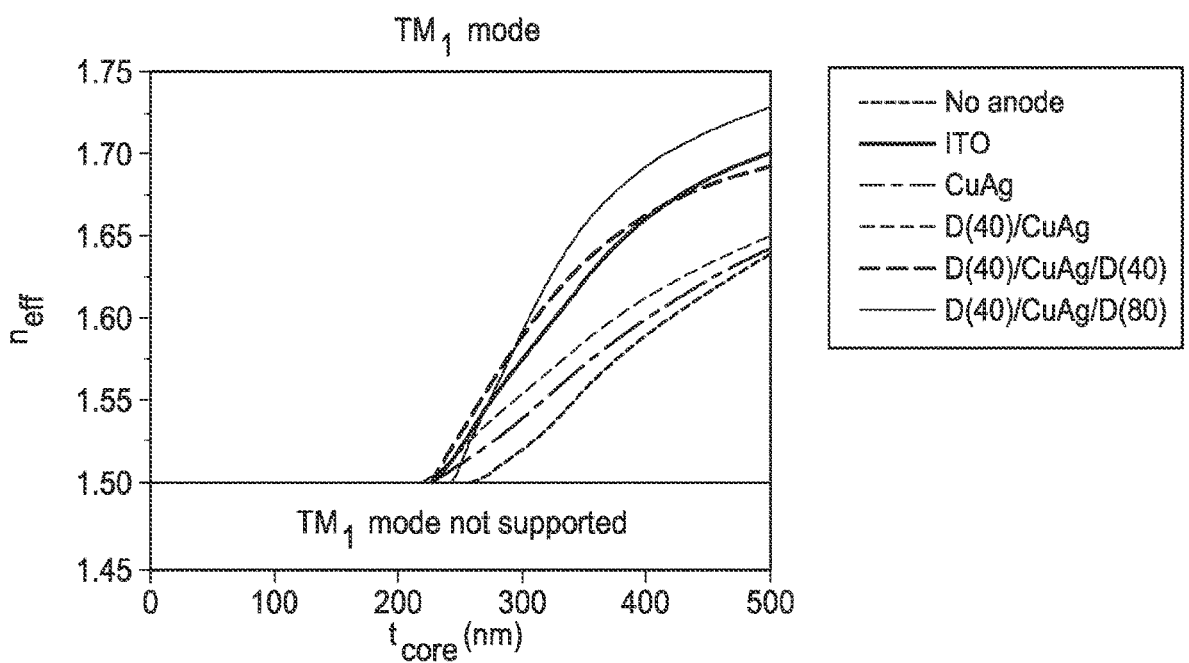

FIGS. 24A-24B show an analysis of waveguide modes in OLEDs with dielectric-metal-dielectric (DMD) anode. Calculated effective index ($n_{eff}$) of FIG. 24A $TE_0$ mode and FIG. 24B $TM_1$ mode as functions of waveguide core thickness. An operating wavelength is 530 nm. The plot was obtained by varying organic layer thickness. A 40 nm thick ITO was used for top dielectric. 40 nm and 80 nm ITO thicknesses were used for bottom dielectric, and 8 nm thick Cu—Ag was used for metal conductor.

Figure 25A:
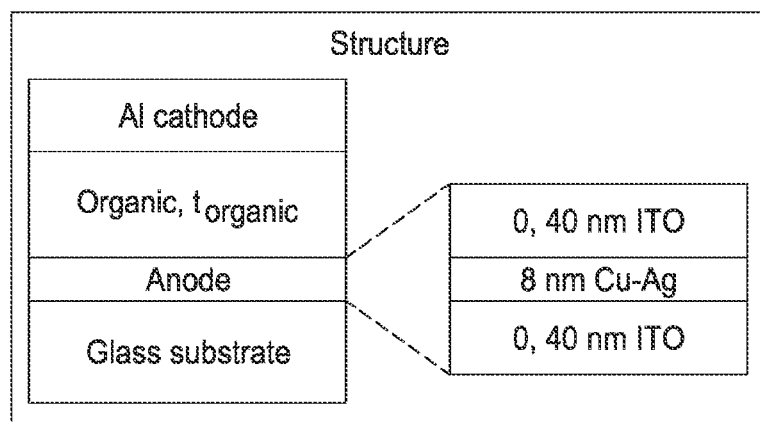
Figure 25B:
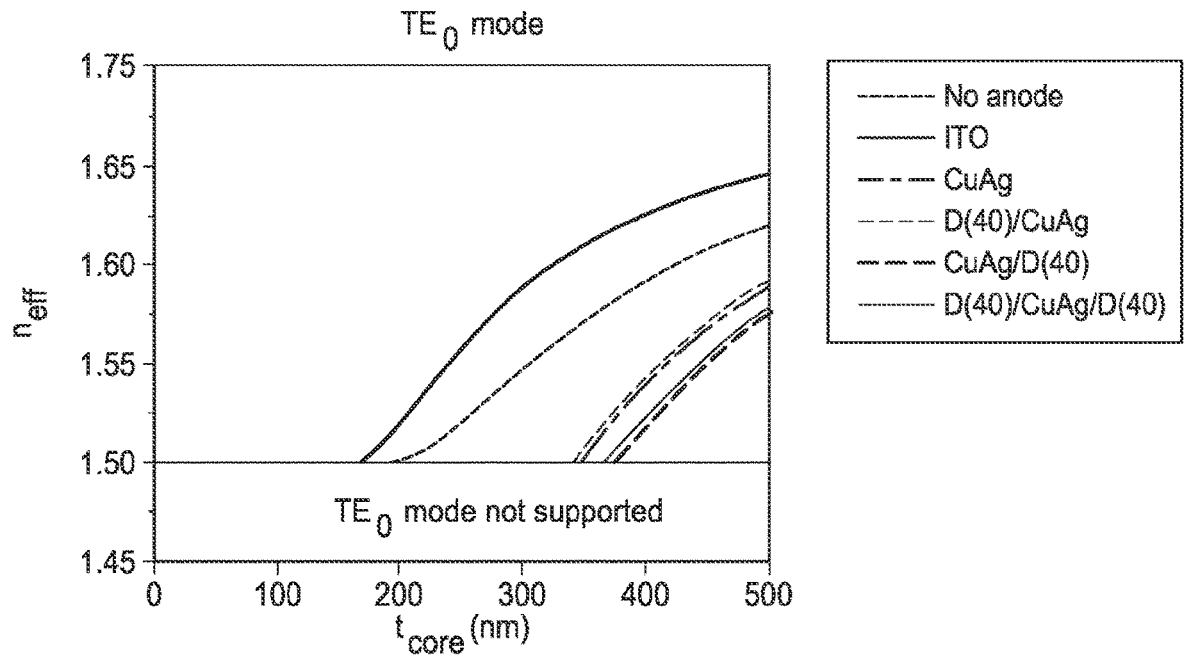
Figure 25C:
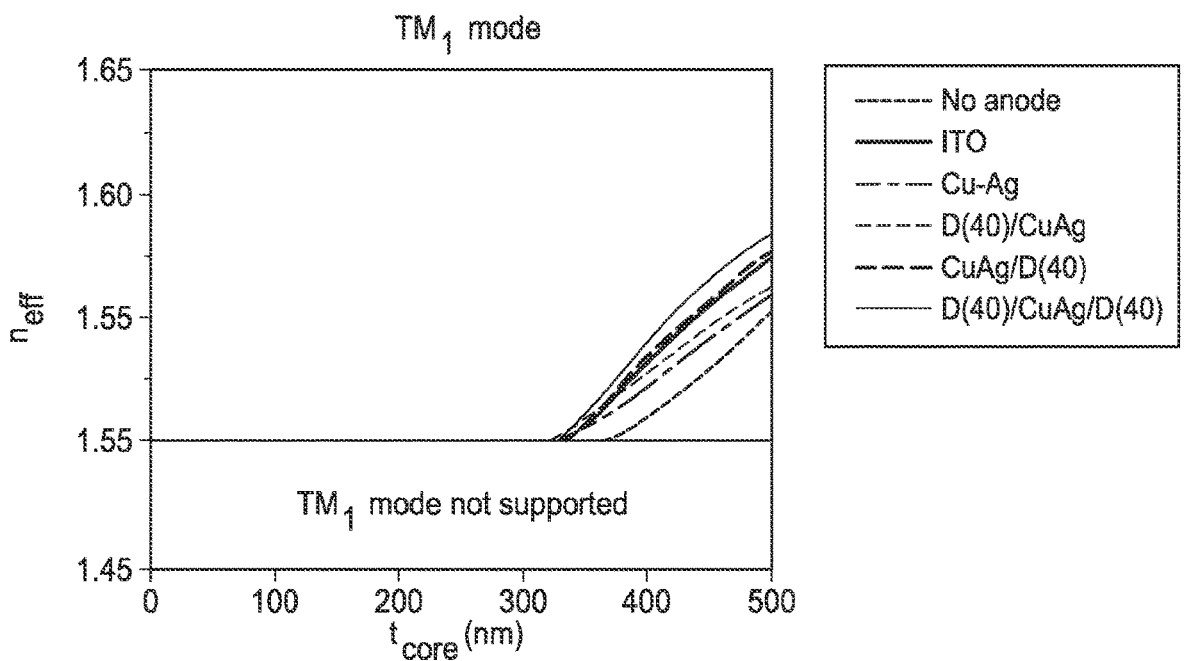

FIGS. 25A-25C show an analysis of waveguide modes in OLEDs with DMD anode. FIG. 25A shows a structure that is used for the calculations. 0 nm and 40 nm top and bottom ITOs were used as dielectrics for the calculation. 8 nm Cu—Ag was used as a metal conductor. Semi-infinite Al cathode and glass substrate were used. Calculated effective index ($n_{eff}$) of FIG. 25B with $TE_0$ mode and FIG. 25C with $TM_1$ mode as functions of core layer thickness are provided. An operating wavelength is 650 nm.

Figure 26A:
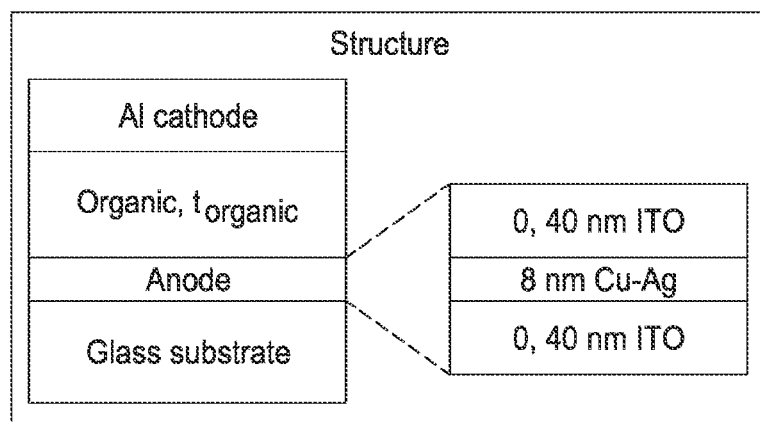
Figure 26B:
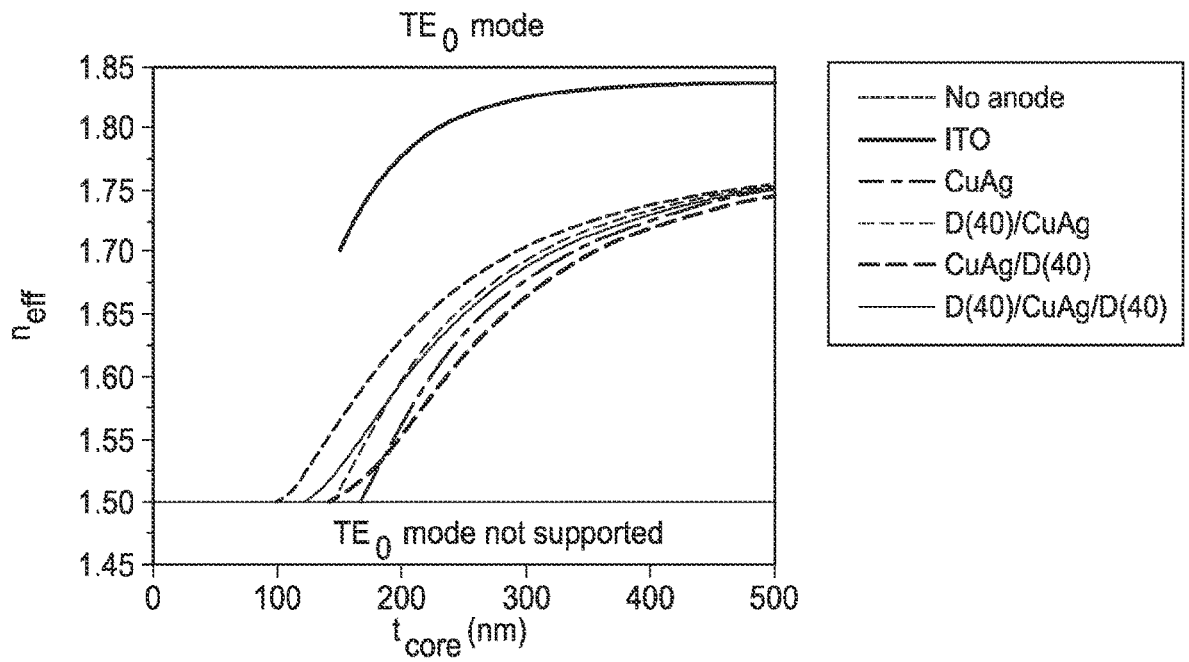
Figure 26C:
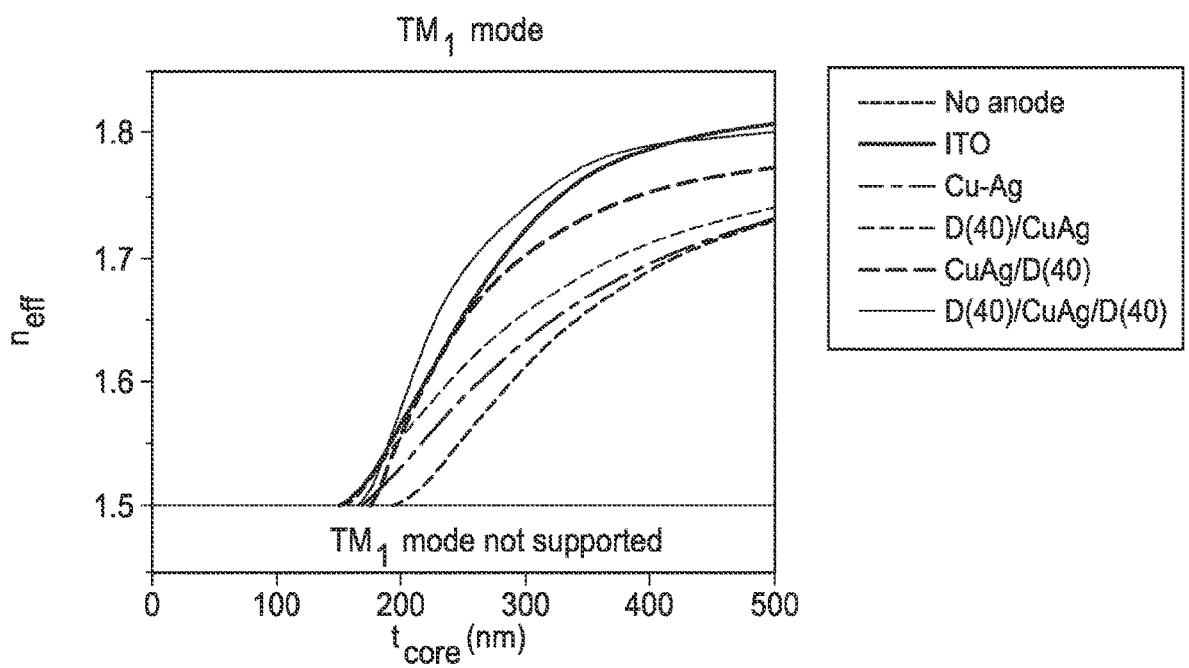

FIGS. 26A-26C show an analysis of waveguide modes in OLEDs with DMD anode. FIG. 26A shows a structure that is used for the calculations. Thicknesses of 0 nm and 40 nm for top and bottom ITOs (dielectrics) were used for the calculation. 8 nm thick Cu—Ag was used for the metal conductor. Semi-infinite Al cathode and glass substrate were used. Calculated effective index ($n_{eff}$) of FIG. 26B for $TE_0$ mode and FIG. 26C for $TM_1$ mode as functions of core layer thickness. An operating wavelength is 450 nm.

Figure 27A:
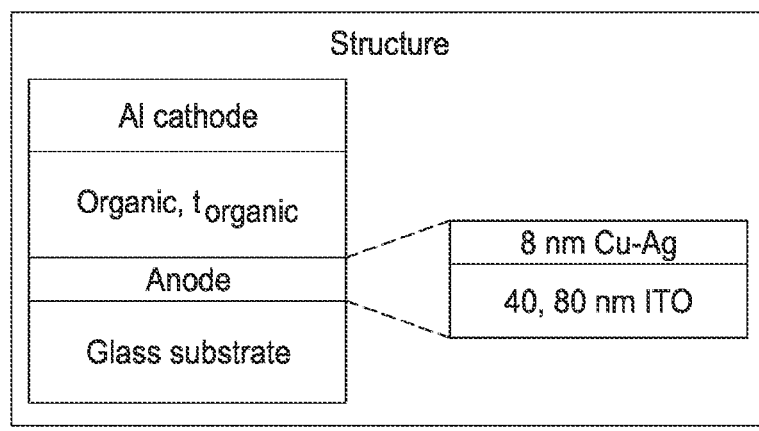
Figure 27B:
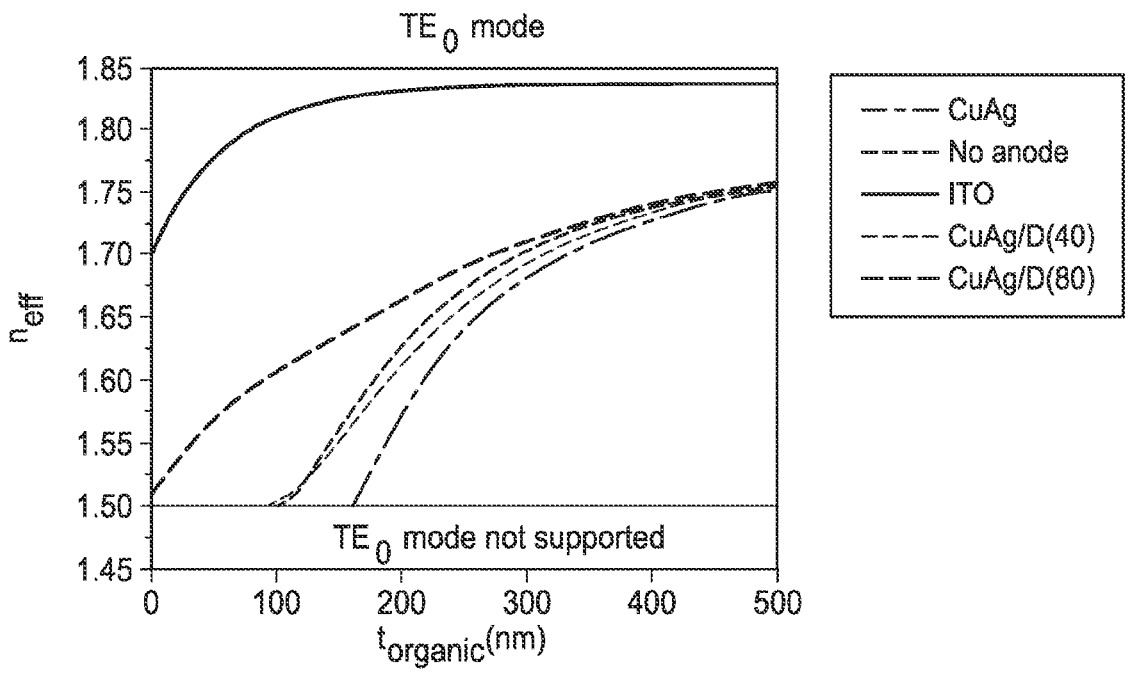
Figure 27C:
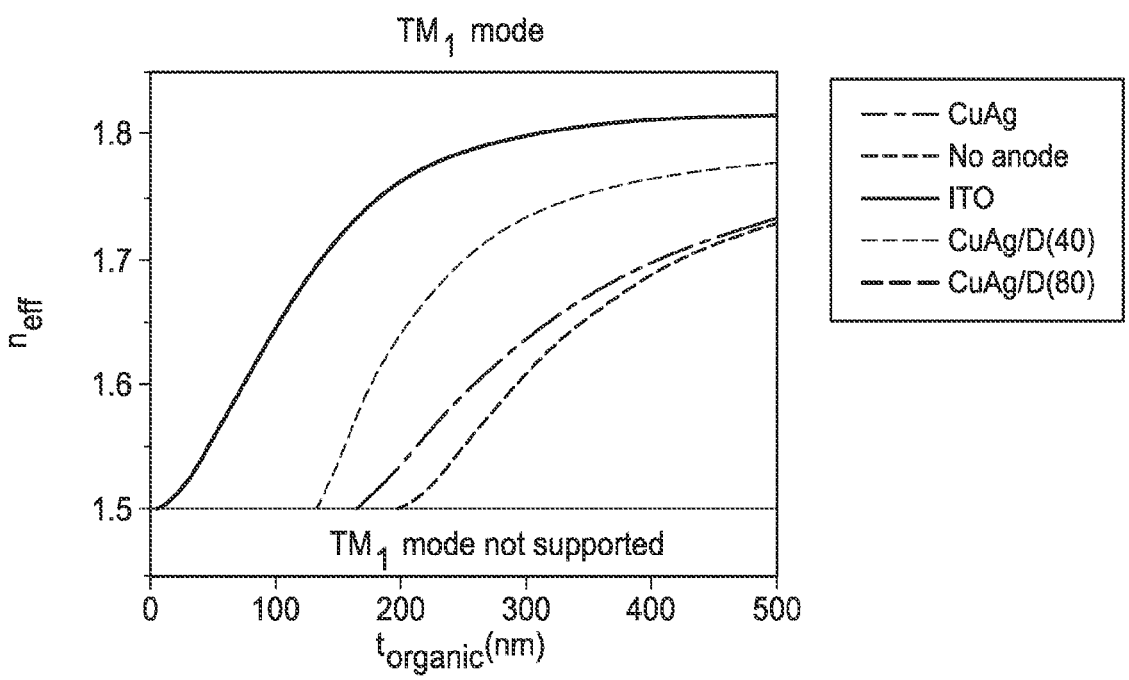

FIGS. 27A-27C show an analysis of waveguide modes in OLEDs with metal-dielectric (MD) anode. FIG. 27A shows a structure that is used for the calculations. Thicknesses of 40 nm and 80 nm ITO were used for dielectric, and 8 nm thick Cu—Ag was used for metal conductor. Semi-infinite Al cathode and glass substrate were used. Calculated effective index ($n_{eff}$) of FIG. 27B for $TE_0$ mode and FIG. 27C for $TM_1$ mode as functions of organic layer thickness, $t_{organic}$ are provided. An operating wavelength is 450 nm.

Figure 28A:
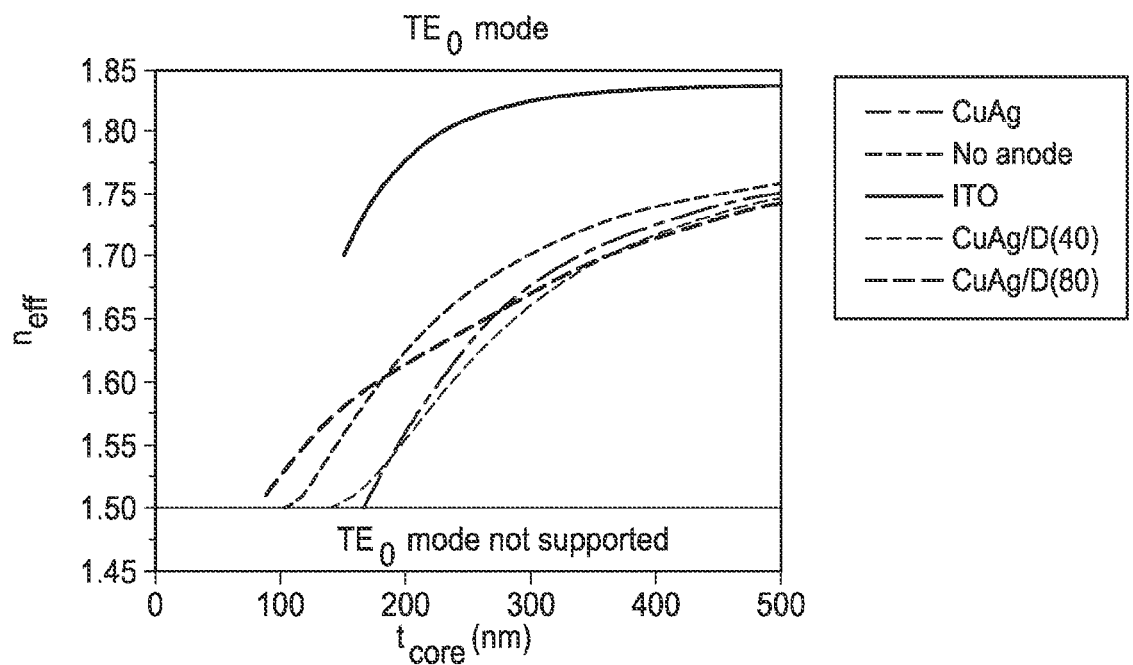
Figure 28B:
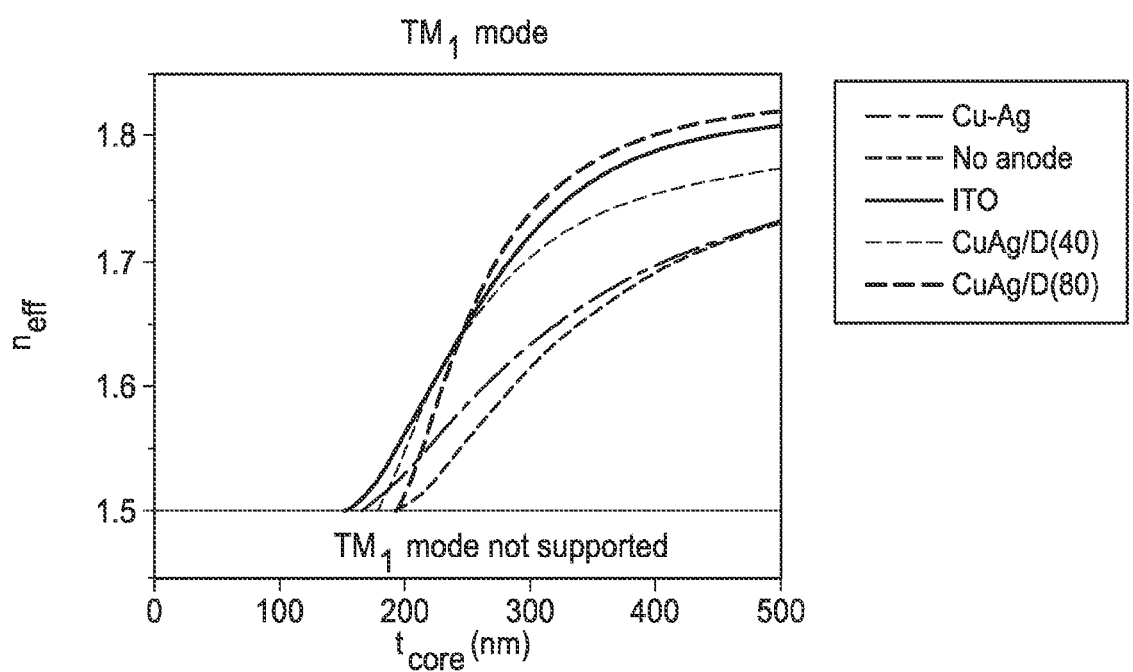

FIGS. 28A-28B show an analysis of waveguide modes in OLEDs with metal-dielectric (MD) anode. Calculated effective index ($n_{eff}$) of FIG. 28A for $TE_0$ mode and FIG. 28B for $TM_1$ mode as functions of waveguide core thickness are provided. An operating wavelength is 450 nm. The plot was obtained by varying organic layer thickness. ITO and Cu—Ag were fixed to thicknesses of 150 nm and 8 nm, respectively.

Figure 29A:
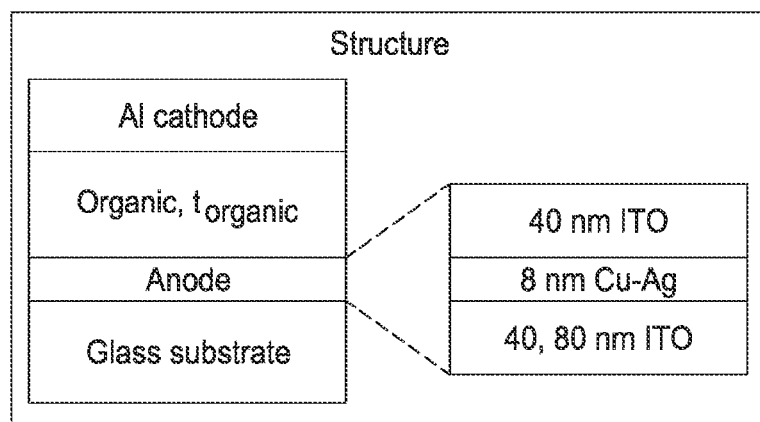
Figure 29B:
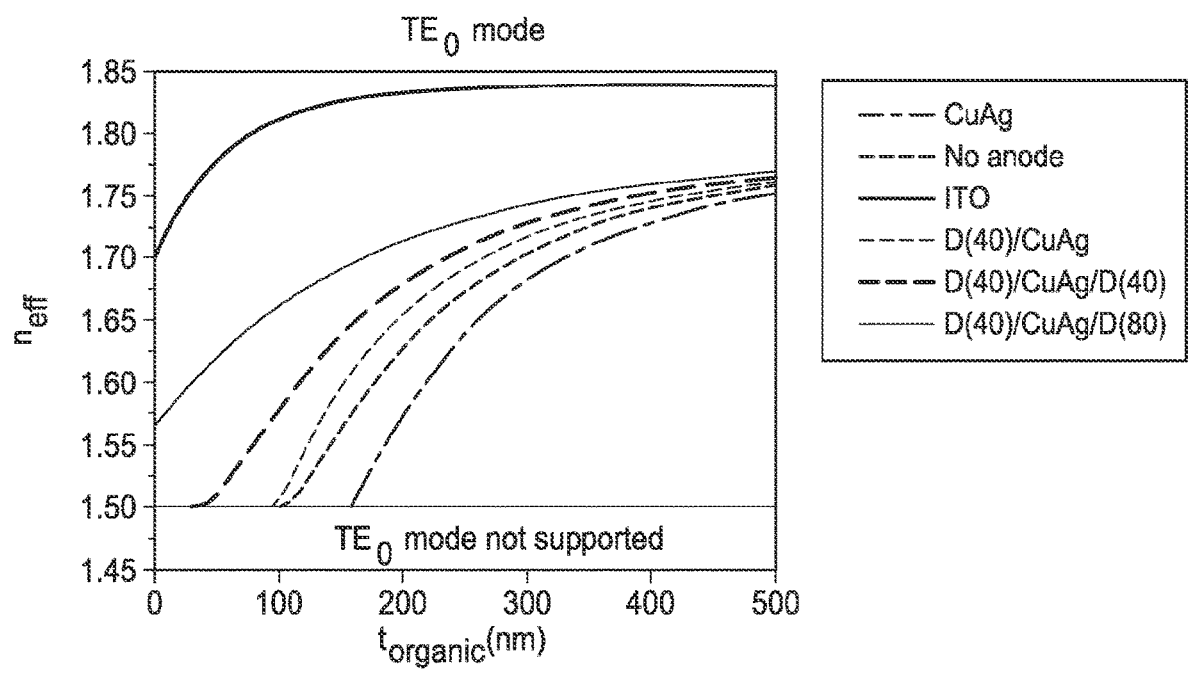
Figure 29C:
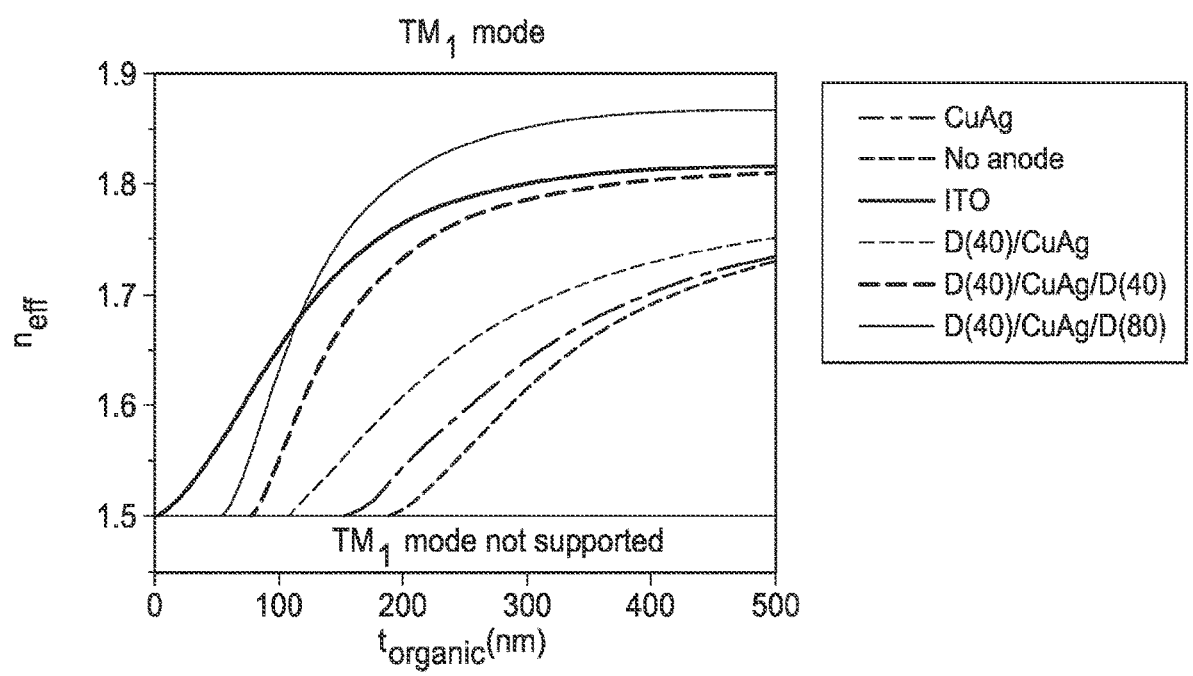

FIGS. 29A-29C show an analysis of waveguide modes in OLEDs with DMD anode. FIG. 29A shows a structure that is used for the calculations. A top dielectric thickness was fixed to 40 nm. 0 nm, 40 nm, and 80 nm ITOs were used for dielectric, and 8 nm Cu—Ag was used for metal conductor. Semi-infinite Al cathode and glass substrate were used. Calculated effective index ($n_{eff}$) of FIG. 29B for $TE_0$ mode and FIG. 29C for $TM_1$ mode as functions of organic layer thickness, $t_{organic}$ are provided. An operating wavelength is 450 nm.

Figure 30A:
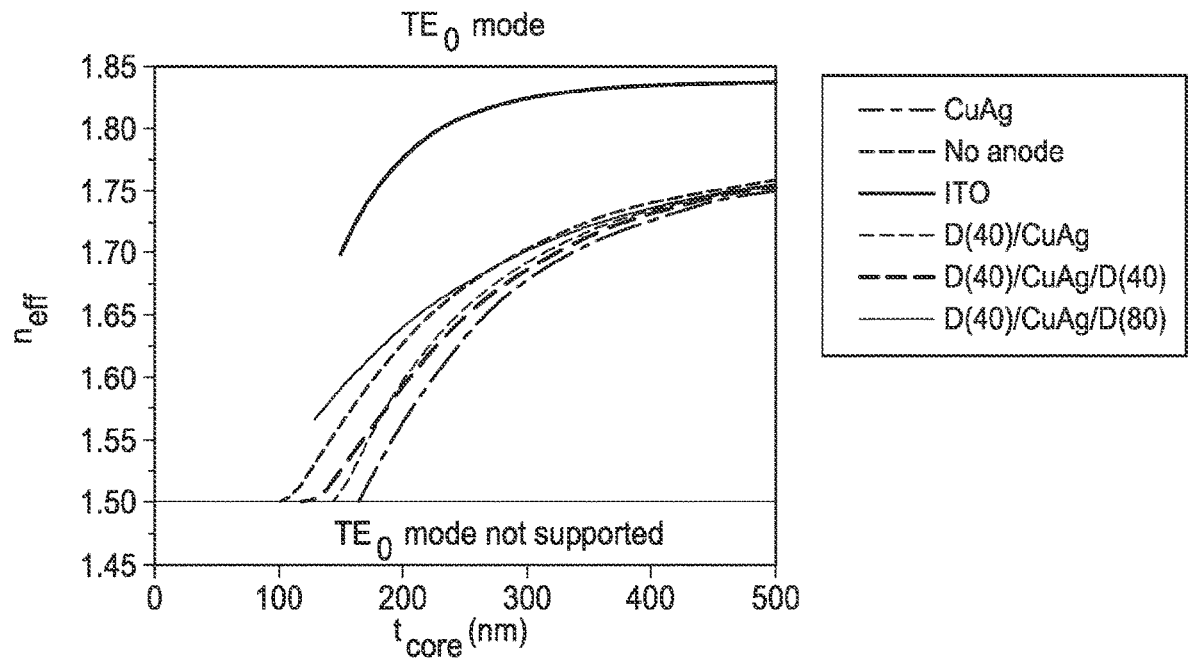
Figure 30B:
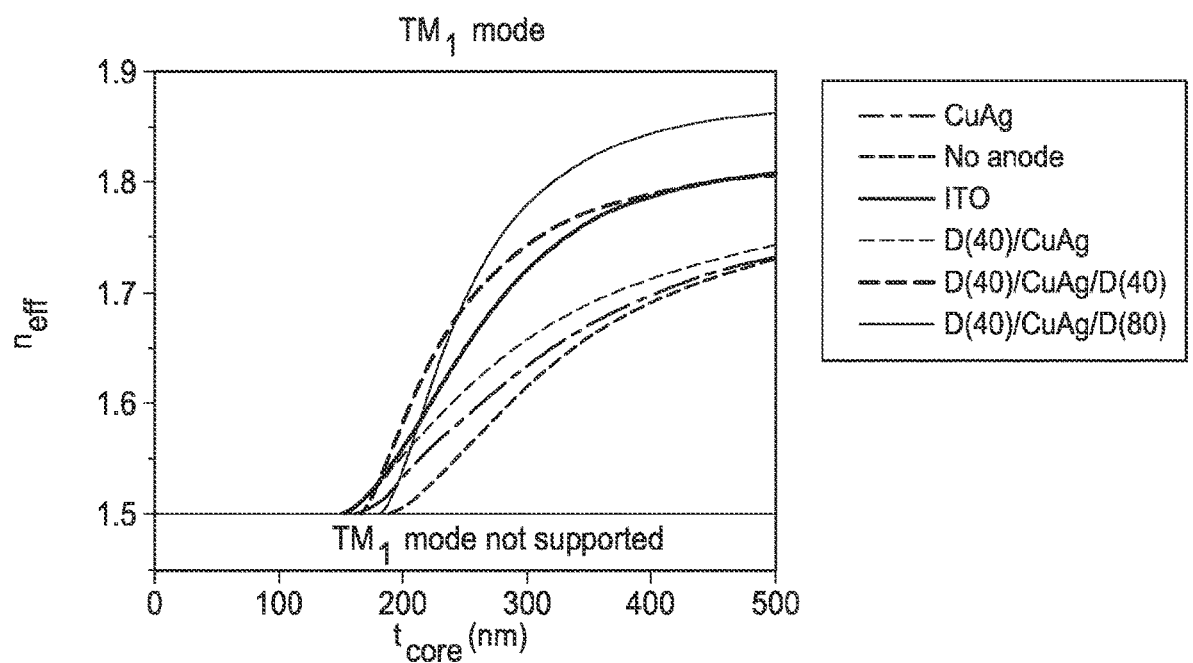

FIGS. 30A-30B show an analysis of waveguide modes in OLEDs with DMD anode. Calculated effective index ($n_{eff}$) of FIG. 30A for $TE_0$ mode and FIG. 30B for $TM_1$ mode as functions of waveguide core thickness, $t_{core}=t_{organic}+t_{anode}$ are provided. An operating wavelength is 450 nm. The plot was obtained by varying organic layer thickness. Bare ITO and Cu—Ag films were fixed to thicknesses of 150 nm and 8 nm, respectively.

Figure 31A:
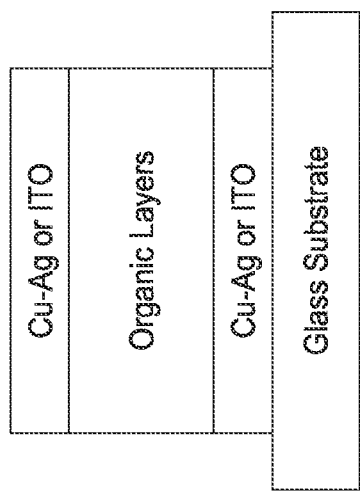
Figure 31C:
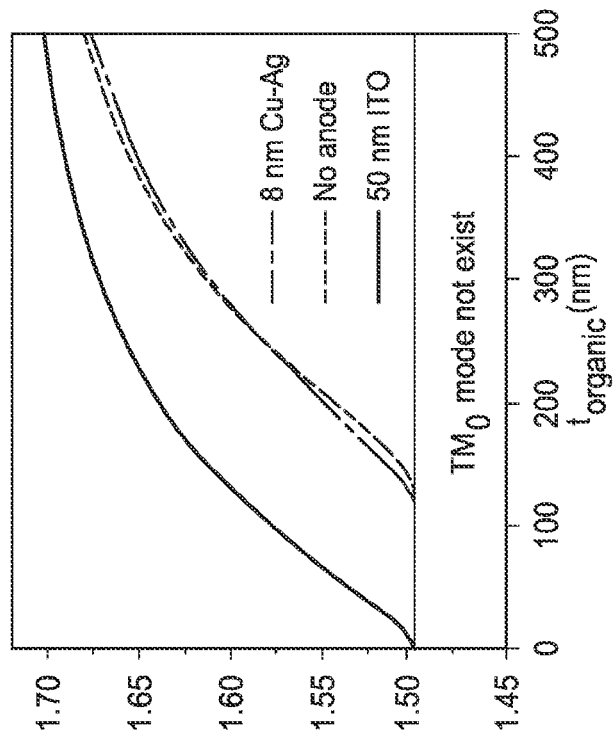
Figure 31B:
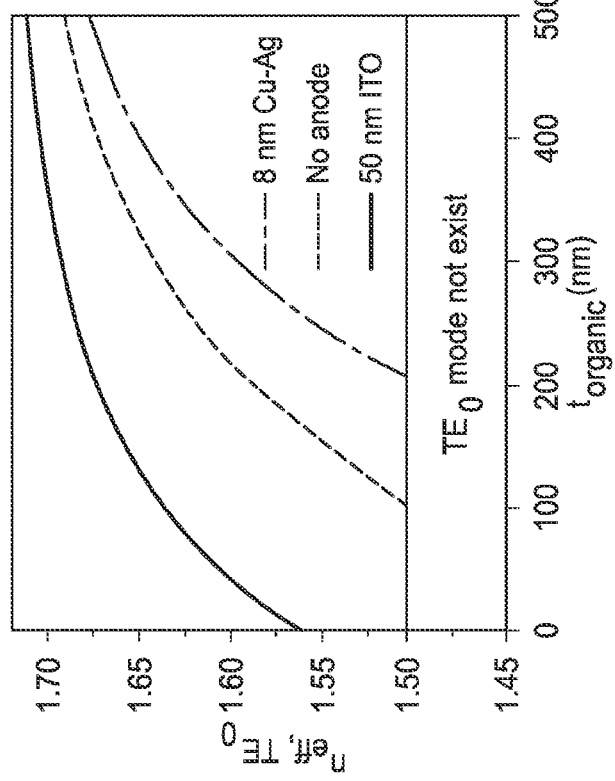

FIGS. 31A-31C show an analysis of waveguide modes for OLEDS with double-sided emitting capability or one embodiment of transparent OLEDs with either a Cu—Ag according to certain aspects of the present disclosure or with a comparative ITO electrode. FIG. 31A shows a schematic illustration of a transparent OLED with ITO or Cu—Ag electrode. Anode and cathode are either ITO or Cu—Ag. Calculated effective index ($n_{eff,TE0}$) of FIG. 31B for $TE_0$ mode and calculated effective index ($n_{eff,TM0}$) for $TM_0$ mode as functions of organic layer thickness of the waveguide are shown in FIG. 31C An operating wavelength is 530 nm. ITO and Cu—Ag films were fixed to thicknesses of 50 nm and 8 nm, respectively.

FIGS. 32A-32D show mode analysis of transparent OLEDs (for example, dual-emitting OLEDs) with ITO and Cu—Ag electrodes. FIGS. 32A and 32B show schematic illustrations of transparent OLEDs with a comparative ITO electrode and Cu—Ag electrode prepared in accordance with certain aspects of the present disclosure, respectively. The organic layer comprises HIL ($MoO_3$), HTL (TAPC), EML (10% $Ir(ppy)_2acac$ doped in CBP), and ETL (TPBi) for both the devices. A 50 nm thick ITO was used for ITO transparent OLED and 5 nm Cu—Ag thick film was used for Cu—Ag transparent OLED. FIGS. 32C and 32D show spectral power dissipation versus wavenumber in the propagation direction. FIG. 32C shows two waveguide modes, TE and TM modes. FIG. 32D does not show any waveguide mode. Glass mode exists in both the ITO and Cu—Ag transparent OLEDs.

Figure 33:
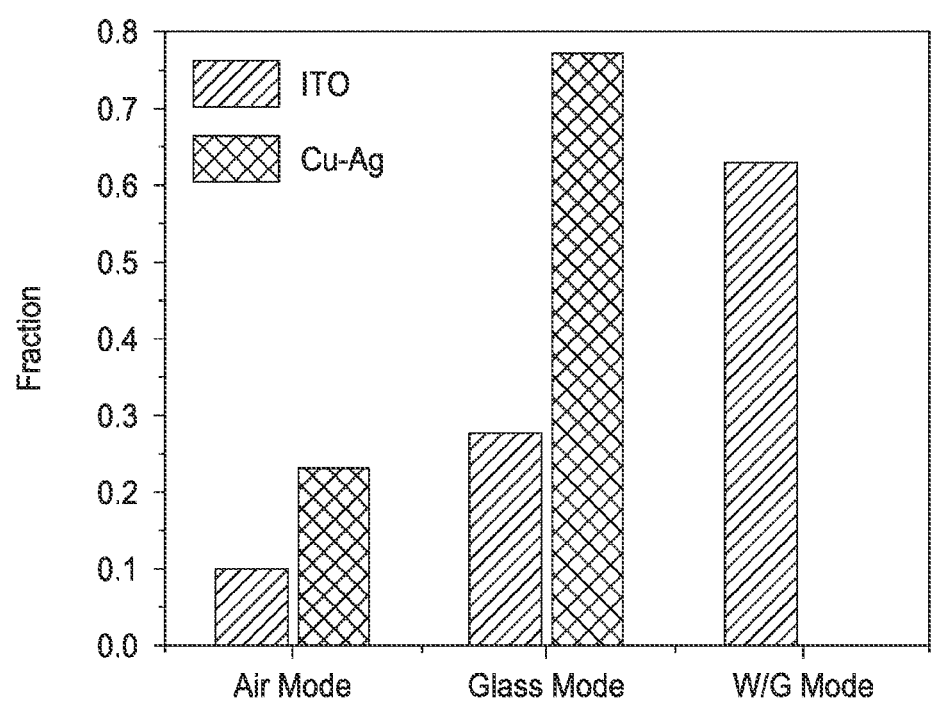

FIG. 33 shows energy fraction of each mode in the ITO and Cu—Ag transparent dual-sided emitting OLEDs. ITO and Cu—Ag in FIG. 33 refer to comparative ITO and Cu—Ag based transparent OLEDs, respectively. W/G mode refers to waveguide mode. Surface plasmon polariton (SPP) mode does not exist due to the absence of an aluminum cathode, unlike single-sided emitting OLEDs with a thick aluminum cathode. Cu—Ag transparent OLED does not have waveguide portion due to the elimination of waveguide mode. The ITO transparent OLED shows large waveguide portion, meaning that significant amount of light is trapped inside of the ITO transparent OLED. The Cu—Ag transparent OLED has large portion at glass mode which can readily be extracted.

Corresponding reference numerals indicate corresponding parts throughout the several views of the drawings.

DETAILED DESCRIPTION

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges.

Example embodiments will now be described more fully with reference to the accompanying drawings.

In various aspects, the present disclosure contemplates methods of improving performance, such as light emission efficiency (e.g., external quantum efficiency (EQE)) in organic light emitting diode devices. For example, methods of increasing light emission efficiency in an organic light emitting diode according to certain aspects of the present disclosure may include eliminating or reducing at least one waveguide mode from an organic light emitting diode (OLED) device. Generally, waveguide modes can be related to the transverse electric waves, alternatively referred to as H waves, where the electric vector (E) is perpendicular to the direction of propagation. Transverse magnetic waves also can form a waveguide mode, alternatively referred to as H waves, are where the electric vector (E vector) is perpendicular to the direction of propagation. In conventional OLEDs, there are only 3 modes, transverse electric $TE_0$ mode, transverse magnetic $TM_0$ mode, and transverse magnetic $TM_1$ mode. Thus, in certain aspects, the waveguide mode that is eliminated or reduced by the present methods may be selected from the group consisting of: transverse electric $TE_0$ mode, transverse magnetic $TM_0$ mode, transverse magnetic $TM_1$ mode, and combinations thereof. The $TM_0$ wave is considered a surface plasmon polariton (SPP) mode, while $TE_0$ and high order TM ($TM_1$) waves are generally considered so-called waveguide modes. Thus, in certain aspects, the waveguide mode that is eliminated or reduced by the present methods may be selected from the group consisting of: transverse electric $TE_0$ mode, transverse magnetic $TM_1$ mode, and combinations thereof. The $TM_0$ wave is considered a surface plasmon polariton (SPP) mode, while $TE_0$ and high order TM ($TM_1$) waves are generally considered so-called waveguide modes. In certain variations, the present methods may provide an OLED device design that eliminates both the transverse electric $TE_0$ mode and the transverse magnetic $TM_1$ mode.

One method of decoupling at least one waveguide mode in accordance with certain aspects of the present disclosure includes redesigning a traditional organic light emitting diode (OLED) device configuration by disposing an ultrathin electrically conductive transparent metallic electrode having a first polarity into the OLED. The ultrathin electrically conductive transparent metallic electrode may be used as a substitute in lieu of a traditional transparent conductive electrode, such as an indium tin oxide (ITO) transparent conductive electrode. In this manner, as will be described further below, increasing a light emission efficiency, for example, represented by an external quantum efficiency (EQE) of the organic light emitting diode, may be significantly increased as compared to a conventional OLED using ITO or other conventional transparent conductive electrodes.

Figure 1:
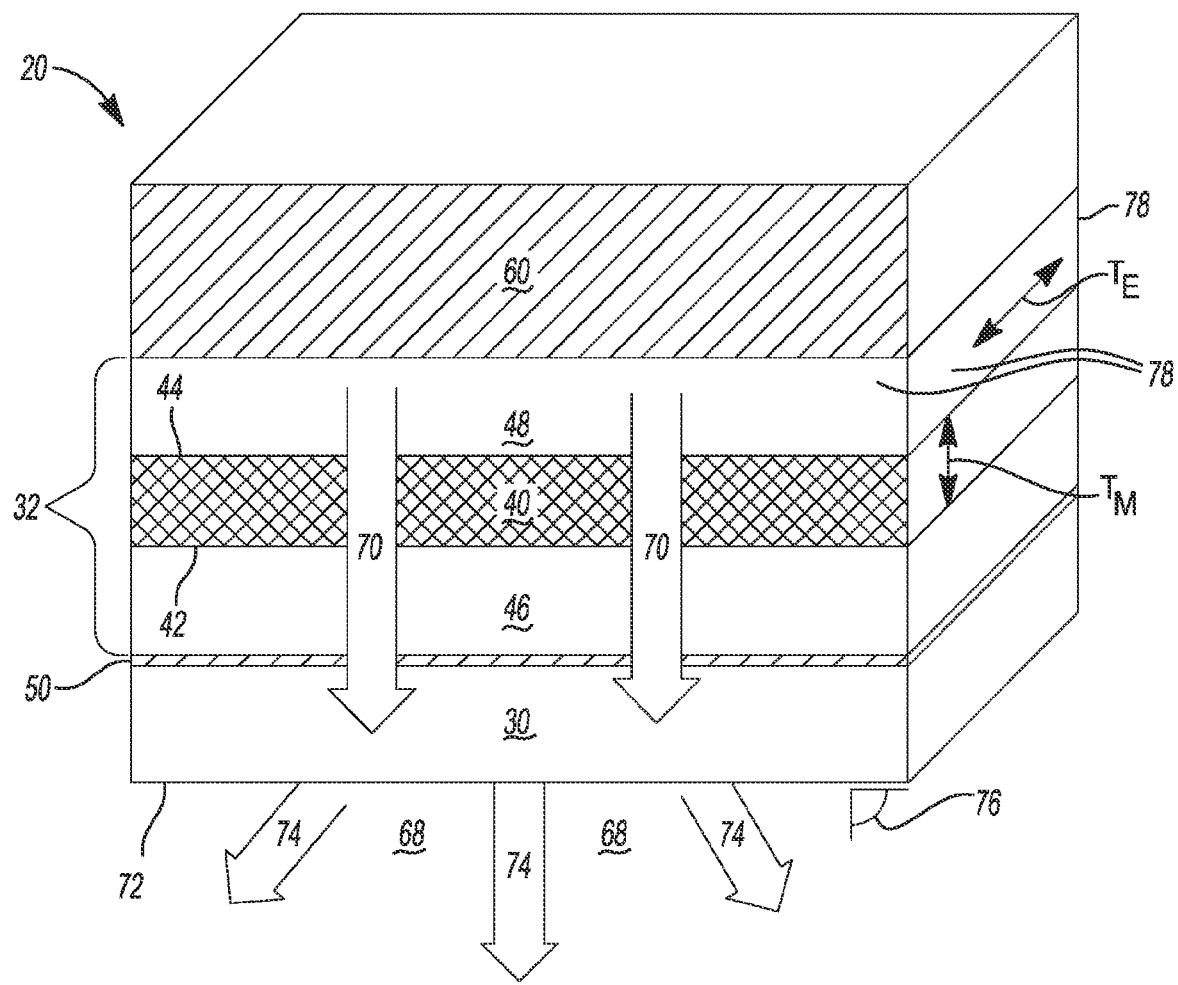

FIG. 1 shows a non-limiting example of an organic light emitting diode (OLED) 20 device, which may be prepared according to certain aspects of the present disclosure. The OLED 20 includes a substrate 30 that may be transparent to light in a portion of an electromagnetic spectrum having a range of predetermined wavelengths, for example, in the visible light spectrum or a portion of the visible light spectrum. Visible light typically has wavelengths ranging from about 390 to about 750 nm (where the shorter wavelengths correspond to violet through the spectrum of colors to the longer wavelengths of red). The substrate 30 may be formed of materials that are substantially transparent to visible light, such as glass, like fused silica, quartz, or transparent polymeric materials, like acrylates, polycarbonates, and the like.

The OLED 20 also includes an emissive assembly 32. As recognized by those of skill in the art, the emissive assembly 32 may be considered to be an organic layer that includes at least one layer that is capable of electroluminescence to generate photons. The emissive assembly 32 may include a plurality of layers (e.g., two or more layers). For example, the emissive assembly 32 may include an emissive active layer 40 defining a first side 42 and a second opposite side 44. The emissive assembly 32 may also include at least one first charge transport layer 46 disposed along the first side 42 and an optional second charge transport layer 48 disposed along the second side 44. The first charge transport layer 46 may transport electron holes (hole transport layer (HTL)), while the second charge transport layer 48 may transport electrons (electron transport layer (ETL)) when the device is activated by application of electrical energy to a pair of surrounding electrodes that promote formation and transport of photons from the emissive active layer 40. It will be appreciated by those of skill in the art that the emissive assembly for the OLED 20 may have differing designs and configurations, including omitting one or more of the layers discussed, as are known in the art. For example, while not shown, the emissive assembly 32 may be a bilayer structure including the emissive active layer 40 selected to generate electrons, while a single first charge transport layer 46 may be selected to be a conductive material that generates electron holes. Additionally, the emissive assembly 32 may further comprise one or more hole injection layers (HIL), electron injection layers (EIL), and the like.

The emissive active layer 40 may be formed of an electroluminescent material. OLEDs generally are formed from small molecule OLEDs (SMOLEDs), having small organic molecules in the organic emissive active layer 40 that fluoresce or phosphoresce, or polymer OLEDs (POLEDs), which use organic polymers in the organic emissive active layer 40. The SMOLEDs may have organic layers formed of a variety of different molecules. Electroluminescent material may include organometallic chelates, such as tris(8-hydroxyquinoline aluminum ($Alq_3$), platinum octaethyl porphyrin (PtOEP), iridium-pyridine ($Ir(ppy)_3$), 4,4'-Bis(N-carbazolyl)-1,1'-biphenyl (CBP), N,N'-di-[(1-napthalenyl]-N,N'-diphenyl]-(1,1'-biphenyl)-4,4'-diamine) (α-TPD), N,N-diphenyl-N,N-di(3-methylphenyl)-1,1-biphenyl-4,4-diamine (TPD), other fluorescent and phosphorescent dyes, conjugated dendrimers, and the like. More specifically, commonly used fluorescent materials for the SMOLEDs include DPVBi (4,4'-bis(2,2'-diphenylvinyl)-1,1'-biphenyl) or bis-(2-(diphenylphosphino)phenyl)ether oxide (DPEPO) for blue colored light, $Alq_3$ doped with DMQA (N,N'-dimethylquinacridone) or 1,3-Bis(N-carbazolyl)benzene (mCP) for green colored light, 3,3-di(9H-carbazol-9-yl)biphenyl (mCBP) for yellow colored light, $Alq_3$ doped with DCJTB (4-(dicyanomethylene)-2-t-butyl-6(1,1,7,7-tetramethyljulolidyl-9-enyl)-4H-pyran) or 4,4'-bis(9-carbazolyl)-1,1'-biphenyl (CBP) for red colored light, and SAlq (bis(2-methyl-8-quinolato)-(triphenylsiloxy)aluminum(III)) doped with DPVBi for white colored light. Phosphorescent compounds may include PVK (poly(n-vinylcarbazole)) doped with various organometallic iridium complexes. Several examples include $(PPM)_2Ir(acac)$ for green light, $(DFPPM)_2Ir(CN)(PPh_3)$ for blue light, $(DPQ)_2Ir(acac)$ for red light, and $(MPPZ)_2Ir(acac)$ for yellow light. POLEDs are similar to SMOLEDs, but the emissive layer and optionally the hole transporting layer comprise organic polymer materials. POLED emissive layer polymers may include PPP (poly(p-phenylene), PF (poly(fluorine)), PT (poly(thiophene)), and PPV (poly(p-phenylenevinylene)), and derivatives thereof.

The emissive active layer 40 may be formed one or more layers. In one variation, the emissive active layer 40 may have a thickness of greater than or equal to about 15 nm to less than or equal to about 200 nm. As was discussed above, a thicker emissive active layer 40 can serve to enhance a quantity of photons generated and thus to enhance an intensity of light emitted from the OLED 20.

The first charge transport layer 46 may be formed of a material that transports a charge (e.g., an electron hole or HTL). By way of non-limiting example, the first charge transport layer 46 may comprise an organic material like 4,4'-cyclohexylidenebis[N,N-bis(4-methylphenyl)benzenamine] (TAPC), N,N-diphenyl-N,N-di(3-methylphenyl)-1,1-biphenyl-4,4-diamine (TPD), N,N'-di-[(1-napthalenyl]-N,N'-diphenyl]-(1,1'-biphenyl)-4,4'-diamine) (α-TPD), (1,4-bis(1-naphthylphenylamino)biphenyl) (NPB), and the like. For POLED HTL layers, the material may be PEDT:PSS (polyethylene dioxythiophene polystyrene sulphonate) or PEDOT (poly-(3,4-ethylenedioxythiophene), by way of example. As will be appreciated, the first charge transport layer 46 may have one or more layers. In one variation, the first charge transport layer 46 may have a thickness of greater than or equal to about 10 nm to less than or equal to about 100 nm.

The second charge transport layer 48 may be formed of a material that can serve as a charge (e.g., an electron) transport layer or ETL. For example, the second charge transport layer 48 may be formed of 2-(4-biphenyl)-5-(4-t-butylphenyl)-1,3,4-oxadiazole) (PBD), tris(8-hydroxyquinoline aluminum ($Alq_3$), and/or 1,3,5-tris(N-phenylbenzimidizol-2-yl)benzene (TPBI). As will be appreciated, the second charge transport layer 48 may have one or more layers. In one variation, the second charge transport layer 48 may have a thickness of greater than or equal to about 10 nm to less than or equal to about 500 nm.

In certain variations, a thickness of the emissive assembly 32, including a combined thickness of all of the layers, including the emissive active layer 40, first charge transport layer 46, and/or second charge transport layer 48, is greater than or equal to 15 nm, optionally greater than or equal to about 20 nm, optionally greater than or equal to about 50 nm, optionally greater than or equal to about 100 nm, optionally greater than or equal to about 150 nm, optionally greater than or equal to about 200 nm. As will be appreciated by those of skill in the art, a thicker emissive assembly 32 can provide greater light output (e.g., generated photons) and intensity of light generated by the OLED 20 and thus may be desirable for enhanced performance. Moreover, in accordance with certain aspects of the present disclosure, it is not necessary to reduce a thickness of the emissive assembly 32 to reduce waveguide mode and SPP coupling.

In accordance with various aspects of the present disclosure, the OLED 20 may further include an ultrathin electrically conductive transparent metallic electrode 50 having a first polarity disposed between the substrate 30 and the emissive assembly 32, for example, adjacent to the first charge transporting layer 46 (e.g., hole transporting layer). In the OLED 20 shown, the electrode 50 serves as an anode that can generate electron holes in the adjacent first charge transporting layer 46. Incorporating the ultrathin electrically conductive transparent metallic electrode 50, especially as a substitute for a transparent conductive electrode like ITO or indium zinc oxide (IZO), into the OLED 20 has been found to surprisingly eliminate certain undesirable waveguide modes and to enhance a light emission efficiency of an OLED. In this manner, an external quantum efficiency (EQE) of an OLED prepared in accordance with certain aspects of the present disclosure may be greater than or equal to about 25%, optionally greater than or equal to about 30%, optionally greater than or equal to about 35%, optionally greater than or equal to about 40%, optionally greater than or equal to about 45%, and optionally greater than or equal to about 50%. A comparative OLED with a thick ITO electrode typically has an EQE of about 20% without any outcoupling structure. In certain variations, where the internal quantum efficiency (IQE) is assumed to be 100%, the EQE may range from greater than or equal to about 25% to less than or equal to about 75%, optionally from greater than or equal to about 30% to less than or equal to about 75%. In other variations, where the IQE is lower, for example, about 63%, the EQE may optionally greater than or equal to about 20% to less than or equal to about 50%.

In certain aspects, the present methods may increase an external quantum efficiency of the organic light emitting diode to the levels specified above, for example, to greater than or equal to about 30% by embedding light scattering elements into the transparent substrate. As the guided $T_E$ and $TM_1$ modes are eliminated, more internally generated light becomes "glass mode" or substrate mode, such that light scattering elements can be embedded in the substrate to help get the light out of the substrate. The light scattering elements may be index matched fluid, microlens, scatterer-embedded fluids, and the like.

In terms of OLED outcoupling perspective, the present disclosure is believed to provide the first demonstration of complete waveguide mode elimination for an OLED. Previously, where corrugation, grids, or buckling methods were used to minimize waveguide mode and thus minimize its generation, and decoupling. In the context of the present disclosure, decoupling of the waveguide mode is no longer of concern in view of the ability to entirely eliminate waveguide mode.

U.S. Pat. No. 10,475,548 entitled "Ultra-thin Doped Noble Metal Films for Optoelectronics and Photonics Applications," to Guo et al., the relevant portions of which are herein incorporated by reference, describes ultrathin continuous conductive metallic layers and methods of making them that can potentially serve as electrically conductive transparent metallic electrodes 50 in the present OLEDs 20.

Thin metal films, like those comprising silver (Ag), are widely used due to silver's excellent conductivity and low optical loss in the visible portion of the electromagnetic spectrum. Metal film-based transparent conductors need to be continuous, yet have a thickness well below the optical skin depth (for example, about 20 nm for Ag at 530 nm wavelength) to achieve high light transmission. However, as discussed in U.S. Pat. No. 10,475,548, thin silver films are difficult to obtain and mostly forms discontinuous film during or after the deposition. Therefore, a thin silver film is prone to grow in 3D island-like (Volmer-Weber) modes on oxide substrates, which leads to high electrical resistance and optical scattering loss. However, in accordance with the techniques described in U.S. Pat. No. 10,475,548, a film comprising silver that is thin or ultra-thin and smooth can be formed that has both low optical loss (high transparency) and low electrical resistance by the properly chosen seed material and optimized seed layer thickness.

In certain aspects, an electrically conductive thin film used as the ultrathin electrically conductive transparent metallic electrode 50 may comprise a conductive metal, such as silver (Ag), at greater than or equal to about 80 atomic % of the total film composition. As used herein, the terms "composition" and "material" are used interchangeably to refer broadly to a substance containing at least the preferred chemical compound(s), but which may also comprise additional substances or compounds, including impurities. The electrically conductive thin film optionally further comprises a conductive metal, distinct from the main conductive metal (e.g., Ag). In certain variations, the distinct electrically conductive metal may comprise copper (Cu), aluminum (Al), titanium (Ti), nickel (Ni), chromium (Cr), gold (Au), magnesium (Mg), tantalum (Ta), germanium (Ge), palladium (Pd), or combinations thereof. In certain preferred variations, the second conductive metal is copper (Cu), so that an alloy of silver (Ag) and copper (Cu) is formed. In certain preferred variations, the electrically conductive thin film is a multilayered structure, where the first layer comprises a conductive metal such as copper (Cu) and a second layer deposited over the first layer that may comprise silver (Ag). For example, deposited Cu has a lower root mean square (RMS) roughness than Al when used as a seed layer, and Cu forms better higher density of nucleation sites on glass substrate for Ag atoms, showing better performance of Cu—Ag over Al—Ag, as will be discussed further below. However, any strategy that can render a thin transparent metal film to be continuous and smooth is contemplated, for example, an alloy, a seed layer, or other strategies, such as a chemically assembled monolayer.

In alternative variations, other electrically conductive, smooth, thin films comprising highly conductive elements, such as gold (Au) or copper (Cu), which may be further alloyed with another conductive metal may be used. In certain variations, the electrically conductive films may comprise one of these alternative highly conductive elements at greater than or equal to about 80 atomic % of the total composition of the thin film, as well as a distinct second conductive metal present at greater than 0 atomic % to less than or equal to about 20 atomic % of the total composition of the thin film. In certain variations, the distinct second conductive metal may comprise aluminum (Al), titanium (Ti), nickel (Ni), chromium (Cr), gold (Au), magnesium (Mg), tantalum (Ta), germanium (Ge), Palladium (Pd), or combinations thereof. Thus, in alternative aspects, the discussion of the highly conductive silver compound may be understood to also apply to other highly conductive elements, like gold and copper, and the like.

Where the ultrathin electrically conductive transparent metallic electrode 50 comprises an alloy of a first conductive metal (e.g., silver) and a second conductive metal (e.g., copper) may be present at greater than 0 atomic % to less than or equal to about 20 atomic % of the total film composition, with a balance being the first conductive metal (e.g., silver). Inclusion of amounts of the second conductive metal, such as copper or aluminum, in excess of 20 atomic % may detrimentally diminish optical loss, electrical conductivity, and/or transparency of the silver-based film.

In certain variations, the second conductive metal is optionally present at greater than or equal to about 1 atomic % to less than or equal to about 20 atomic % of the total film composition, while the primary conductive metal, e.g., silver, may be present at greater than or equal to about 80 atomic % to less than or equal to about 99 atomic % of the total film composition. In certain variations, the second conductive metal is optionally present at greater than or equal to about 1 atomic % to less than or equal to about 15 atomic % of the total film composition, while the primary conductive metal, e.g., silver, may be present at greater than or equal to about 85 atomic % to less than or equal to about 99 atomic % of the total film composition. In other variations, the second conductive metal is optionally present at greater than or equal to about 2 atomic % and less than or equal to about 10 atomic % of the total film composition, while the primary conductive metal, e.g., silver, may be present at greater than or equal to about 90 atomic % to less than or equal to 98 atomic % of the total film composition.

In certain variations, the ultrathin electrically conductive transparent metallic electrode 50 may be formed of a multilayered conductive metal film, for example, a bilayer film that includes an underlying seed layer with a conductive metal deposited over the seed layer. The conductive metal may be any of those described above (including the alloys) described above, for example, first layer (e.g., seed layer) may comprise a conductive metal selected from a group consisting of: copper (Cu), titanium (Ti), nickel (Ni), chromium (Cr), gold (Au), magnesium (Mg), tantalum (Ta), germanium (Ge), Palladium (Pd), and combinations thereof. A second layer is deposited over the seed layer and may comprise a conductive metal selected from a group consisting of: silver (Ag), copper (Cu), gold (Au), platinum (Pt), and combinations thereof. In certain variations, the first layer may comprise copper (Cu), while the second layer may comprise silver (Ag) or alloys thereof.

In certain aspects, "ultrathin" film means that the film has a thickness of less than or equal to about 12 nm, optionally less than or equal to about 11 nm, optionally less than or equal to about 10 nm, optionally less than or equal to about 9 nm, optionally less than or equal to about 8 nm, optionally less than or equal to about 7 nm, optionally less than or equal to about 6 nm, optionally less than or equal to about 5 nm, optionally less than or equal to about 4 nm, and in certain aspects, optionally less than or equal to about 3 nm. In certain variations, the ultrathin film may have a thickness of greater than or equal to about 2 nm and less than or equal to about 12 nm; optionally greater than or equal to about 2 nm to less than or equal to about 10 nm. In certain variations, the ultrathin film has a thickness of greater than or equal to about 5 nm to less than or equal to about 10 nm.

In variations where the ultrathin electrically conductive transparent metallic electrode 50 may be formed of a multilayered conductive metal film, for example, a bilayer film that includes an underlying seed layer deposited directly on the substrate and having a conductive metal(s) deposited over the seed layer. The multilayered film will have an overall thickness that falls within the ranges discussed above for ultrathin thicknesses. The first layer (e.g., seed layer) may have a thickness of one monolayer (or the size of the thickness of one molecule to less than or equal to about 4 nm, for example, about greater than or equal to about 0.1 nm to less than or equal to about 3 nm, optionally greater than or equal to about 0.1 nm to less than or equal to about 2 nm, optionally greater than or equal to about 0.1 nm to less than or equal to 0.5 nm. In certain variations, the first layer comprises only copper (Cu), for example, consisting essentially of copper and any inevitable impurities. The second layer, for example, comprising silver (Ag) or alloys of silver may have a thickness of greater than or equal to about 2 nm to less than or equal to about 10 nm, or any of the other ranges discussed above. In certain variations, the first layer (e.g., seed layer) may consist essentially of copper (Cu) and any inevitable impurities. Likewise, the second layer may consist essentially of silver (Ag) any inevitable impurities.

In a bilayer system, a seed layer formed of copper performs better than aluminum in certain applications, for example, as discussed below in the context of FIGS. 6A-6F. For example, a seed layer comprising copper on a substrate provides the ability to have a much thinner overlying film comprising silver. Copper shows a much lower root mean square (RMS) roughness from AFM measurement than aluminum as a seed layer, and copper forms better quality/higher density of nucleation sites on glass substrates on which silver atoms can be deposited, thus showing better performance of Cu—Ag over Al—Ag.

In various aspects, the continuous electrically conductive thin films that form the ultrathin electrically conductive transparent metallic electrode 50 may have a smooth surface. By a "smooth" surface, it is meant that a root mean squared (RMS) of measured surface roughness (e.g., from peaks to valleys) is less than or equal to about 25% of the total film thickness, optionally less than or equal to about 20% of the total film thickness, optionally less than or equal to about 15% of the total film thickness, optionally less than or equal to about 14% of the total film thickness, optionally less than or equal to about 13% of the total film thickness, optionally less than or equal to about 12% of the total film thickness, optionally less than or equal to about 11% of the total film thickness, optionally less than or equal to about 10% of the total film thickness, optionally less than or equal to about 9% of the total film thickness, optionally less than or equal to about 8% of the total film thickness, optionally less than or equal to about 7% of the total film thickness, optionally less than or equal to about 6% of the total film thickness, and in certain variations, optionally less than or equal to about 5% of the total film thickness.

As appreciated by those of skill in the art, ascertaining smoothness of a film is relative and depends on an overall thickness of the film, where greater amounts of root mean squared (RMS) surface roughness can still considered to be smooth if a film is thicker. In certain variations, a smooth surface of the continuous electrically conductive thin film has a surface roughness of less than or equal to about 1 nm root mean squared (RMS), where an overall thickness of the film is at least about 10 nm. In other variations, a smooth surface has a surface roughness of less than or equal to about 0.5 nm root mean squared (RMS), where an overall thickness of the film is at least about 10 nm.

The electrically conductive thin films of the present disclosure that comprise Ag and a second electrically conductive metal, like Cu, and may have a sheet resistance of less than to about 50 Ohm/square, optionally less than or equal to about 40 Ohm/square, optionally less than or equal to about 30 Ohm/square, optionally less than or equal to about 25 Ohm/square, optionally less than or equal to about 20 Ohm/square, optionally less than or equal to about 15 Ohm/square, optionally less than or equal to about 10 Ohm/square, optionally less than or equal to about 5 Ohm/square, optionally less than or equal to about 4 Ohm/square, optionally less than or equal to about 3 Ohm/square, optionally less than or equal to about 2 Ohm/square, and optionally less than or equal to about 1 Ohm/square.

Conductive metallic films, such as silver-based films, with larger negative permittivity help enhance suppression of any waveguide mode formation in an OLED. In certain variations, silver-based films having permittivity from −30 to 2.25 can serve for modal elimination, where 2.25 is permittivity of glass substrate. Positive permittivity levels that are lower than that of glass substrate theoretically also works for modal elimination, because it can reduce effective index of waveguide mode to lower than that of the glass substrate.

The electrically conductive thin films forming the ultrathin electrically conductive transparent metallic electrode 50 are capable of transmitting select portions of the electromagnetic spectrum and thus are transparent. Transparency can be understood generally to mean that greater than or equal to about 70% of a predetermined target wavelength or range of wavelengths (which may be polarized or non-polarized) of light/energy pass through the electrically conductive thin film or other component. In certain variations, greater than or equal to about 75% of a target wavelength (or range of wavelengths) of light/energy passes through the component, optionally greater than or equal to about 80%, optionally greater than or equal to about 85%, optionally greater than or equal to about 90%, optionally greater than or equal to about 95%, optionally greater than or equal to about 97%, optionally greater than or equal to about 98%, and in certain variations, optionally greater than or equal to about 99% of target wavelength(s) pass through the electrically conductive thin films or other component.

In certain aspects, the continuous electrically conductive thin films may be flexible (e.g., capable of bending without mechanical failure).

The OLED 20 also includes a second electrode 60 having a second polarity opposite from the first polarity of the ultrathin electrically conductive transparent metallic electrode 50. The second electrode 60 is disposed adjacent to the second charge transporting layer 48. The second electrode may serve as a cathode and thus generate electrons in the adjacent second charge transporting layer 48 when voltage or current is applied. In certain variations, the second electrode 60 can be transparent, although in alternative aspects, the second electrode 60 may be semi-transparent or non-transparent. In both cases, waveguide modes can be removed by the present methods. In variations where the second electrode 60 is non-transparent, it may be formed of a conductive material, such as aluminum, silver, barium, calcium, and the like. Such an OLED design may provide single-sided light emission. In one variation, the second electrode 60 may have a thickness of greater than or equal to about 50 nm to less than or equal to about 200 nm. In other variations, the second electrode 60 is transparent, so that the OLED 20 is transparent and thus may achieve a much higher EQE. By way of example, the second electrode 60 may be formed of the same materials with the same properties as discussed in the context of the ultrathin electrically conductive transparent metallic electrode 50. Such a design provides a dual-side emitting OLED or transparent OLED that can be viewed from two opposite sides.

As shown in FIG. 1, when electrical potential is applied to the ultrathin electrically conductive transparent metallic electrode 50 and the second electrode 60, electromagnetic waves or light 70 can be generated internally within the emissive assembly 32. The internally generated light 70 can be directed towards a viewing surface 72 defined by the first electrode 50. As described above, by introducing the ultrathin electrically conductive transparent metallic electrode 50, one or more waveguide modes of the OLED 20 can be decoupled or minimized, such that a greater amount of the internally generated light 70 passes through the first electrode 50 and out of the viewing surface 72 of the OLED 20 to generate emitted light waves 74. As noted above, the emitted light waves 74 from the OLED 20 may be in the visible light range and thus have wavelengths ranging from about 390 to about 750 nm. In the visible range of electromagnetic radiation, wavelengths in a range of about 625 nm to 740 nm are red; orange is at about 590 nm to about 625 nm; yellow is at about 565 nm to about 590 nm; green is at about 520 nm to about 565 nm; blue or cyan is at about 500 nm to about 520 nm; blue or indigo is at about 435 nm to about 500 nm; and violet is at about 380 nm to about 435 nm. Notably, as used herein, blue may encompass blue/cyan, blue/indigo, and violet. White light is generally a blend of all the colors in the visible light range. The emitted light waves 74 from the OLED 20 may display any of these colors, by way of example.

The direction of propagation of transverse electric modes (TE) and transverse magnetic modes (TM) in the OLED 20 is shown in FIG. 1. The integers following the transverse electric mode (TE) and transverse magnetic mode (TM) indicate the wave modes within the waveguide. Light generated at the emissive active layer 40 excites the two propagating waveguide modes (TE and TM modes), with electric field parallel and perpendicular to the stacks for TE and TM modes, respectively. Vertically propagating light 70 is directed towards the substrate 30 and/or reflected from the top second electrode (e.g., cathode) 60 towards substrate 30. Propagating light 70 thus passes through the ultrathin electrically conductive transparent metallic electrode 50, substrate 30, and air 68 will escape OLED to generate emitted light waves 74 that is visible to observers. Thus, in certain aspects, the waveguide mode that is eliminated or reduced may be selected from the group consisting of: transverse electric ($TE_0$) mode, transverse magnetic ($TM_0$) mode, transverse magnetic ($TM_1$) mode, and combinations thereof. In certain variations, the methods include eliminating at least one waveguide mode selected from the group consisting of: transverse electric ($TE_0$) mode, transverse magnetic ($TM_0$) mode, transverse magnetic ($TM_1$) mode, and combinations thereof. In certain variations, the eliminated waveguide modes are at least the transverse electric ($TE_0$) and transverse magnetic ($TM_1$) modes. As shown in FIG. 1, the presence of these waveguide modes would otherwise cause the emission of light from sides 78 of the OLED 20 rather than from the desired viewing surface 72. In one example, in a conventional OLED, greater than about 16% of the generated light may be conserved by eliminating one or more waveguide modes, and this light portion is mainly distributed to air and substrate modes in Cu—Ag OLEDs.

As shown in FIG. 1, a viewing angle 76 with respect to the viewing surface 72 is 90°, but may vary based on the position of observation to be anywhere from greater than 0° to less than 180° (e.g., ±90°). In certain aspects, the OLED 20 exhibits minimal angle dependence at the viewing surface 72, which corresponds to the emitted waves (also referred to as output) 74 having a range of wavelengths that varies less than or equal to about 80 nm; optionally less than or equal to 70 nm; optionally less than or equal to 60 nm when comparing a difference between a first wavelength at an incidence or viewing angle of 0° as compared to a second wavelength at an incidence angle of 60°. Minimal deviation of a reflected output can be expressed as minimal angle dependence. In certain variations, the OLED 20 has minimal angle dependence and is capable of generating an emitted output having a predetermined range of wavelengths (e.g., has a wavelength shift) that deviates less than or equal to 50 nm when the OLED 20 is observed from incidence angles ranging from 0 to 60°; optionally less than or equal to about 45 nm; optionally less than or equal to 40 nm; optionally less than or equal to 35 nm; optionally less than or equal to 30 nm; based on a range of incidence potential angles (when comparing a difference between a first wavelength of interest observed at an incidence angle of 0° as compared to a second wavelength observed at an incidence or viewing angle of 60°).

The methods of the present disclosure provide a way to eliminate undesired waveguide modes and thus increase outcoupling efficiency of OLEDs by introducing an ultrathin electrically conductive metal (e.g., silver-based) film as an anode. In certain variations, select undesired waveguide modes can be entirely eliminated. The modal analysis described below shows the OLED structure with improved light efficiency can be easily designed to below the cutoff thickness of waveguide modes in the visible band by using ultrathin silver-based electrodes. This simple, yet effective method for suppressing waveguide modes formation provides cost-effective high efficiency OLEDs in future displays and in the lighting industry.

In one variation, an ultrathin uniform silver-based film is used as a transparent conductive electrode and formed at a thickness of about 5 nm Ag deposited on 0.5 nm copper (Cu) as a bilayer. The first layer comprising copper may have a thickness of about 0.5 nm, while thicknesses of the silver may vary from 5 nm or greater, so that an overall copper ratio in the bilayer film will be 10% or less depending on the overall thickness.

The copper may be considered to form a seed layer. The Ag—Cu film demonstrates maximum performance as a transparent anode for OLEDs, when its electrical and optical properties are analyzed. The Maxwell's equations of one-dimensional (1D) waveguide structures are solved, and it is found that complete elimination of the waveguide mode can be achieved by incorporating such a thin metal film in an OLED, but elimination of these waveguide modes cannot be achieved with any transparent conductors (TCs) that involve dielectric materials with high refractive index, such as ITO. The disappearance of the guided mode in an organic waveguide is experimentally verified by comparing intensities of light propagating in the waveguide with and without the silver (Ag) film, where refractive index matched fluid and prism are used to remove the substrate mode out of the entire system, leaving the waveguide mode only. This effect of the waveguide mode elimination leads to enhanced EQE of OLEDs fabricated on the ultrathin transparent Ag-based electrode films, as compared to the ITO counterpart transparent electrode.

The methods of the present disclosure thus provide a new solution to decouple waveguide mode and achieve high performance OLEDs by harnessing the benefits of an ultrathin metal film, which cannot be fulfilled by conventional waveguide mode outcouplers. This solution is not only simple in process, but also can achieve high throughput with excellent compatibility with existing OLED manufacturing processes.

The present disclosure also contemplates an organic light emitting diode (OLED) device comprising a transparent substrate, an ultrathin electrically conductive transparent metallic electrode, and an emissive active layer defining a first side and a second opposite side. The OLED device includes a first charge transport layer disposed on the first side between the emissive active layer and the ultrathin electrically conductive transparent metallic electrode and a second charge transport layer disposed on the second side of the emissive active layer. A second electrode is also provided having a second polarity opposite to the first polarity disposed adjacent to the second charge transport layer. The OLED is thus free of a transverse electric ($TE_0$) waveguide mode and has an external quantum efficiency of the organic light emitting diode to greater than or equal to about 30%. In certain variations, the OLED is also free of a transverse magnetic ($TM_1$) mode waveguide mode. In one aspect, the EQE of the OLED is greater than or equal to about 40%.

The ultrathin electrically conductive transparent metallic electrode may be any of those described previously above, including those that comprise silver (Ag) or silver (Ag) doped with copper (Cu). In certain variations, a first layer comprises copper (Cu) and a second layer comprises silver (Ag) disposed over the first layer. In one variation, the second layer of the ultrathin electrically conductive transparent metallic electrode further comprises a metal selected from the group consisting of: copper (Cu), titanium (Ti), nickel (Ni), chromium (Cr), gold (Au), magnesium (Mg), tantalum (Ta), germanium (Ge), palladium (Pd), and combinations thereof. In certain variations, the first layer of the ultrathin electrically conductive transparent metallic electrode consists essentially of copper (Cu) and the second layer consists essentially of silver (Ag).

The organic light emitting diode may be free of indium tin oxide (ITO).

In one variation, the ultrathin electrically conductive transparent metallic electrode has a thickness of less than or equal to about 12 nm, for example, a thickness may be greater than or equal to about 2 nm to less than or equal to about 10 nm. In one aspect, a combined thickness of the emissive active layer, the first charge transport layer, and the second charge transport layer is greater than or equal to 100 nm.

In another variation, the ultrathin electrically conductive transparent metallic electrode has a transparency of greater than or equal to about 60% for a portion of an electromagnetic spectrum having a range of predetermined wavelengths and the portion of the electromagnetic spectrum having the range of predetermined wavelengths emitted from the organic light emitting diode displays minimal angle dependence, for example, the first range of predetermined wavelengths varies less than or equal to about 80 nm at an incidence angle ranging from about 0° to about 60° with respect to the organic light emitting diode.

In another variation, the ultrathin electrically conductive transparent metallic electrode has a transparency of greater than or equal to about 60% for a portion of an electromagnetic spectrum having a range of predetermined wavelengths. In one aspect, the ultrathin electrically conductive transparent metallic electrode is adjacent to at least one dielectric layer and forms part of an assembly having an electrode design selected from the group consisting of: dielectric-metal (DM), metal-dielectric (MD), and dielectric-metal-dielectric (DMD), which may include the exemplary dielectric materials discussed herein.

In certain other variations, an OLED may be provided that includes one or more anti-reflection layers associated with the ultrathin electrically conductive transparent metallic electrode. Such materials may be considered to be charge transport layers, for example, hole transport layers (HTL), hole injection layers (HIL), electron transport layer (ETL), or electron injection layers (EIL). Any dielectric layer which can act as hole-transporting layer (HTL) can be selected for an anti-reflection layer. Suitable materials for an HTL can be Molybdenum (VI) Oxide (MoO$_3$), Dipyrazino[2,3f:2',3'-h]quinoxaline-2,3,6,7,10,11-hexacarbonitrile (HATCN), Di-[4-(N,N-di-p-tolyl-amino)-phenyl]cyclohexane (TAPC), 4,4'-Bis(carbazol-9-yl)biphenyl (CBP), 3,3'-di(9H-carbazol-9-yl)biphenyl (mCBP), 1,3-Bis(carbazol-9-yl)benzene (mCP), 4,4',4''-Tris(carbazol-9-yl)triphenylamine (TCTA), (CzSi), and N,N'-Di(1-naphthyl)-N,N'-diphenyl-(1,1'-biphenyl)-4,4'-diamine (NPD). Suitable material for ETL is 1,3,5-Tris(1-phenyl-1Hbenzimidazol-2-yl)benzene (TPBi), 9,9'-Diphenyl-6-(9-phenyl-9H-carbazol-3-yl)-9H,9'H-3,3'-bicarbazole (Tris-PCz), 2,4,6-tri(biphenyl-3-yl)-1,3,5-triazine (T2T), 3,3'-di(9H-carbazol-9-yl)biphenyl (mCBP), 4,6-Bis(3,5-di(pyridin-3-yl)phenyl)-2-methylpyrimidine (B3PyMPM), Bis[2-(diphenylphosphino)phenyl]ether oxide (DPEPO), 2,7-Di(2,2'-bipyridin-5-yl)triphenylene (BPy-TP$_2$), 3,3',5,5'-Tetra[(m-pyridyl)-phen-3-yl]biphenyl (BP4mPy), 4,7-Diphenyl-1,10-phenanthroline (BPhen), 2,9-Dimethyl-4,7-diphenyl-1,10-phenanthroline (BCP), Bis(2-methyl-8-quinolinolate)-4-(phenylphenolato) aluminium (BAlq), Tris-(8-hydroxyquinoline)aluminum (Alq$_3$), TiO$_2$, and ZnO. For efficient index matching condition, it is suitable for this layer to have a refractive index ranging from greater than or equal to about 1.55 to less than or equal to about 2.0, with a thickness ranging from greater than or equal to about 20 nm to less than or equal to about 80 nm.

In various aspects, the organic light emitting diode device is free of indium tin oxide (ITO) to maximize the EQE and amount of light generated at the viewing surface. However, in alternative variations, there may be relatively thin layers of ITO included in an OLED, for example, as a dielectric material to form dielectric-metal or metal-dielectric or dielectric-metal-dielectric anode assemblies used in combination with the ultrathin electrically conductive transparent metallic electrode. For example, an upper dielectric layer may have a thickness of greater than or equal to about 0 nm to less than or equal to about 80 nm, optionally greater than or equal to about 10 nm to less than or equal to about 80 nm, while a lower dielectric layer may have a thickness of greater than or equal to about 0 nm to less than or equal to about 80 nm, optionally greater than or equal to about 10 nm to less than or equal to about 80 nm. For both bottom and top dielectric layers, a refractive index may range from greater than or equal to about 1.45 to less than or equal to about 2.3. However, in certain variations, designs where both the upper dielectric layer and lower dielectric layers are ITO and have a thickness of 80 nm should be avoided, because it can increase waveguide mode confinement. Thus, in certain variations, the ultrathin electrically conductive transparent metallic electrode may be adjacent to at least one dielectric layer and forms part of an assembly having an electrode design selected from the group consisting of: dielectric-metal (DM), metal-dielectric (MD), and dielectric-metal-dielectric (DMD). The dielectric material may include metal oxides, like indium tin oxide (ITO), indium zinc oxide (IZO), aluminum zinc oxide (AZO), indium gallium zinc oxide (IGZO), Ta$_2$O$_5$, ZnO, TiO$_2$, TeO$_2$, WO$_3$, HfO$_2$, Al$_2$O$_3$, SiO$_2$, VO$_2$, V$_2$O$_5$, GeO$_2$, SiO, ZrO$_2$, Y$_2$O$_3$, Yb$_2$O$_3$, MoO$_3$, or other dielectric materials, like Si$_3$N$_4$, MgF$_2$, AlN, ZnSe, ZnS, ZnTe, or wide bandgap semiconductors (e.g., GaN when used in the visible range) and combinations thereof.

In yet other variations, the present disclosure relates to an organic light emitting diode device that emits from the top of the structure, rather than the bottom as shown in FIG. 1. The OLED device may comprise a substrate and a first electrode. The substrate and/or the first electrode may be non-transparent (e.g., reflective). In certain variations, the substrate may be glass, while the first electrode may be a non-transparent metal. An emissive active layer defines a first side and a second opposite side. A first charge transport layer may be disposed on the first side between the emissive active layer and the first electrode. A second charge transport layer is disposed on the second side of the emissive active layer. A second electrode having a second polarity opposite to the first polarity is disposed adjacent to the second charge transport layer. The first electrode may serve as a cathode, and may comprise an appropriate metal, such as aluminum, while the second electrode may be an ultrathin electrically conductive transparent metallic electrode, as discussed above, that serves as an anode. In this manner, the organic light emitting diode device is free of a transverse electric (TE$_0$) waveguide mode or other modes described above and has an external quantum efficiency of the organic light emitting diode to greater than or equal to about 30%.

Examples

Transparent Conductive (TC) Film Deposition and Characterization.

Materials used in this example were deposited by evaporator from Angstrom Engineering (Evovac Evaporator, for Ge/Al) or sputter deposition tool from Kurt J. Lesker Company (Lab 18, PVD-75, for Cu/Ag/ITO). Cu—Ag and ITO films were deposited at deposition rates that give the highest transmittance and lowest resistivity (Cu/Ge/Al, Ag, and ITO deposition rate of 0.5, 3, and 1.7 Å/s, respectively). All the films were deposited using DC magnetron sputtering. Film thickness, optical constants, and transmission spectra were measured using spectroscopic ellipsometry method using J. A. Woollam Inc. (M-2000). The transmittance used in this example was the absolute transmission of the film including the substrate (not normalized over the substrate). The reflection spectra were obtained by thin-film measurement instrument from Filmetrics (F20). Surface characterization was measured using atomic force microscopy using Bruker ICON AFM under tapping mode. Electrical sheet resistance was calculated using four-point probe method (FPP-5000, Miller Design & Equipment). Each sheet resistance was the average of three individual samples, with five independent measurements for each sample. 1.1 mm glass substrate (Purchased from Luminescence Technology Corporation) was used for Cu—Ag or bare Ag films.

OLEDs Fabrication and Characteristics.

Commercial ITO-coated glass substrate was purchased from Zhuhai Kaivo Optoelectronic Technology Co., Ltd. and used for the reference sample in this example. All organic semiconductors used in this example and a bare glass substrate (for Cu—Ag OLEDs) were purchased from Luminescence Technology Corporation. Bare glass and ITO-coated glass substrates were pre-cleaned with acetone and isopropanol under sonication for 10 min before fabrication. Organic molecules were thermally evaporated as-received without additional purification and deposited at rates of 0.2-1.0 Å/s under a base pressure less than 1×10$^{-6}$ mbar. Cu—Ag anode was sputtered at DC power of 100 W under sputtering pressure of 3 mTorr in the tool (Lab 18, PVD-75). Argon was used to strike plasma and the base pressure of chamber was less than 1×10$^{-6}$ Torr. Top Al was purchased from Kurt J. Lesker Company and thermally evaporated with shadow mask to define device area of 1 mm$^2$. Hewlett-Packard HP4156A parameter analyzer and Si photodiode FDS1010-CAL from Thorlabs were used to measure current, voltage, and photocurrent of the OLEDs. Spectra of the OLEDs were measured using Ocean Optics HR4000CG- UV-NIR spectrometer. Device EQEs and spectra were all measured in air without encapsulation.

Experimental Setup and Characterization of Modal Elimination.

The fused silica substrate was purchased from University Wafer, Inc. and used to measure waveguide mode elimination. Fused silica substrates were pre-cleaned with acetone and isopropanol under sonication for 10 min. The samples were moved to thermal evaporator after the anode depositions in sputter (Lab 18, PVD-75). Kapton™ tape was used to define a line shape of waveguide, and the tape was removed before the measurement. 0.5 mm silicon pieces were used as holders. Index matched fluid (IMF) matched to refractive index of fused silica was used to extract substrate mode and thus measure the amount of energy confined in the waveguide, and a prism made of fused silica was used to completely remove the extracted substrate mode out of the system. IMF and fused silica were purchased from Cargille Laboratories and Thorlabs, respectively. An excitation laser source operating at 405 nm was purchased from Thorlabs and intensity range from 0.68 to 11.8 mW/cm² was used to excite the waveguide modes. Color filters purchased from Thorlabs were used to observe the waveguide modes. All the measurements were done in air without encapsulation.

Example 1

The seed layer effect on Ag film growth was first investigated. An important aspect of forming a continuous metallic transparent conductive electrode (a metal film-based TC) lies in controlling its thickness well below the optical skin depth (approximately 20 nm for Ag at 530 nm) to achieve high light transmission. As discussed above, Ag has high electrical conductivity and low optical loss at visible wavelength. However, a thin Ag film is prone to grow in 3D island-like (Volmer-Weber) modes on oxide substrates leading to high electrical resistance and optical scattering loss. Inorganic seed-layers like germanium (Ge), copper (Cu), and aluminum (Al) can be effective in promoting wetting of Ag and suppressing island-like growth, thereby enabling ultrathin smooth film with low optical loss. Ge, Cu, and Al seed layers were compared based on film roughness, binding strength energy, electrical resistivity, and transmittance of Ag films on these layers, yielding the best performance with the Cu seed layer with stability. Table 1 shows properties of such seed layer materials.

TABLE 1

Seed Layer Selection Criteria

| Nucleation layer | Binding strength energy [kJ/mol] —O | Binding strength energy [kJ/mol] —Ag | Activation energy of Ag diffusion $E_{diff}$ [eV] |
|---|---|---|---|
| Al | 512 | 184 | 1.21 |
| Ge | 657 | 175 | 0.45 |
| Cu | 343 | 172 | 0.76 |
| Ag | 213 | 163 | 0.18 (0.32 on $SiO_2$) |

Figure 6A:
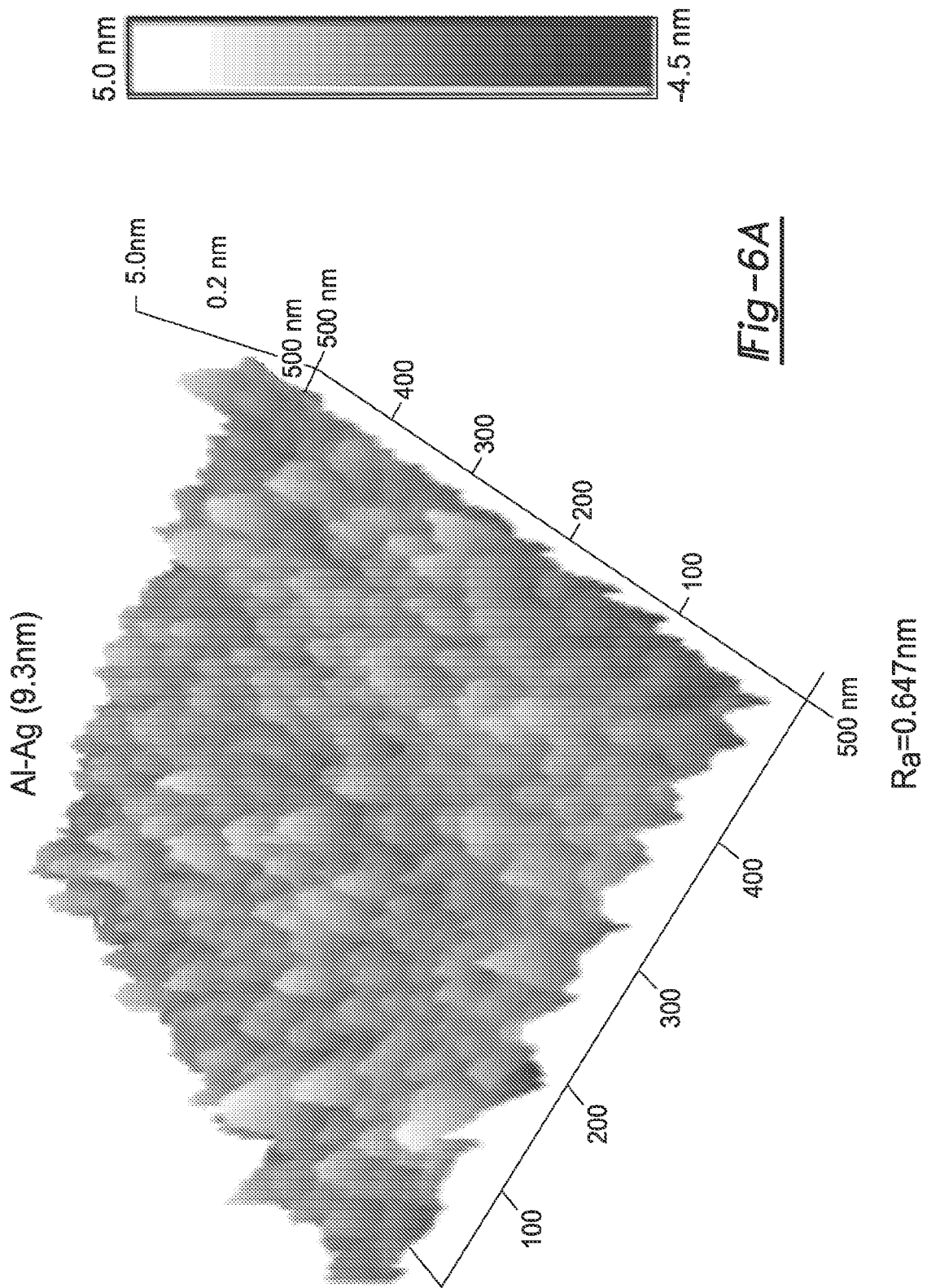
Figure 6B:
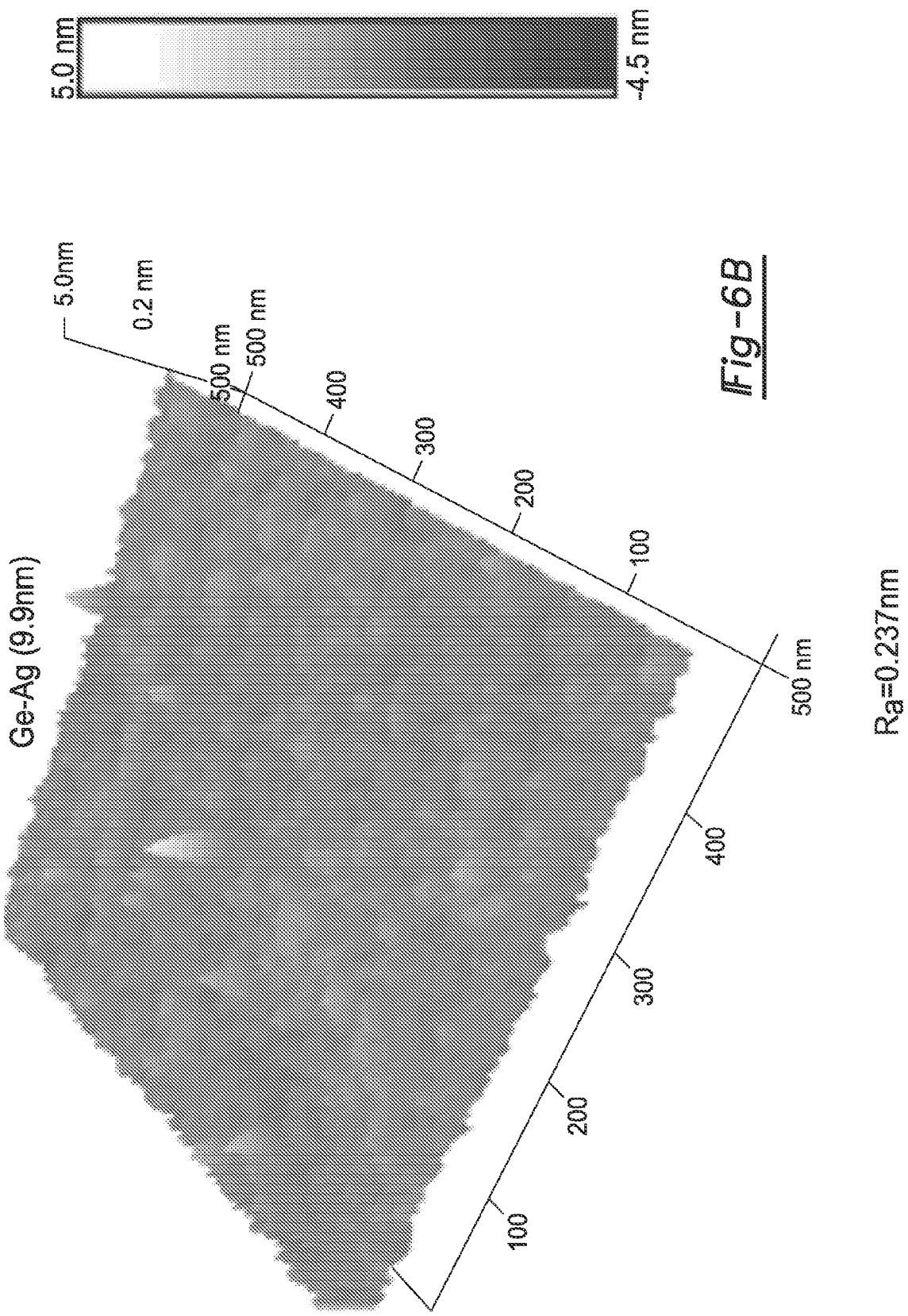
Figure 6C:
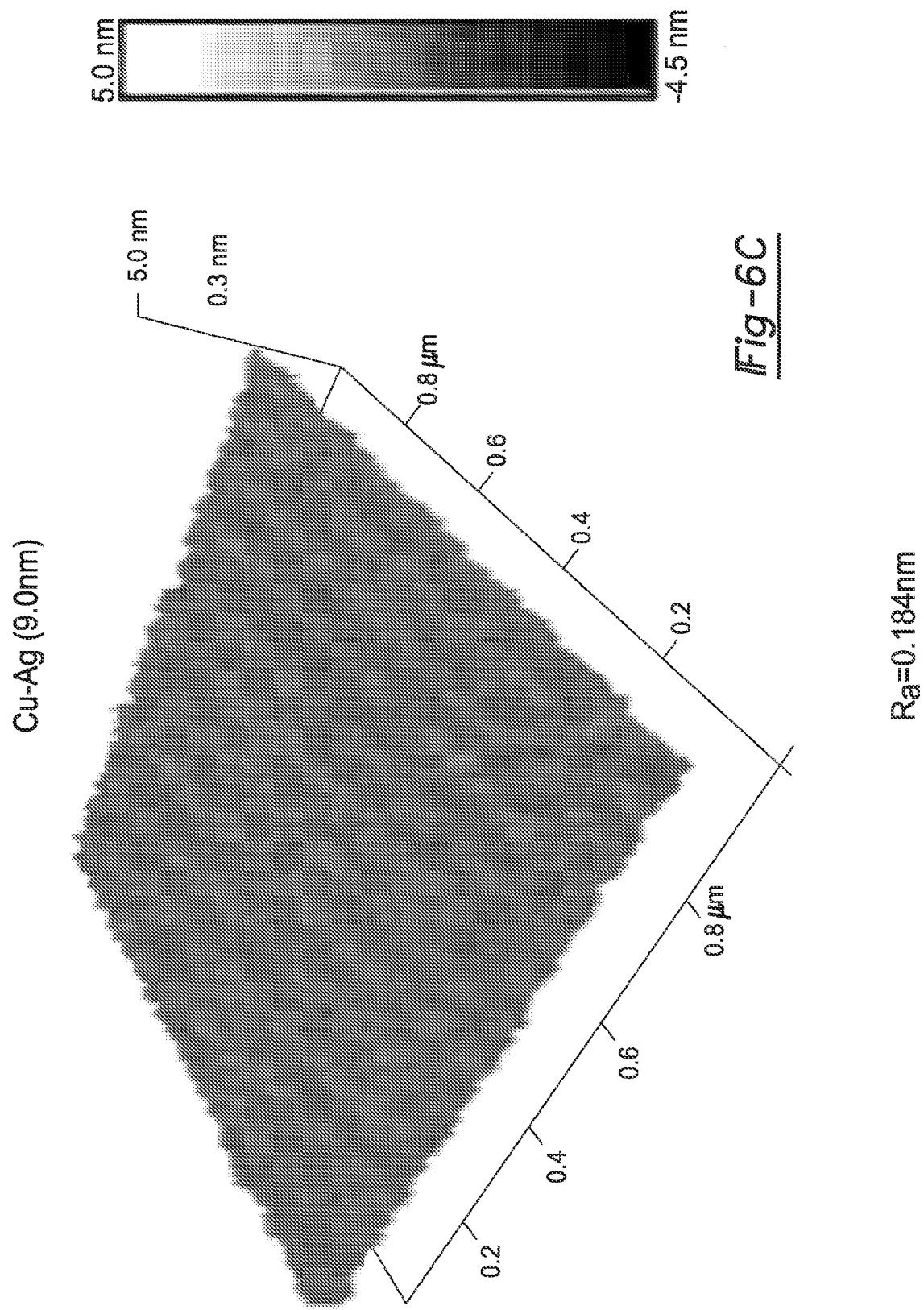
Figure 6D:
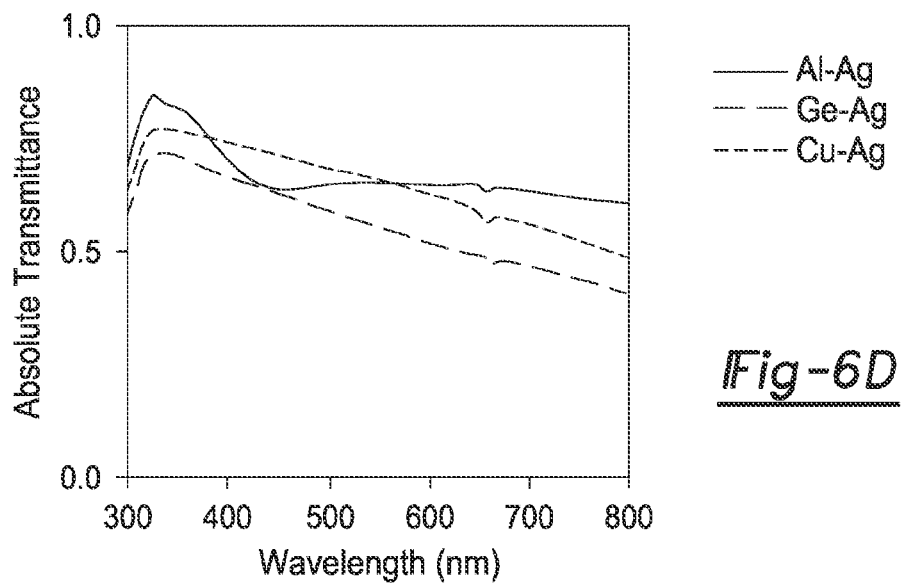
Figure 6E:
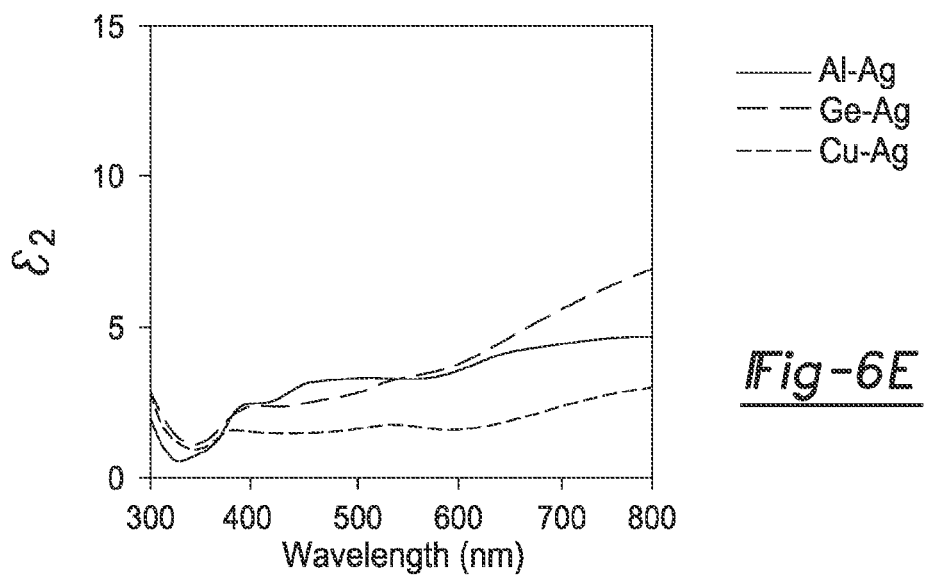
Figure 6F:
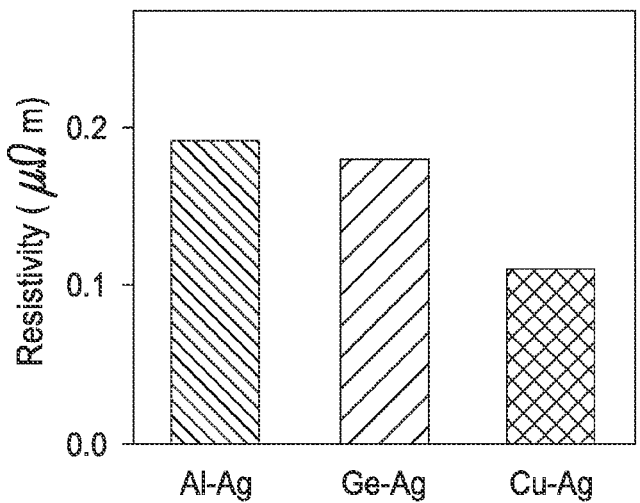

FIGS. 6A-6C show the root-mean square values of surface roughness for each bilayer system. Cu—Ag has the smallest surface roughness due to high density of nucleation site for Ag atoms. It means that an Ag film can be more uniformly deposited on Cu atoms and has higher potential for better Ag film performances compared to other seed types. This is shown in the transmittance over visible wavelength as shown in FIG. 6D. Unlike Al—Ag showing resonance behavior indicative of a discontinuous film, Ge—Ag and Cu—Ag have monotonous behavior with wavelength. As Ge has large optical loss, Ge—Ag film shows lower transmittance compared to that of Cu—Ag film and Cu—Ag shows higher transmittance than Ge—Ag over the entire wavelength region with lower sheet resistance.

Figure 7A:
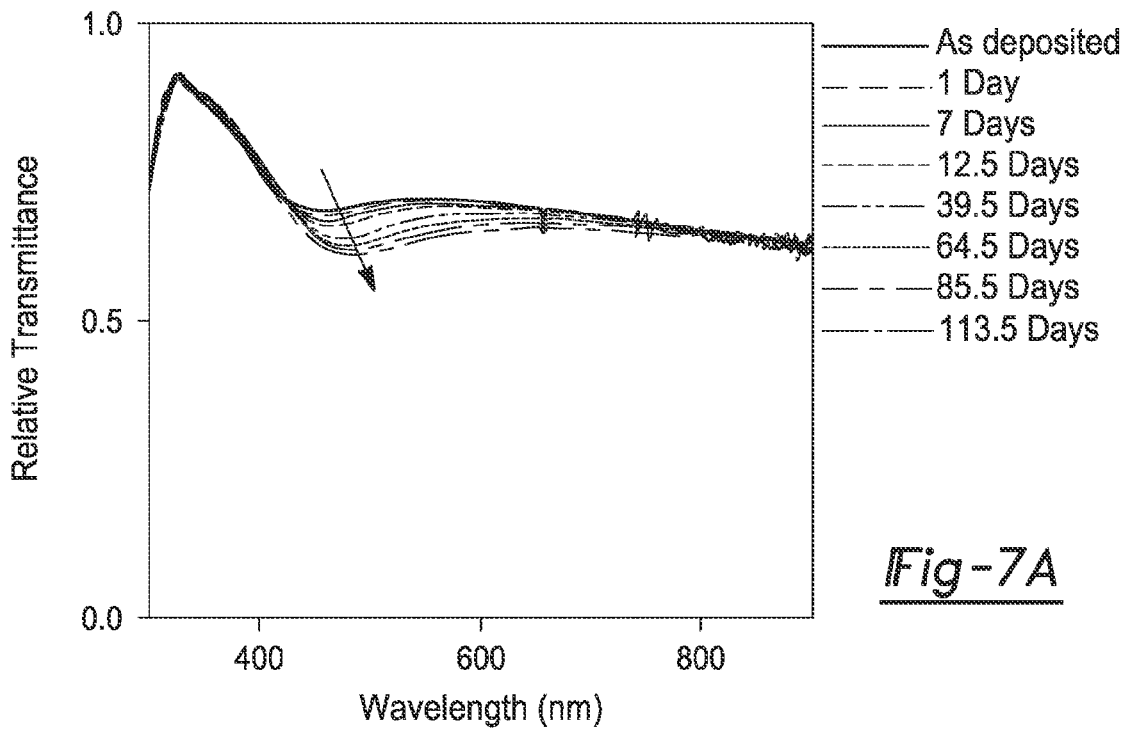
Figure 7B:
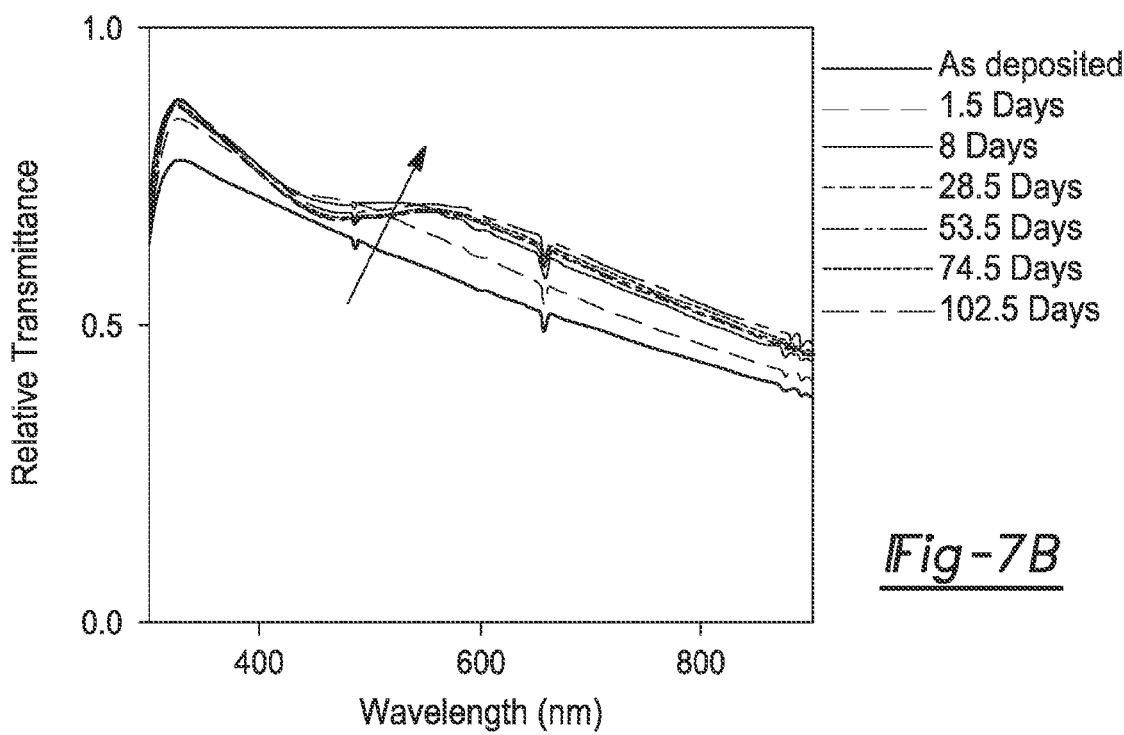
Figure 7C:
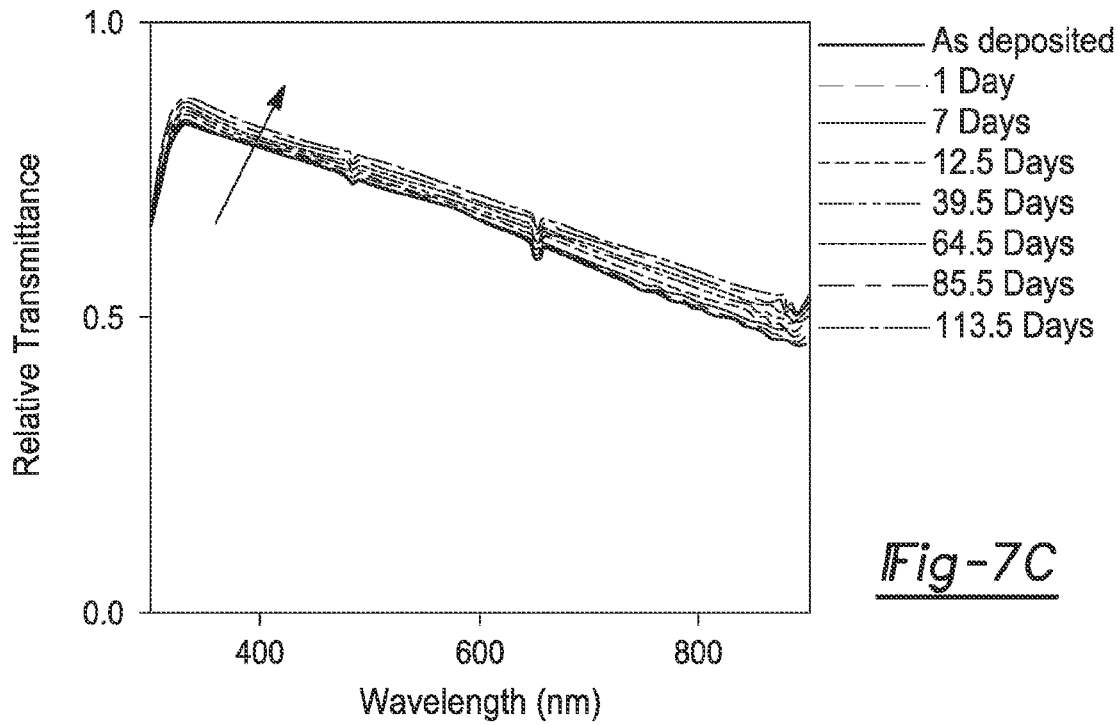
Figure 7D:
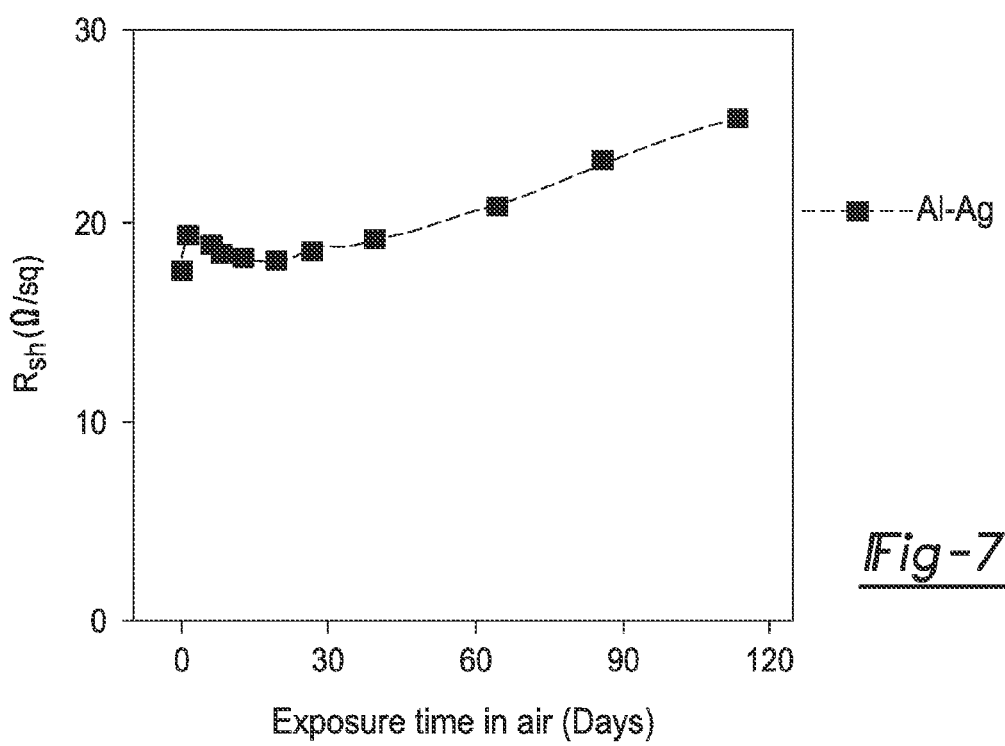
Figure 7E:
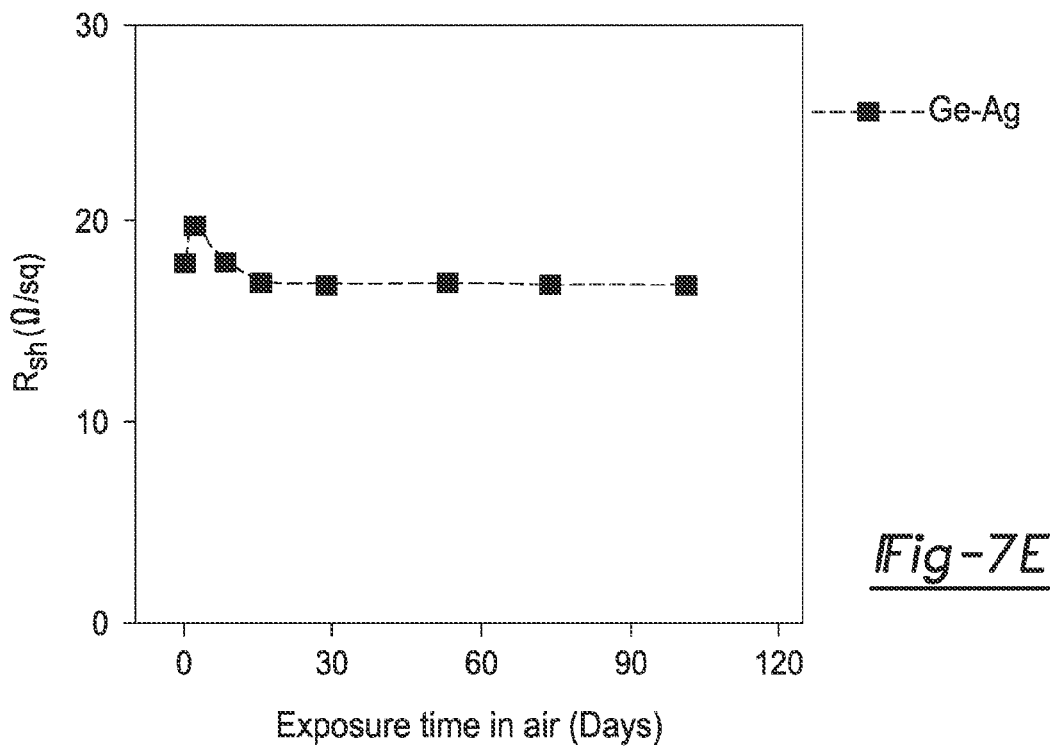
Figure 7F:
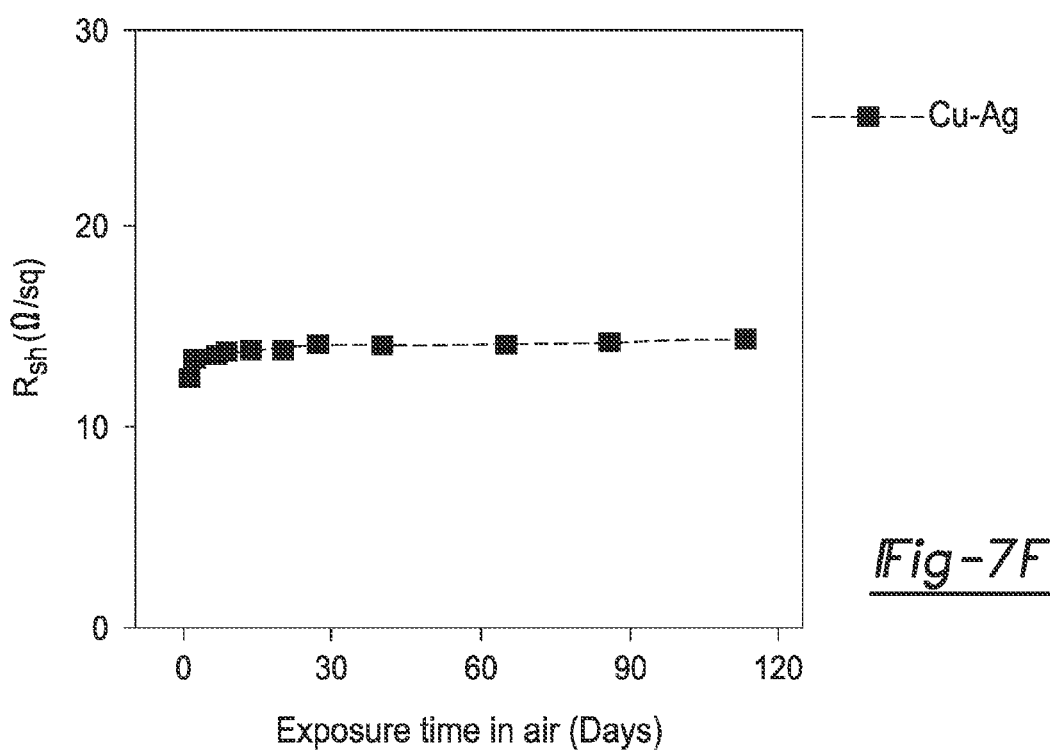

FIGS. 7A-7F assess seed layer stability. The film has bilayers formed with a seed layer followed by a second layer which is an 8 nm of Ag film. The first layer which is a seed layer has a thickness of 0.5 nm and comprises Al, Ge, or Cu layer. FIGS. 7A-7C show relative transmittance versus wavelength at various times, including in FIGS. 7A and 7C, as deposited, at 1 day, 7 days, 12.5 days, 39.5 days, 64.5 days, 85.5 days, 113.5 days, while FIG. 7B shows testing as deposited, at 1.5 days, 8 days, 28.5 days, 53.5 days, 74.5 days, and 102.5 days. FIG. 7D shows a sheet resistance versus exposure time in air for an aluminum-doped silver film, FIG. 7E shows a sheet resistance versus exposure time in air for a germanium-doped silver film, and FIG. 7F shows a sheet resistance versus exposure time in air for a copper-doped silver film. The Cu—Ag does not show any noticeable changes with time, whereas Al—Ag and Ge—Ag change significantly. Sheet resistance also does not change in Cu—Ag film, whereas Al—Ag shows rapid increases with time. Cu—Ag films shows lowest sheet resistance and least performance change with time.

Figure 2A:
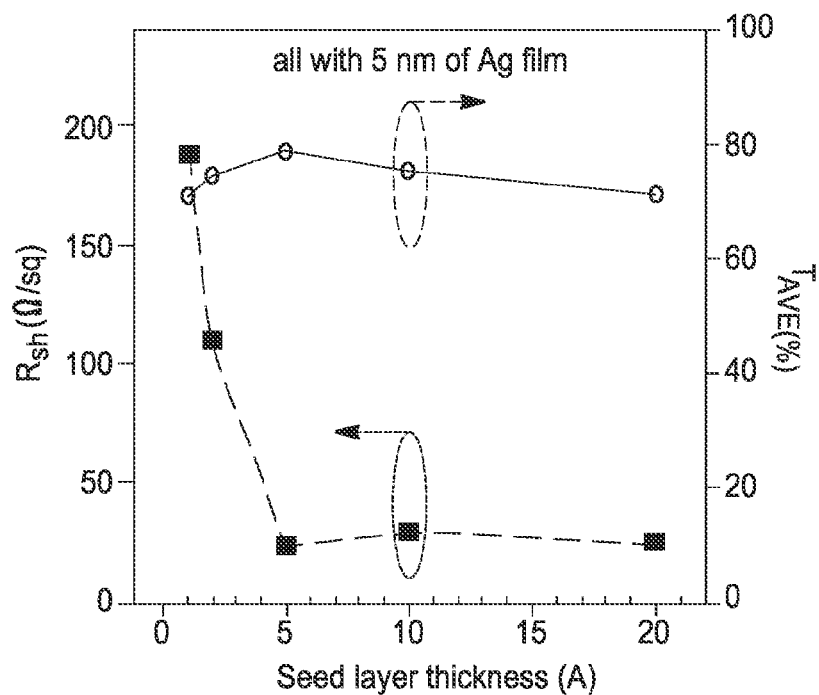

Abbott et al., ACS Appl. Mater. Interfaces 11, pp. 7607-7614 (2019), the relevant portions of which are incorporated herein by reference, showed that thickness of a seed layer has significant impact on growth of a film with poor wetting properties and demonstrated superiority of sub-nanometer seed layer. Here, an optimum thickness of the Cu seed layer was thoroughly investigated by varying its thickness from 1 to 20 Å, followed by the subsequent deposition of 5 nm thick Ag film. Sheet resistance ($R_{Sh}$) and average absolute transmittance ($T_{AVE}$) with light in the visible spectrum (380-780 nm wavelength (λ)) of Cu—Ag film are shown in FIGS. 2A-2E. With reference to FIG. 2A, $R_{Sh}$ of the Ag film increases for the case with Cu thickness below 5 Å. This is due to the insufficient surface coverage of Cu atoms over the substrate that form low density nucleation sites for Ag atoms. These sparse nucleation sites can lead to formation of Ag clusters on the substrate instead of a continuous and smooth film. For an extremely thin seed layer of 1 Å, the average $R_{Sh}$ and root-mean-square surface roughness increased up to 188 Ω/sq and 0.5 nm, respectively due to the non-continuous nature of the deposited film. At a Cu thickness of 5 Å or greater, a sufficiently high density of nucleation sites are formed, preventing Ag from interacting with the oxide substrate and allowing formation of a continuous and smooth Ag film even at a thickness as low as 5 nm where $R_{Sh}$ reaches a plateau at 20 Ω/sq.

As Cu is optically lossy at visible wavelength, $T_{AVE}$ decreases with increasing the seed layer thickness of greater than 5 Å. However, $T_{AVE}$ at the seed layer with a thickness of less than about 5 Å also decreases with reducing the seed thickness, because of the Ag island formation mentioned above from the insufficient Cu coverage. This discontinuous Ag film shows quasi-particle like behavior and excites localized surface plasmons, reducing transmittance and thereby reaching a maximum $T_{AVE}$ at 5 Å. The electrical and optical characterizations of the Ag films show that 5 Å Cu seed-layer thus show this thin film is suitable for use as a transparent conductor in this example.

Figure 8A:
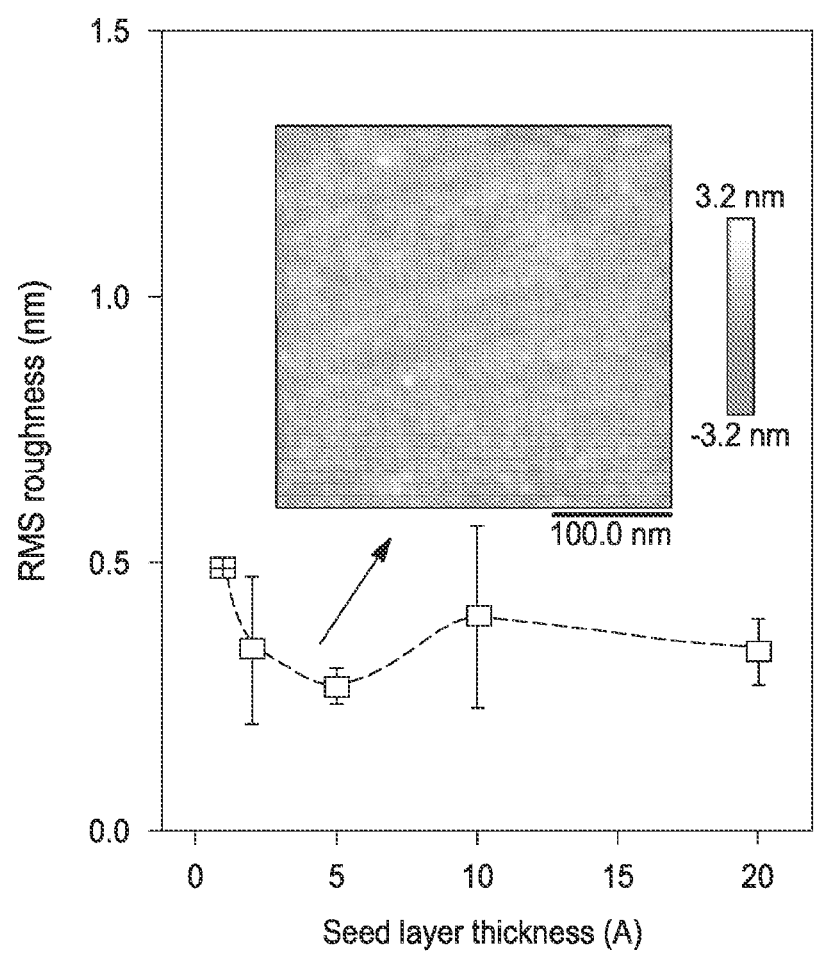
Figure 8B:
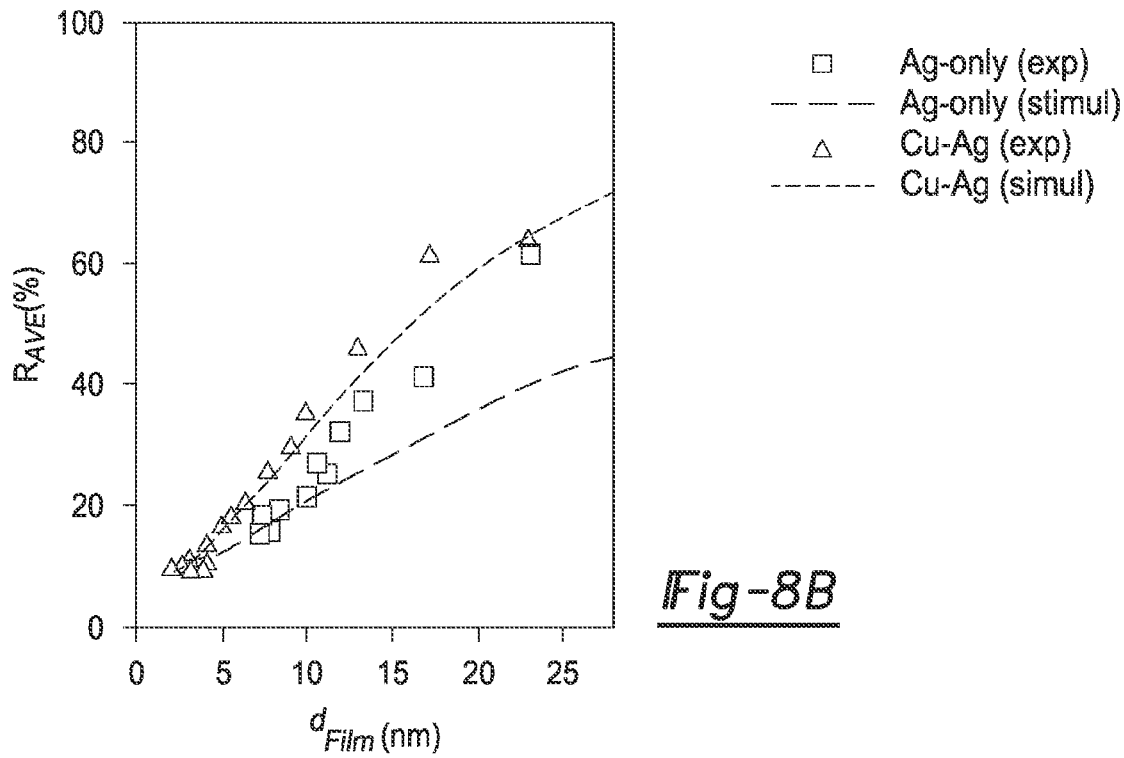
Figure 8C:
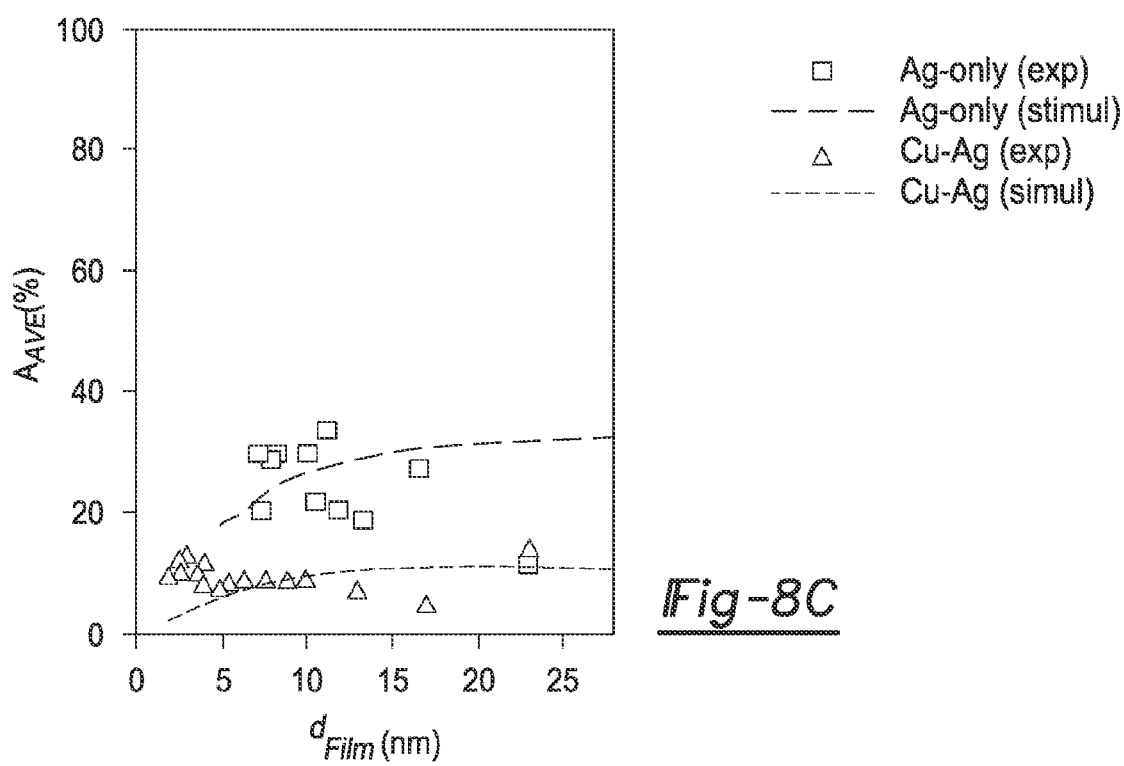

FIGS. 8A-8C show characteristics of 5 nm thick Ag film deposited on 0.5 nm of Cu seed layer. FIG. 8A shows a rough mean squared (RMS) surface roughness versus seed layer thickness for a Cu—Ag film. A 5 nm Ag film was deposited on a Cu seed layer, where the seed layer thickness was varied to find the optimum thickness. FIG. 8B shows a reflectance (RAVE) versus film thickness for a silver film (simulated and experimental) and a copper-silver bilayer (simulated and experimental), while FIG. 8C shows absorbance ($A_{AVE}$) versus film thickness for a silver film (simulated and experimental) and a copper-silver bilayer (simulated and experimental). Root-mean square (RMS) roughness changes with seed layer thickness, and 0.5 nm seed layer shows the smallest roughness. Reflectance and absorptance show lowest values at $d_{Film}$=5 nm Ag film. It indicates that optimum seed layer thickness is about 0.5 nm and the best performance of ultrathin Cu—Ag film bilayers appears to be obtained at 5 nm Ag layer.

Thickness Dependent Property.

Figure 2B:
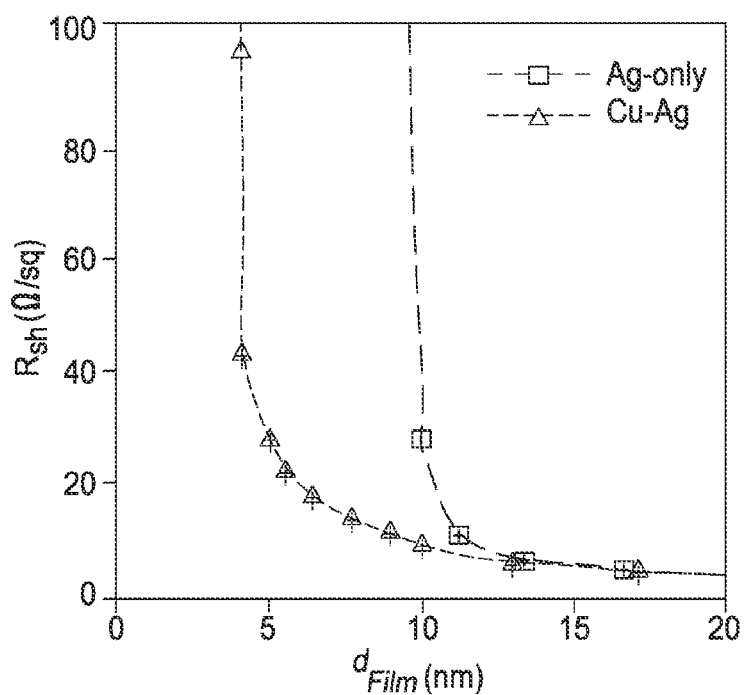

Based on the optimum thickness of the Cu seed layer, electrical and optical properties of a Cu—Ag film in comparison with a bare Ag film were thoroughly investigated for extremely thin metal-only transparent conductors (TCs). FIG. 2B shows $R_{Sh}$ as a function of total film thickness ($d_{Film}$) for Cu—Ag and bare Ag films (without any seed layer). Both the films show significant increases with reducing $d_{Film}$; however, the Cu—Ag film has a lower limit of $d_{Film}$ for low $R_{Sh}$. The insertion of the seed layer allows the film to be electrically conducting even at $d_{Film}$ approximately 4 nm, which cannot be achieved with bare Ag.

Figure 2C:
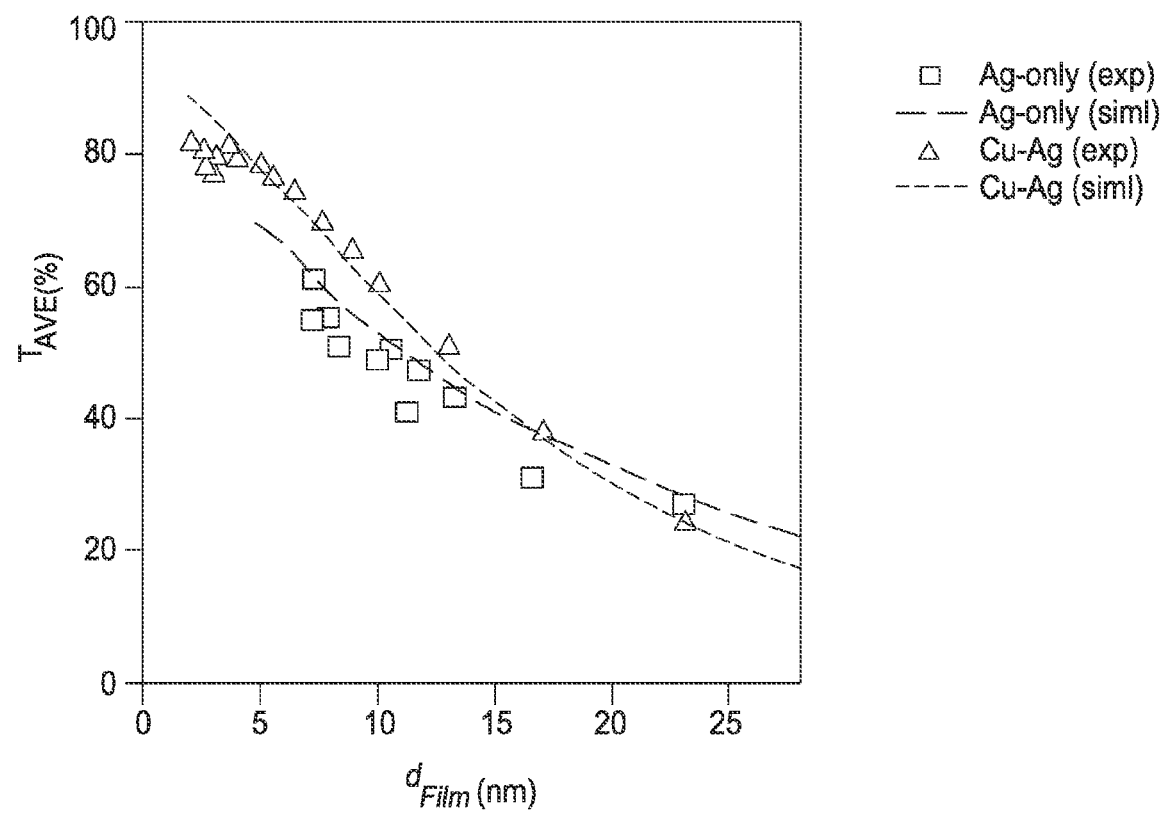

Next, thickness-dependent $T_{AVE}$, reflectance ($R_{AVE}$), and absorbance ($A_{AVE}$) of Cu—Ag and bare Ag films on the glass substrate were measured in FIGS. 2C, 8B and 8C, where the spectra were averaged over wavelength range from 380 to 780 nm. The Cu—Ag film experiences minimum light absorption and scattering due to the smooth and continuous film morphology compared to the bare Ag, resulting in higher $T_{AVE}$ and significantly lower $A_{AVE}$ in a sub-10 nm range. In a film thickness range of about 5 to about 6 nm, the Cu—Ag film can achieve $T_{AVE}$ close to 80% and $A_{AVE}$ as low as 5%, but still maintains $R_{Sh}$ of 20 Ω/sq or below. Simulated $T_{AVE}$, $R_{AVE}$, and $A_{AVE}$ also showed similar trends with the measured data. However, slight discrepancies were observed at an extremely thin regime below 5 nm in the Cu—Ag film, where slight increases (decreases) in $A_{AVE}$ ($T_{AVE}$) were observed in the measured data. This discrepancy results from the quasi-particle-like behavior of the films, increasing the absorption near the percolation threshold, which is consistent with FIG. 2B showing rapid increase of $R_{Sh}$ below $d_{Film}$=5 nm due to the film discontinuity. This points out that the optimum thickness of an Ag film is desirably selected above the percolation regime in order to guarantee maximum transmittance.

Figure of Merit and AR Effect.

Figure 2D:
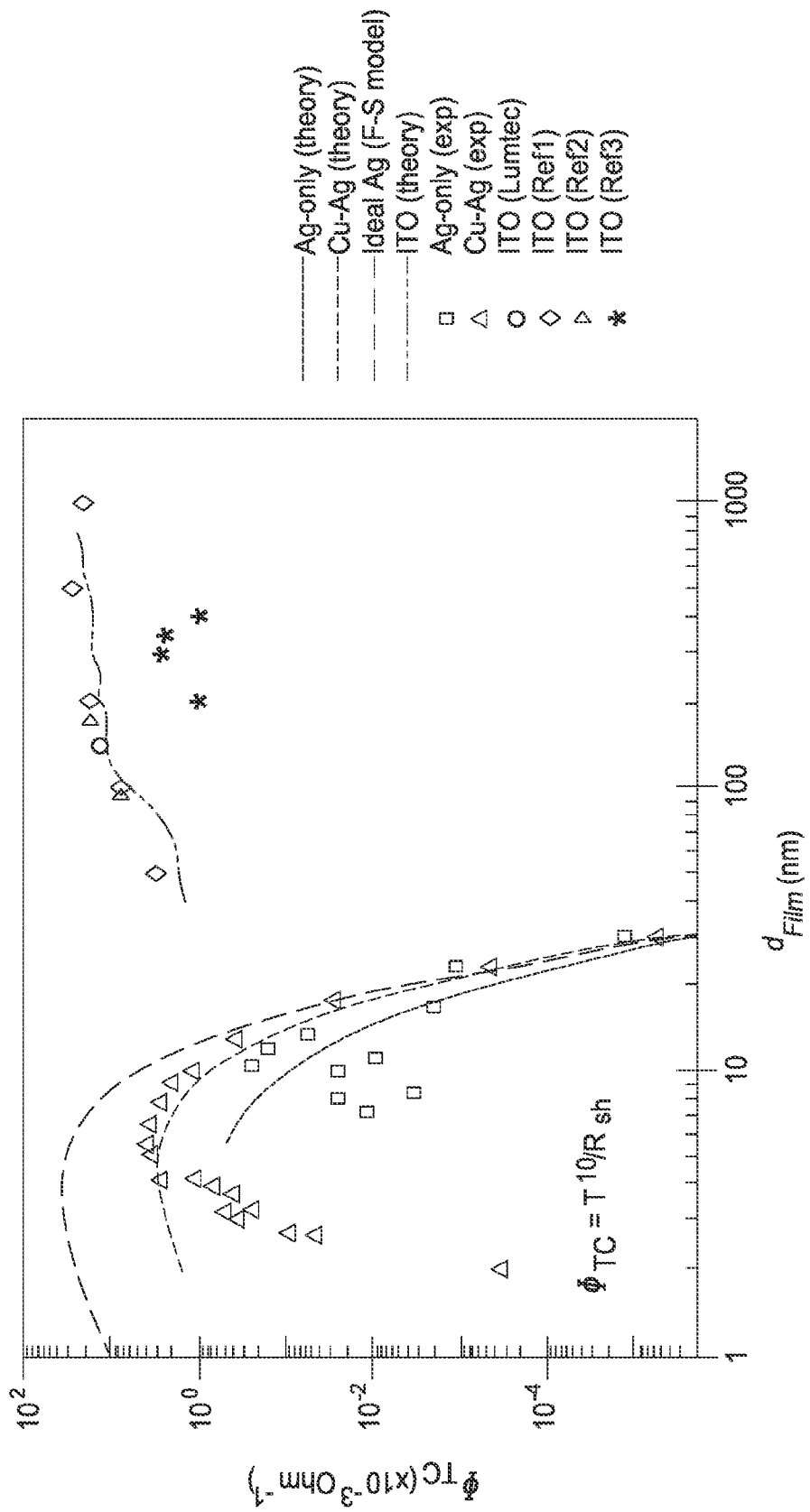

Performances of transparent conductors (TCs) both including electrical and optical properties can be represented by Haacke's figure of merit ($\phi_{TC}=(T_{550})^{10}/R_{Sh}$) where $T_{550}$ is the transmission at wavelength of 550 nm. FIG. 2D shows measured and calculated $\phi_{TC}$ of FTCs (Cu—Ag, bare Ag, and ITO films) as a function of $d_{Film}$. Small fluctuations of measured OTC for the bare Ag film are observed due to the uncontrolled morphology resulting in variance in transmittance. However, for a Cu—Ag film, measured $\phi_{TC}$ is consistent with calculated $\phi_{TC}$. $\phi_{TC}$ of Cu—Ag maximizes at $d_{Film}$=5.0 nm, with $T_{550}$=80.7% and $R_{Sh}$=21.3 n/sq. OTC of various state-of-the-art ITOs including commercial ITO (Luminescence Technology Corporation) and that calculated from grain-boundary scattering are also plotted in FIG. 2D. OTC of the commercial ITO ($R_{Sh}$=15 Ω/sq and $T_{550}$=85.0%) is higher than that of the fabricated Cu—Ag film, but lower than that of the ideal Ag film considering only surface scattering, indicating that theoretical limit of the Ag film with improved film quality can surpass performance of ITO as a TC. Moreover, it will be shown later that OLEDs with Cu—Ag electrode show high device performance due to its negative permittivity and extremely thin thickness. Therefore, TCs located at top-left in FIG. 2D are likely to bring higher device performances when they are embedded in OLEDs with better outcoupling, which will be discussed later.

Figure 2E:
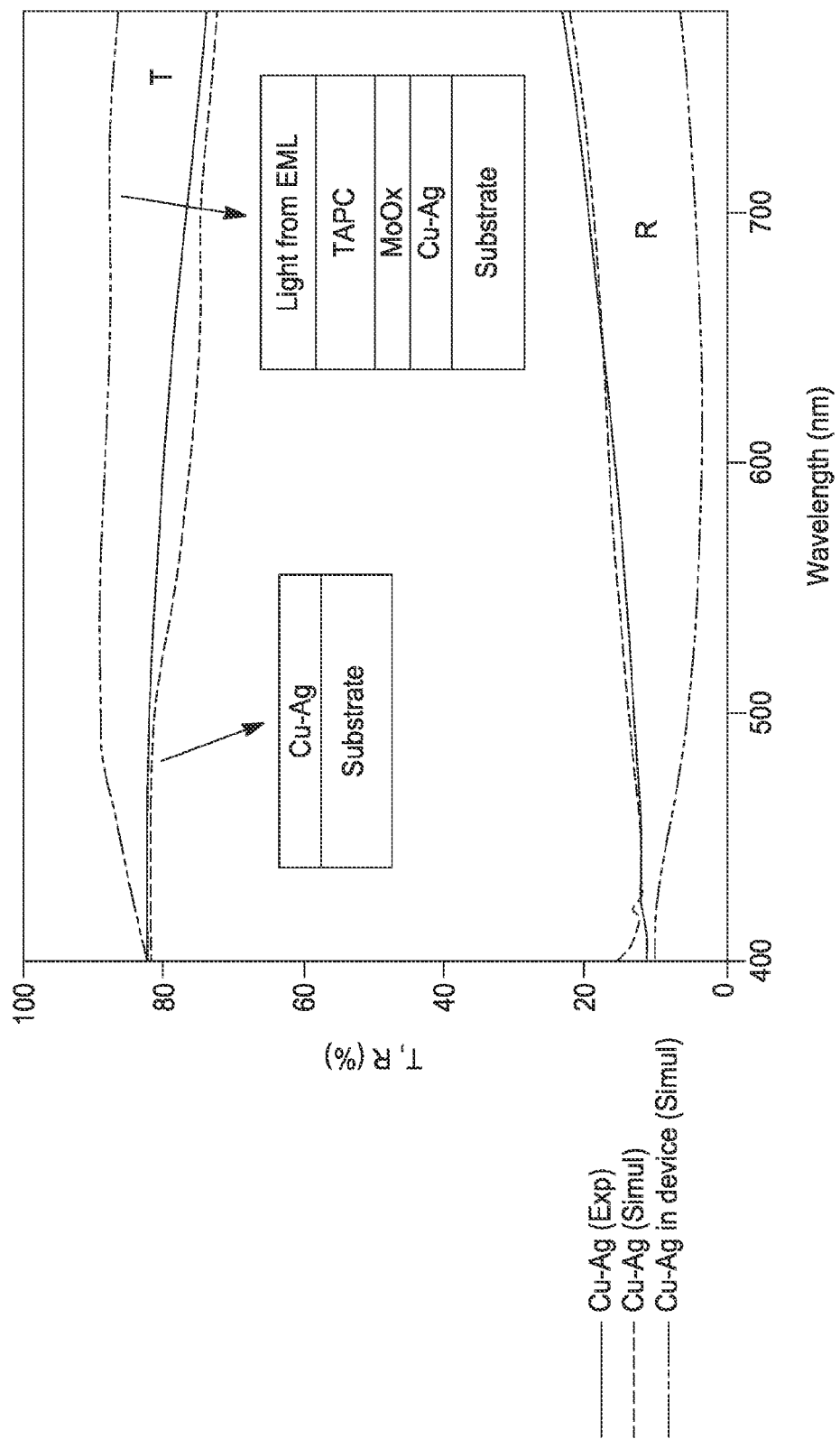
Figure 10A:
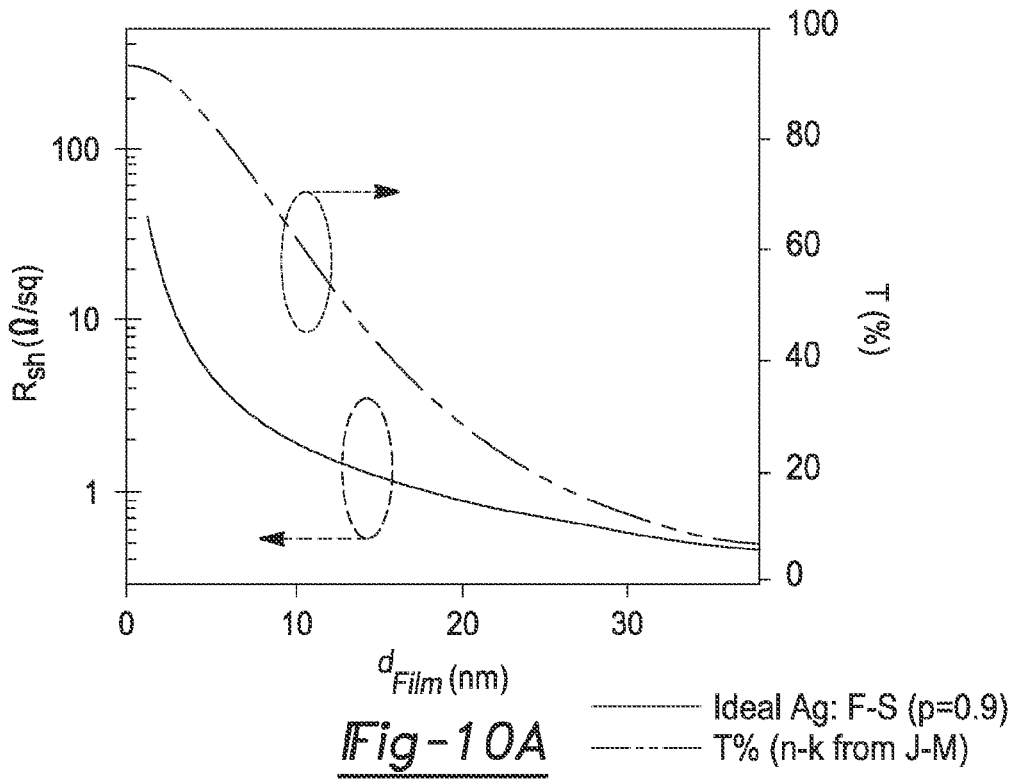
Figure 10B:
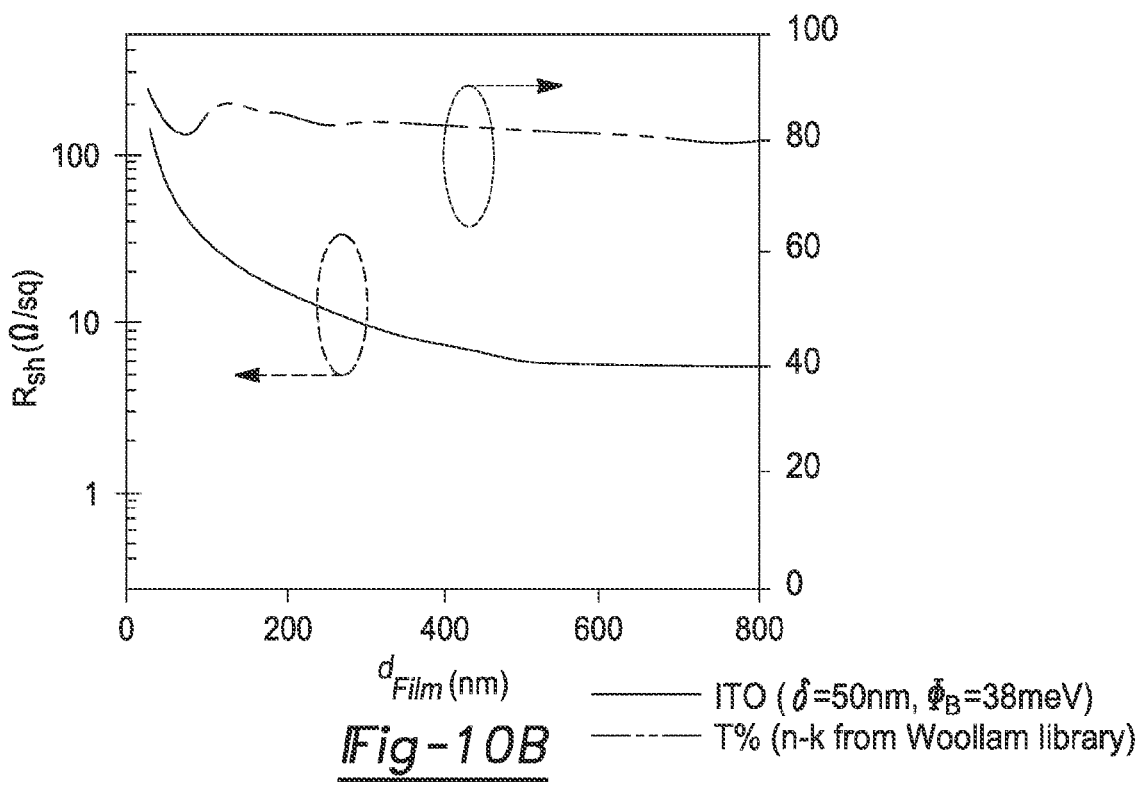

FIGS. 10A-10B show theoretical figure of merit (FOM) calculations. FIG. 10A shows a calculated sheet resistance versus Ag film thickness and a calculated transmittance versus Ag film thickness for an ideal silver film. The thickness of Ag film can range from 0 to 40 nm. FIG. 10B shows a calculated sheet resistance versus ITO film thickness and a transmittance versus ITO film thickness for an indium tin oxide (ITO) layer. Transmittance of the ideal Ag film becomes higher at very thin thickness regime with moderate level of sheet resistance. It implies that Cu—Ag bilayer film can be further enhanced with better evaporation techniques. Ideal Ag film can have higher transmittance then ITO film with lower sheet resistance. The extremely thin Cu—Ag film is highly transmissive, reaching measured $T_{AVE}$ of 79.3% and $R_{AVE}$=16.1%. This optical property can be further enhanced by hole transporting layer (HTL) in OLEDs directly adjacent to the anode, which functions as an effective anti-reflective (AR) layer. The reflectance of photons generated from an emissive layer (EML) in OLEDs can be significantly reduced by this AR coating without using any additional layers. FIG. 2E shows transmittance and reflectance spectra of ultrathin Cu—Ag films on a glass substrate (black dashed) and embedded in an OLED structure as an anode (red dashed-dot), where the light incident from the EML propagates through HTL to the substrate. CBP, TAPC, and $MoO_x$ were used for EML, HTL, and hole injection layer (HIL), respectively. HTL and $MoO_x$ were fixed to thicknesses of 70 nm and 5 nm, respectively, and acted as effective AR coatings for the Cu—Ag film, in which the simulated spectral curve shows suppressed $R_{AVE}$ from 16.0% to 5.7% and enhanced $T_{AVE}$ from 77.5% to 86.9%. The simulated transmittance can reach 88.9% at λ=530 nm, which is the peak wavelength of Ir(ppy)$_2$acac. Note that suppressed reflection is close to the reflectivity of the substrate itself, showing that the antireflection (AR) effect of the HTL and HIL layers is very effective, even without additional dielectric coatings being introduced. Another benefit of this AR effect achieved by HTL and HIL is that the total device thickness, including the TC anode, is kept at a minimum thickness level, which can suppress confinement of waveguide mode in OLEDs, i.e. the thickness can be reduced below the cutoff thickness.

Theoretical Investigation of Waveguide Mode Elimination.

Radiative coupling of light inside the active region of OLED takes a form of surface plasmon polariton (SPP) or waveguide modes. While the fundamental $TM_0$ wave is considered as SPP mode, $TE_0$ and high order TM ($TM_1$) waves are generally considered so-called waveguide modes. Here, the optical properties of Cu—Ag anode and how they affect the $TE_0$ and $TM_1$ waves is explored, then the condition at which waveguide is not supported is elucidated. To investigate behaviors of TM and TE waveguide modes, their eigenvalue equations were derived by solving Maxwell's equations in a 1D waveguide structure.

Field Equations:

$$E_{y1} = \frac{4e^{a(k_1+2k_2+k_3)+k_1 x}k_2 k_3}{Q}$$

$$E_{y2} = \frac{4e^{a(2k_2+k_3)}k_3(k_2 \cosh[k_2(a+x)] + k_1 \sinh[k_2(a+x)])}{Q}$$

$$E_{y3} = \frac{e^{-k_3 x}(-e^{2a(2k_2+k_3)}(k_1+k_2)(k_2-k_3) + e^{2k_3 x}P_1 + e^{2ak_3}(-k_1+k_2)(k_2+k_3) + e^{2k_3 x}P_2)}{Q}$$

$$E_{y4} = \frac{2e^{b(k_3+k_4)-k_4 x}k_3}{k_3 - k_4}$$

$$P_1 = (k_1 - k_2)(k_2 - k_3)$$
$$P_2 = e^{4ak_2}(k_1 + k_2)(k_2 + k_3)$$
$$Q = P_1 + P_2$$

See also, FIG. 12 detailing equations that show theoretical analysis to find mode cut-off conditions. Boundary equations are solved in 4 multilayers of organic waveguide. From layer 1-4, it shows Al cathode, organic stack, ITO or Cu—Ag anode, and glass substrate, respectively, where $n_i$ is refractive index of each layer, i=1, 2, 3, and 4. Mode is assumed to propagate z direction and materials are stacked in x direction.

Figure 13A:
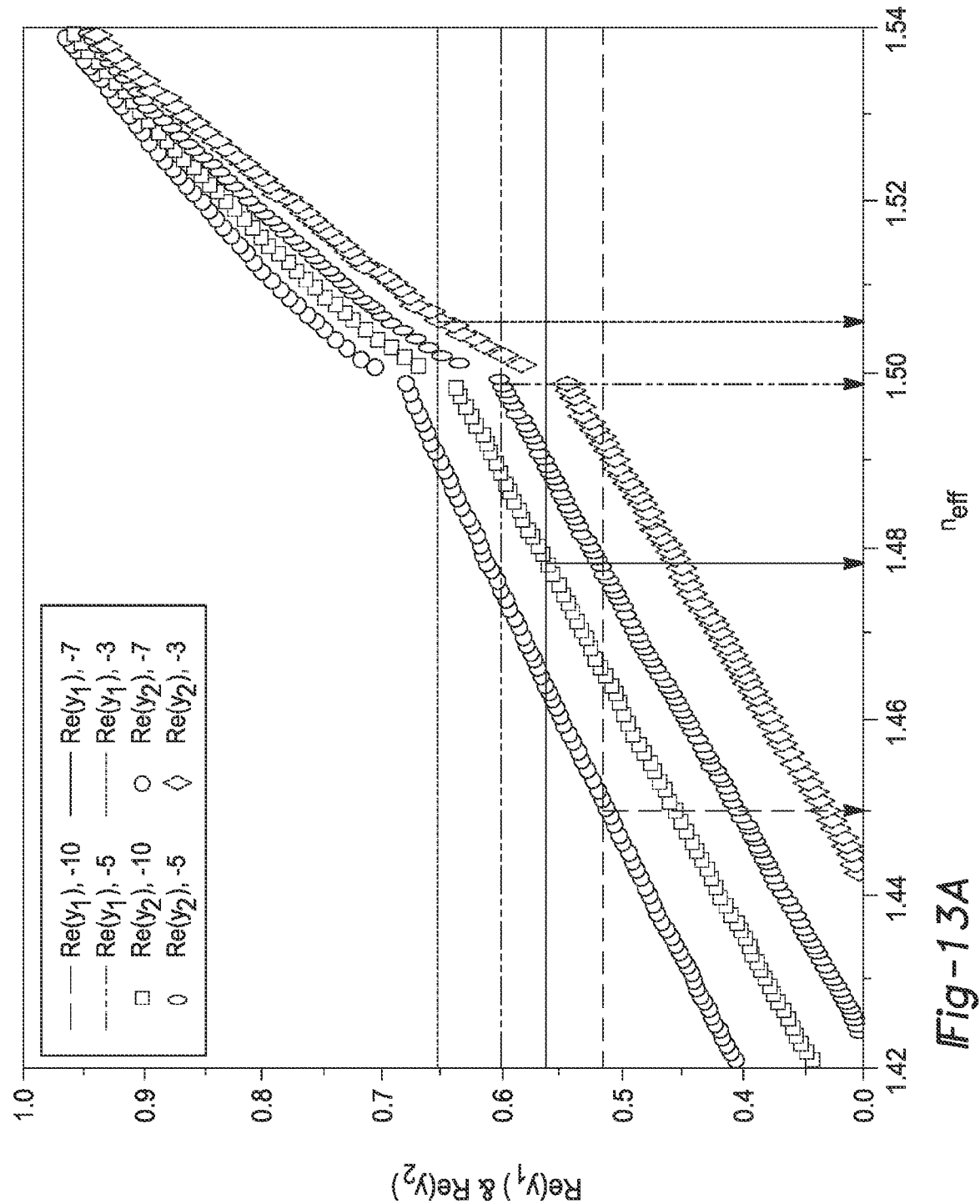
FIGS. 13A-13B show mathematical analysis of transverse electric $TE_0$ mode and $TE_0$ mode removal.
Figure 13B:
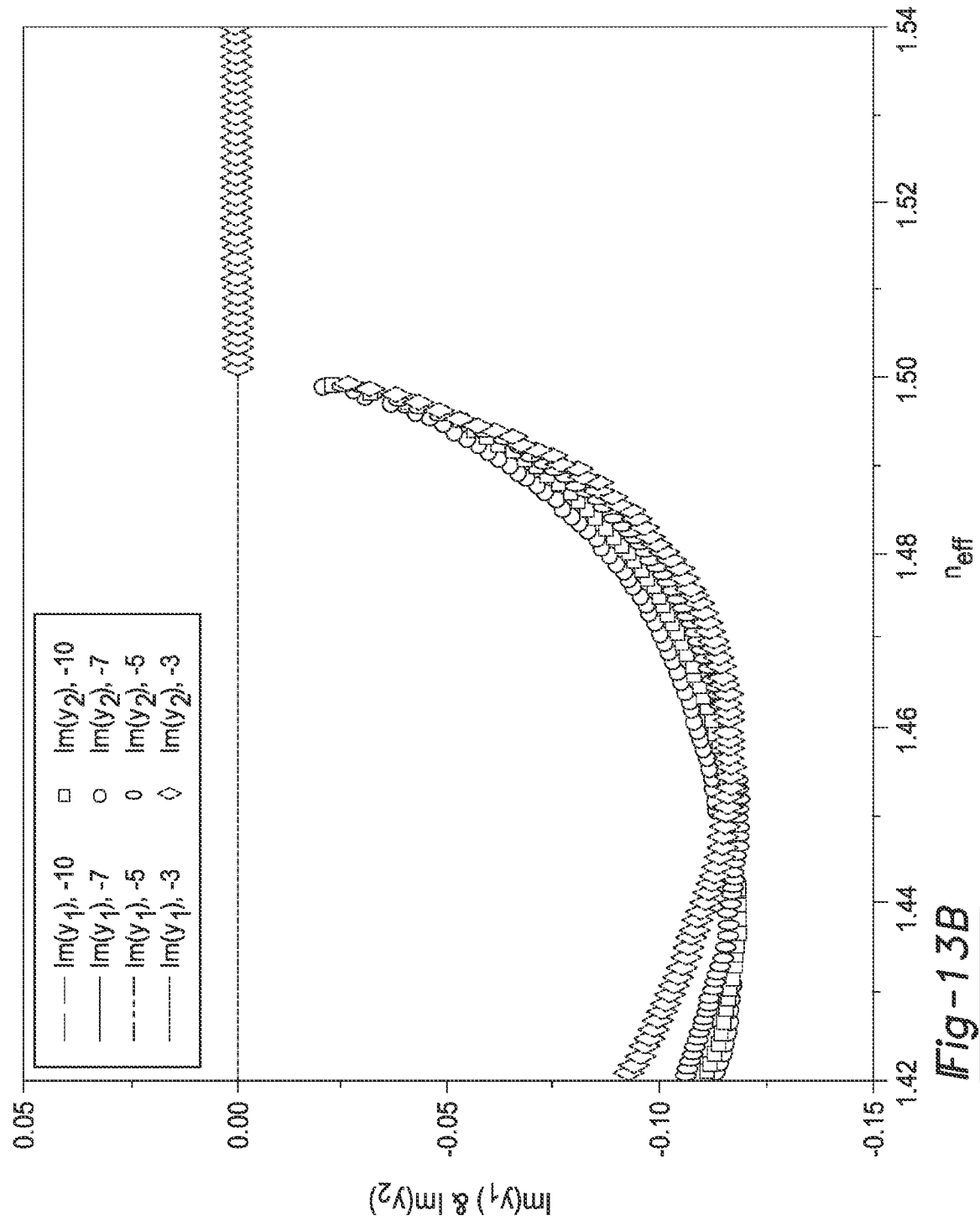

FIGS. 13A-13B show mathematical analysis of transverse electric $TE_0$ mode and $TE_0$ mode removal. FIG. 13A shows real part of $y_1$ and $y_2$ shown in FIG. 12 versus calculated effective index ($n_{eff}$) of $TE_0$ mode, while FIG. 13B shows imaginary part of $y_1$ and $y_2$ shown in FIG. 12 versus calculated effective index ($n_{eff}$) of $TE_0$ mode. Waveguide mode is defined by effective index of the mode, where the effective index of mode should be higher than refractive index of substrate to be guided along the waveguide. Therefore, $TE_0$ mode is not created in OLEDs when $y_1=y_2$ at $n_{eff}<1.5$ (the refractive index of a glass substrate). FIG. 13A means that Cu—Ag bilayer film with permittivity less than −5 does not support waveguide mode in the waveguide for a given thickness.

Figure 3A:
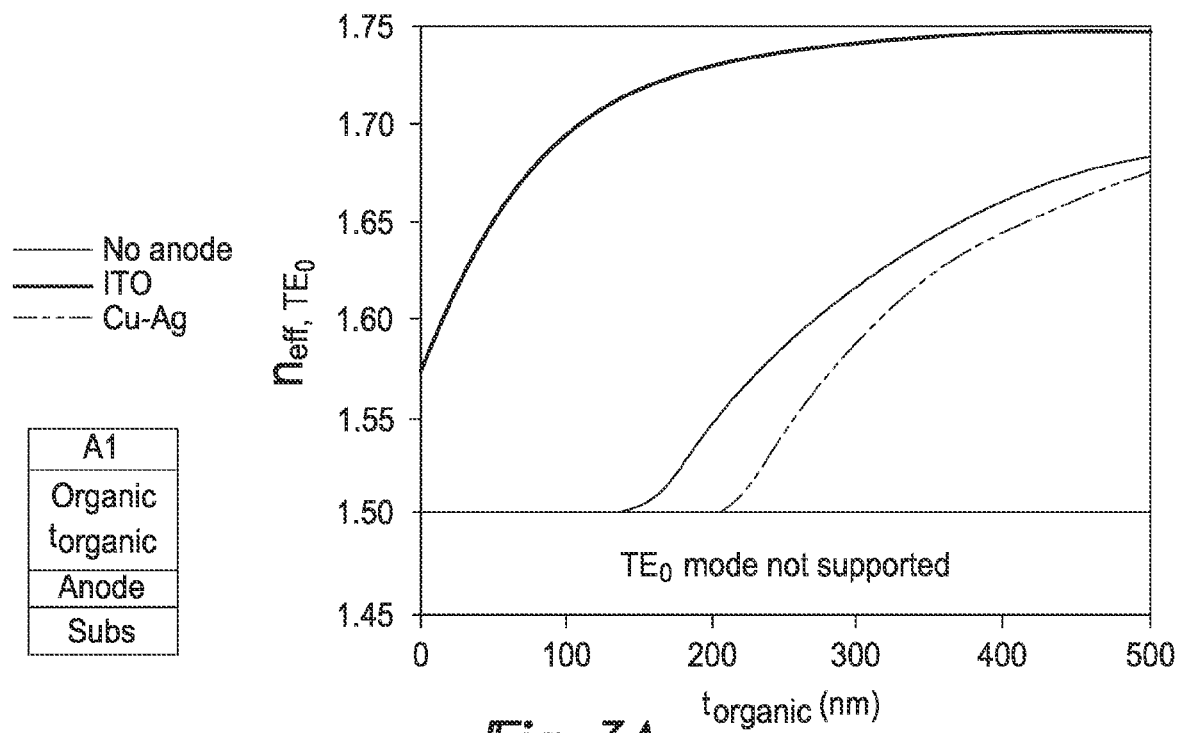

The waveguide includes an Al cathode/organic layer/ITO or Cu—Ag anode/and glass substrate as shown in the inset of FIG. 3A, where CBP was used for the organic layer. The two waveguide modes, $TE_0$ and $TM_1$ modes, exist in the waveguides and their effective indices ($n_{eff,TE0}$ and $n_{eff,TM1}$) were found as functions of organic layer thickness ($t_{organic}$) at the wavelength of 530 nm and plotted in FIGS. 3A-3B, respectively. For a given organic layer (emissive assembly) thickness, waveguide modes are not supported when $n_{eff,TE0}$ and $n_{eff,TM1}$ are lower than refractive index of the glass substrate, which is 1.5. At an organic layer thickness of 150 nm, $n_{eff,TE0}$ and $n_{eff,TM1}<1.5$ when Cu—Ag is used as anode and so the mode is not guided. In contrast, with $n_{eff,TE0}$ and $n_{eff,TM1}>1.5$ when ITO is used, this leads to energy dissipation as a form of waveguide.

Figure 9A:
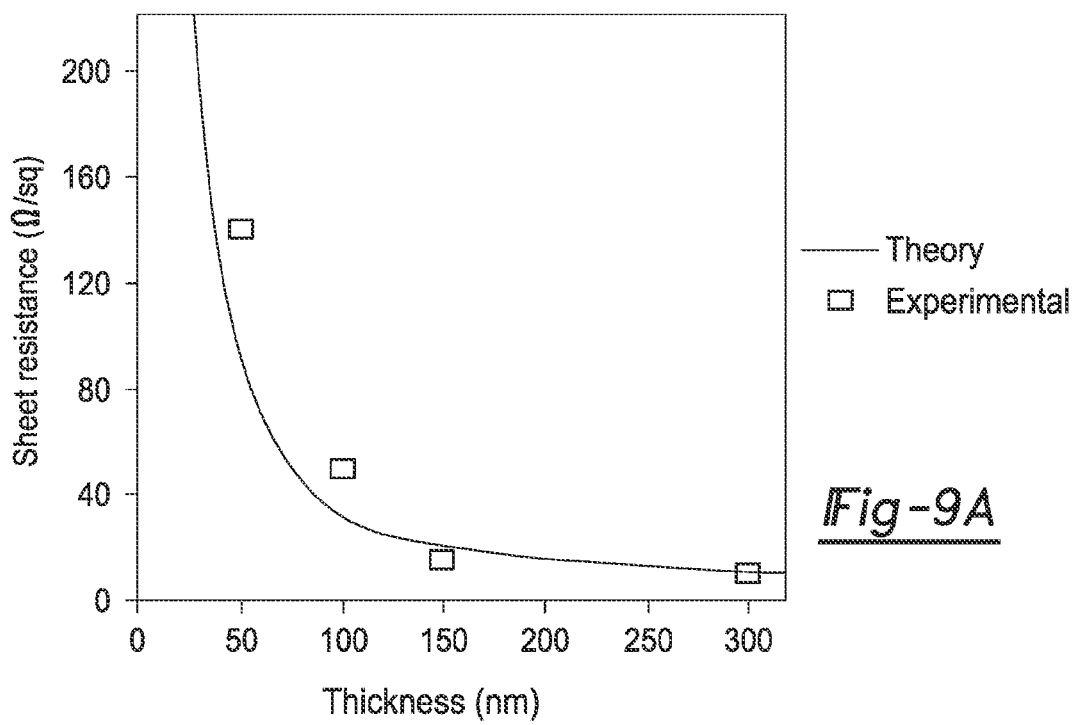
Figure 9B:
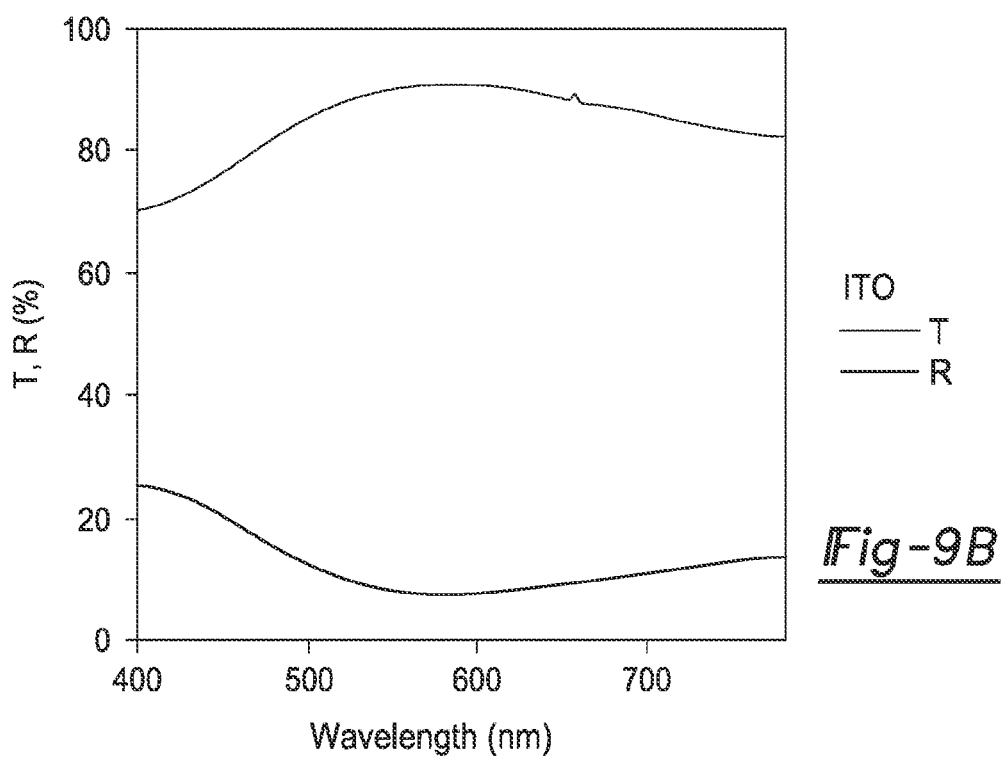

FIGS. 9A-9B show a theoretical model for indium tin oxide (ITO) as a transparent conductive electrode. FIG. 9A shows a sheet resistance versus thickness for ITO (theoretical and experimental). FIG. 9B shows transmittance and reflectance spectra versus wavelength for a 150 nm ITO film. Sheet resistance increases significantly with reducing ITO thickness. Even at 50 nm ITO thickness, the sheet resistance is more than 80 Ohm/sq. Also, ITO neat film on a glass substrate shows resonance behavior. It shows large transmittance at about 550 nm but reduced transmittance at blue wavelength region, which is unfavorable.

The ultrathin Cu—Ag film incorporated as an anode removes both $TE_0$ and $TM_1$ mode, but the mechanisms responsible for removal is different for $TE_0$ and $TM_1$ modes, which will be individually discussed. $TE_0$ mode is purely dielectric mode that is guided by a difference in refractive indexes between core and clad of the waveguide (index guiding). The core of the organic waveguide is organic and anode, while the clad is Al and the glass substrate. The black curve in FIG. 3A shows effective index of $TE_0$ mode when only the organic layer acts as a waveguide core without any anode (No anode). Due to the large geometric/optical asymmetry and semi-infinite metallic clad of the waveguide, the TE fundamental mode experiences intrinsic mode cutoff at $t_{organic}=141$ nm in the waveguide. However, the insertion of 150 nm a high refractive index ITO results in increases modal confinement of the TE mode and reduces cutoff thickness due to the high refractive index nature of ITO, thereby showing $n_{eff,TE0}$ higher than refractive index of the glass substrate regardless of organic layer thickness. In contrast, large negative permittivity of the Cu—Ag film at visible wavelength played a significant role in reducing effective refractive index of the core and thus reducing modal confinement of the mode when Cu—Ag was placed as an anode (red curve). This resulted in the reduced $n_{eff,TE0}$ and led to large increases in the cutoff thickness to 209 nm, indicating that for a reasonable organic thickness range of 100-200 nm in OLEDs, Cu—Ag films can effectively suppress the formation of TE mode, which cannot be achieved by other types of TCs involving high index values.

Figure 3B:
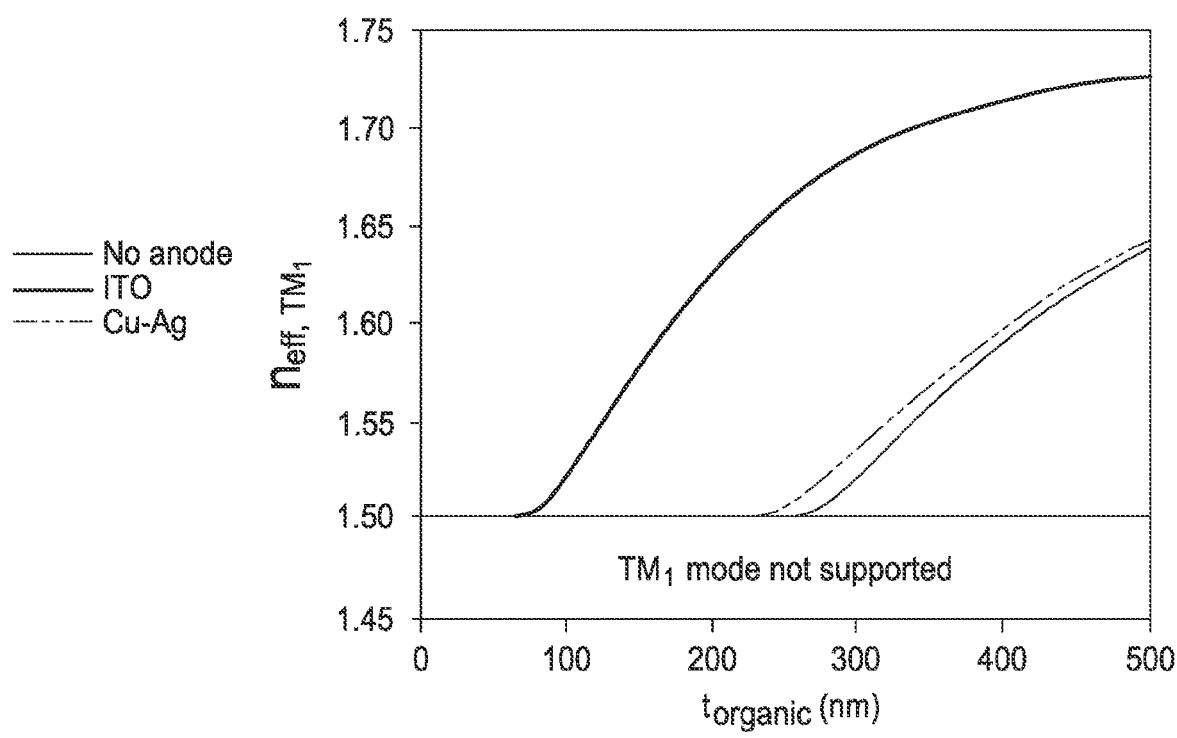

Unlike the pure index guiding nature of the TE mode, TM mode has a plasmonic property due to its electric field perpendicular to the material stack and thus can be efficiently guided in a waveguide including metal. Therefore, the decoupling of $TM_1$ mode in the Cu—Ag device was not believed to be due to the negative permittivity of Cu—Ag, but attributed to the reduced total thickness of waveguide layer. As shown in FIG. 3B, $TM_1$ mode is a higher order mode, so it has larger cutoff thicknesses compared to the fundamental mode. The $TM_1$ mode experiences modal cutoff at $t_{organic}$ thicknesses of 70 nm and 228 nm for the ITO and Cu—Ag devices, respectively. The $TM_1$ modal cutoff solely depends on the total thickness of the 1D waveguide, and the replacement of the thick ITO anode with the ultrathin Cu—Ag film makes an OLED thinner than its cutoff thickness of the $TM_1$ mode, meaning that the extremely thin nature of Cu—Ag film suppresses the formation of the $TM_1$ waveguide mode. Since $TM_1$ mode is higher order mode, it has larger cutoff thickness compared to the fundamental mode, showing the cutoff thickness at $t_{organic}=260$, 70 nm, and 237 nm for the No anode, ITO, and Cu—Ag devices, respectively. Unlike the $TE_0$ case, the cutoff of the $TM_1$ mode appeared also in the ITO device, but as practical $t_{organic}$ lies in the range of 100-200 nm in OLEDs, the required $t_{organic}$ for the $TM_1$ cutoff is too small, making it unrealistic for use in OLEDs. However, the $TM_1$ mode is not supported up to $t_{organic}=237$ nm in the Cu—Ag device, demonstrating more practical use. Because the physical properties of the Cu—Ag film was responsible for the elimination of the $TM_1$ mode, the insertion of the ultrathin Cu—Ag film made little change in terms of cutoff thickness compared to the anode-free device but large increases compared to the ITO device. The elimination of the $TM_1$ mode can hardly be achieved by metal oxide based TCs such as ITO and IZO as reducing its thickness makes it extremely resistive which is unpractical.

Figure 11A:
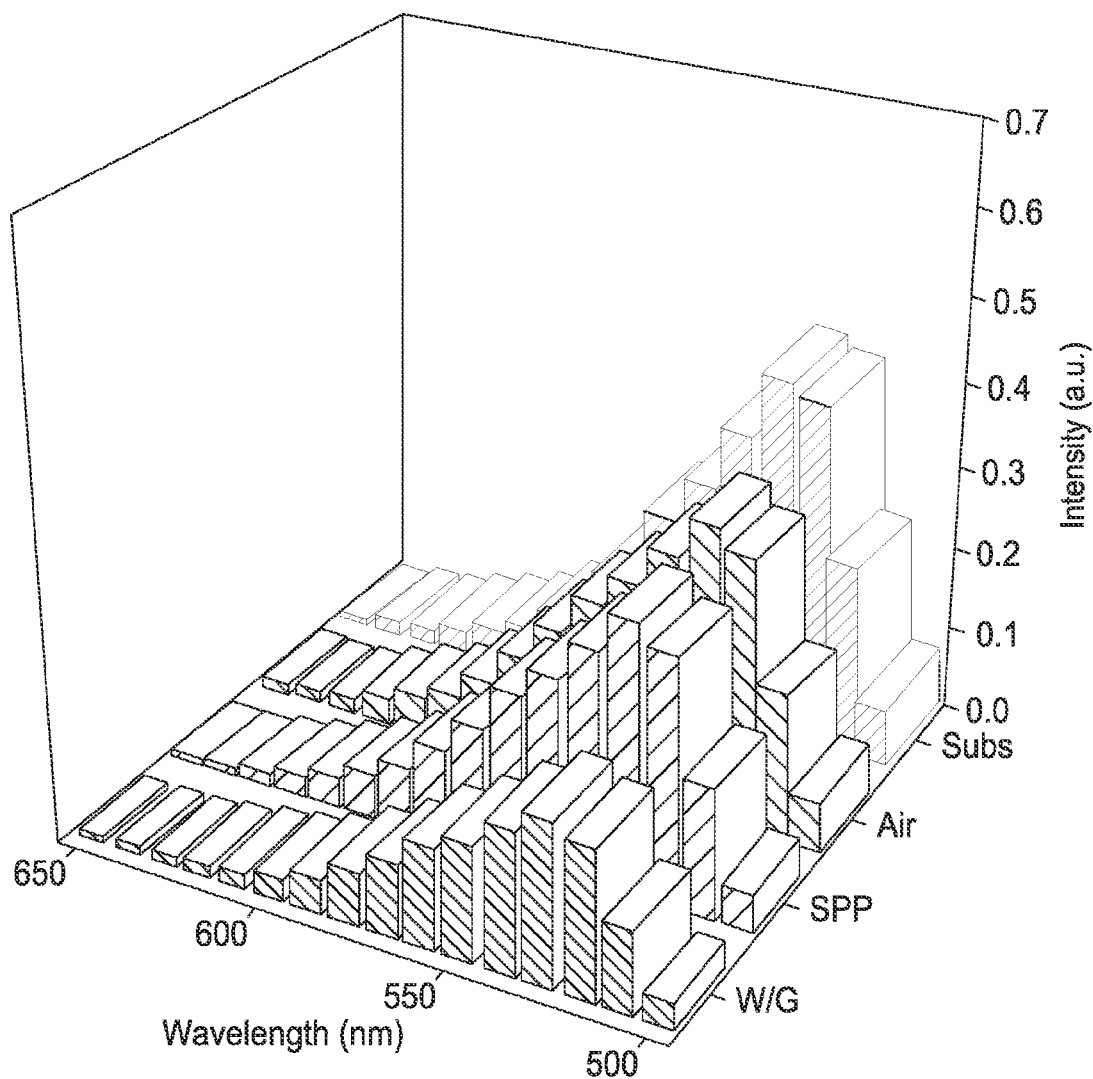
Figure 11B:
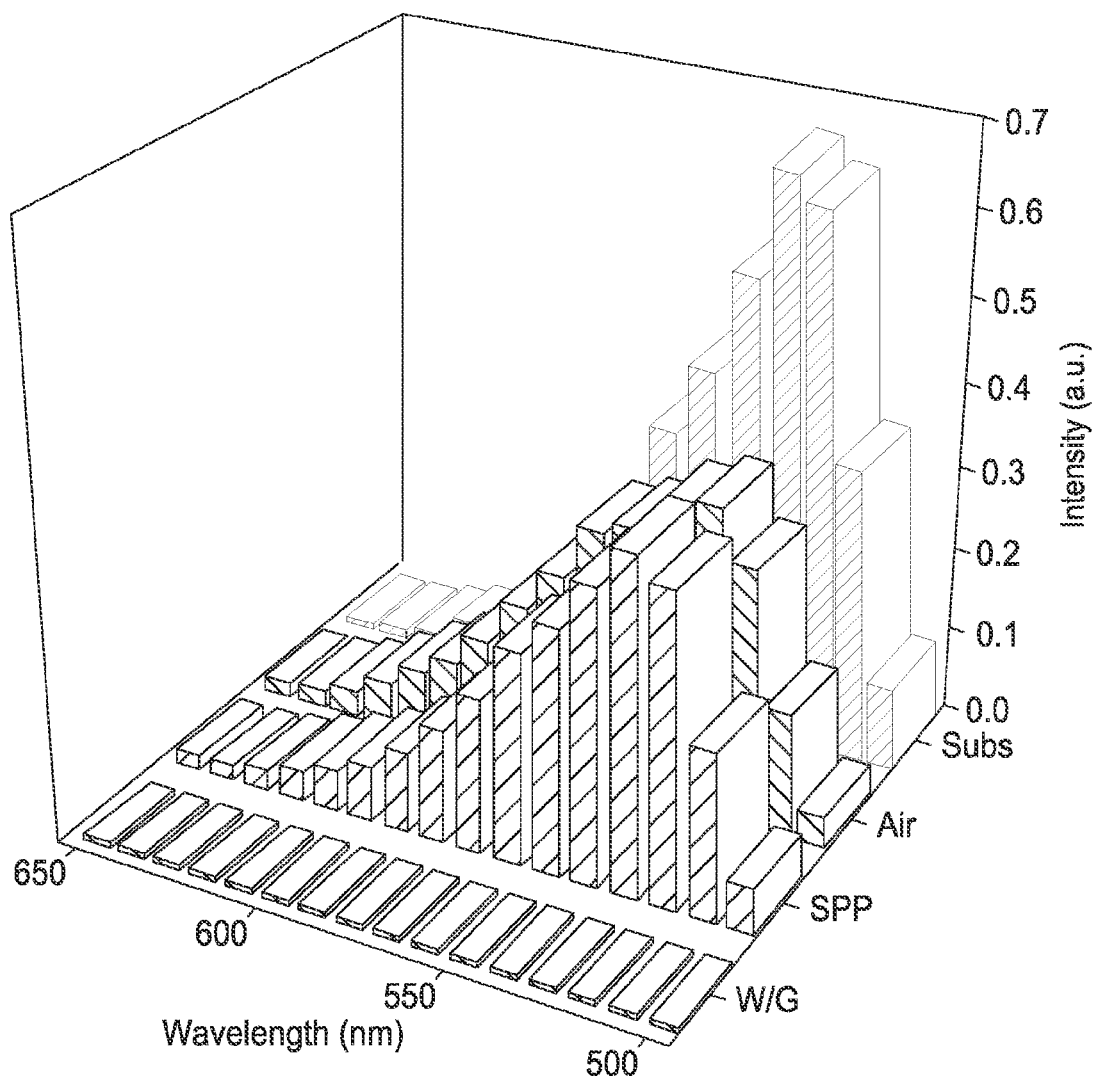

FIGS. 11A-11B show power distribution calculations for OLEDs with a comparative ITO anode and a Cu—Ag bilayer anode prepared in accordance with certain aspects of the present disclosure. FIG. 11A shows fraction (%) of the power transferred to each mode for different wavelengths, calculated by integrating the spectral power dissipation over entire wavelength range for each mode. The modes include fraction of glass substrate (Subs), air, surface plasmon polariton (SPP), and waveguide (W/G), and respectively. The comparative ITO OLED shows fairly distributed power fraction at each mode. However, in the Cu—Ag bilayer anode OLED, power fraction at waveguide mode (W/G) becomes zero with largely enhanced substrate mode (Subs). It means that simple replacement of ITO with Cu—Ag enhances performances of OLEDs.

FIG. 14A shows analysis of transverse electric $TE_0$ mode and removal for $TE_0$ mode, where the organic thickness was fixed to 200 nm. FIG. 14B shows physical analysis of transverse magnetic $TM_1$ mode and removal for $TM_1$ mode, where organic thickness was fixed to 300 nm. $TE_0$ or $TM_0$ modes cannot be excited in OLEDs if $n_{eff,TE0}$ or $n_{eff,TM1}$<1.5 that is the refractive index of the glass substrate. Therefore, Cu—Ag anode having permittivity=−10 and thickness >4 nm suppresses formation of waveguide mode in OLEDs, or Cu—Ag anode having permittivity=−3 and thickness >9 nm suppresses formation of waveguide mode in OLEDs.

FIGS. 15A-15D show one-dimensional (1D) mode profile. Each device has either a Cu—Ag bilayer or an ITO as an anode. FIG. 15A shows $TM_0$ mode of ITO and Cu—Ag OLEDs. $TM_0$ mode is surface plasmon polariton (SPP) mode. FIG. 15B shows $TE_0$ mode of ITO device. FIG. 15C shows $TM_1$ mode of ITO device. FIG. 15D shows substrate (glass) mode in the Cu—Ag device, which was calculated by mathematical solution and shows field oscillation in the substrate. The glass mode looks the same for ITO device, which is not shown here. ITO device has all SPP, $TE_0$, $TM_1$, and substrate modes, whereas $TE_0$ and $TM_1$ modes do not exist in the Cu—Ag device.

FIGS. 16A-16B show calculated and measured emission profiles of ITO and Cu—Ag OLEDs, respectively. Both the ITO and Cu—Ag OLEDs show Lambertian emission profiles. It indicates that organic layers positioned on Cu—Ag bilayer film act as an anti-reflective (AR) coating, suppressing cavity effect. Measured emission profiles also show emission profiles close to Lambertian with little deviation Example 2

Modal Power Dissipation in OLEDs.

Figure 3C:
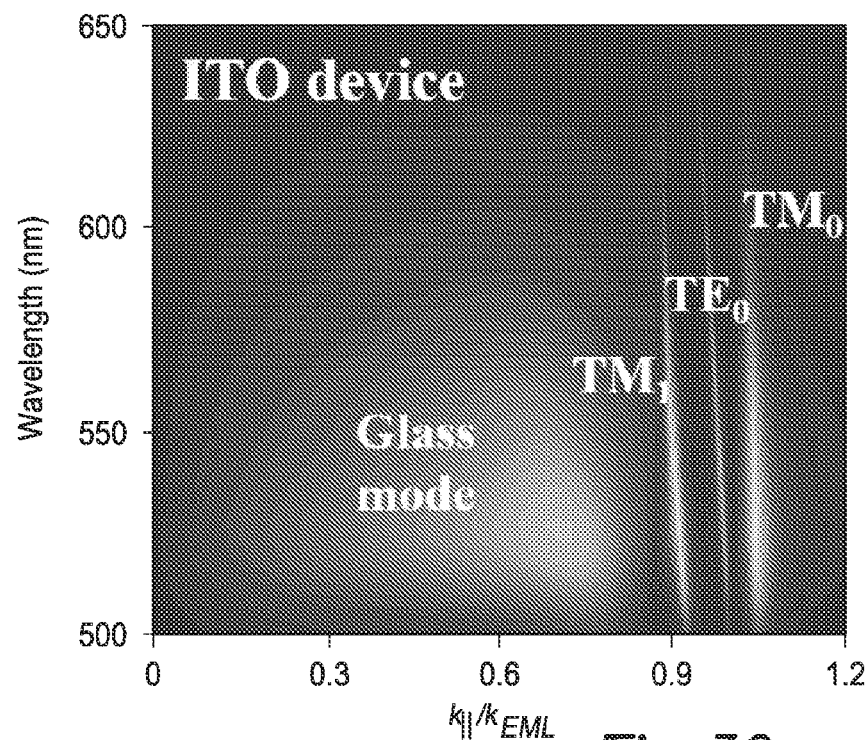
Figure 3D:
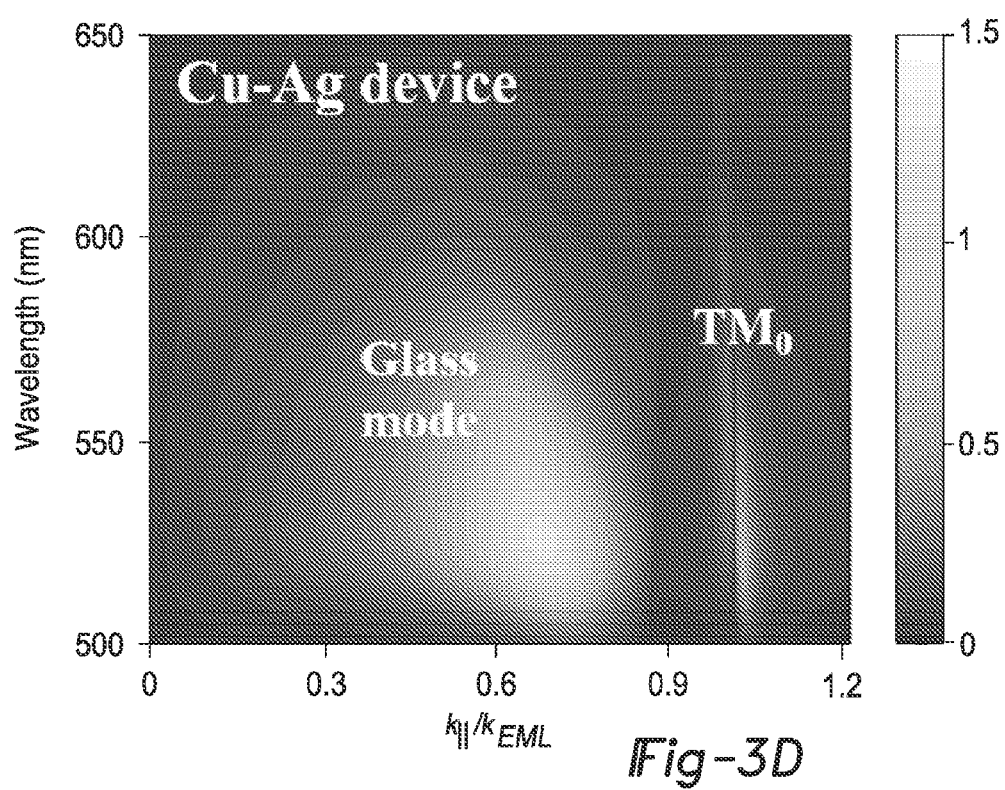

Optical properties of OLEDs with Cu—Ag anode films prepared in accordance with the present disclosure were investigated and compared to that of conventional OLEDs with ITO anodes. A calculated structure of an OLED is the same as an organic waveguide investigated in the previous example (Example 1), but the dielectric core includes a 5 nm $MoO_x$/40 nm TAPC/20 nm EML/70 nm TPBi, where CBP was used for the EML in the calculation. FIGS. 3C and 3D show spectral power dissipations of the ITO and Cu—Ag OLEDs, respectively, which were calculated by Dyadic Green's function with dipole excitation source. The dipole excitation source was placed at the center of the EML and permittivity of each material was all measured by ellipsometry. Dipole orientation factor of 0.74 was used for the $Ir(ppy)_2acac$ emitter and its emission spectrum was integrated to obtain the two plots. Poynting vector in the propagation direction at each layer was calculated to investigate existing modes in the structure. $k_\parallel$ and $k_{EML}$ are wavenumbers in horizontal direction and at the EML, respectively, where $k_{EML}=2\pi/\lambda n_{organic}$ $TM_0$ mode is SPP mode excited by the aluminum (Al) cathode, while $TE_0$ and $TM_1$ modes are waveguide modes that are guided along the organic stacks and anode. The glass mode is light trapped in the glass substrate due to total internal reflection occurring at the interface between air and glass substrate, which is extracted by IMF in this example. The power dissipations of the air, glass, waveguide, and SPP modes correspond to $0<k_\parallel/k_{EML}<0.59$, $0.59<k_\parallel/k_{EML}<0.88$, $0.88<k_\parallel/k_{EML}<1$, and $1<k_\parallel/k_{EML}$ respectively. Dissipated power is highest at 530 nm in the plots since it is the peak wavelength of $Ir(ppy)_2$ acac and thus results in the largest amount of power dissipation.

FIG. 3C shows that the ITO device experiences significant power dissipation due to the two waveguide modes. The $TE_0$ and $TM_1$ modes were excited in the ITO device. The $TM_1$ mode was cut off at 620 nm, whereas the $TE_0$ mode exists in the entire emission wavelength range of $Ir(ppy)_2acac$. The $TE_0$ mode has higher $k_\parallel/k_{EML}$ than the $TM_1$ mode, meaning that the $TE_0$ mode is more tightly confined in the waveguide, which is consistent with FIGS. 3A-3B. The results in FIG. 3C indicate that the electroluminescence of the ITO device will intrinsically excite the two waveguide modes and significant amount of light generated at the EML will be trapped inside the device in the form of the guided modes rather than being coupled out. This energy portion cannot be extracted without external means. However, as shown in FIG. 3D, the Cu—Ag device did not show any power dissipation in the form of $TE_0$ and $TM_1$ modes ($0.88<k_\parallel/k_{EML}<1$) along the entire emission wavelength range and showed higher power at the glass mode compared to the ITO device. It means that light generated at the EML did not excite propagating mode along the organic stacks and thus the created photonic energy was not wasted as a form of waveguide mode; this effect, in turn, increased the portion of light as the glass mode that can be extracted.

Figure 3E:
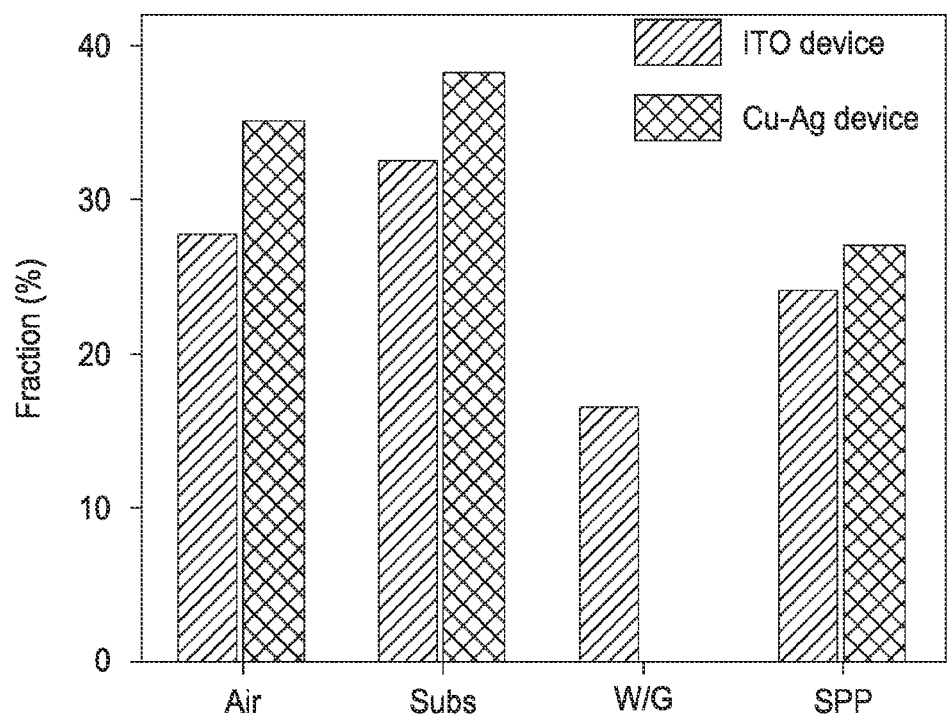

FIG. 3E shows fraction (%) of the power transferred to each mode, which was calculated by integrating the spectral power dissipation over entire wavelength range for each mode. Fraction of Air, Substrate (Subs), W/G, and SPP are referred to the power transferred to the air, glass, waveguide, and SPP modes, respectively. The ideal case of IQE=100% was assumed for the calculation. It shows that the Cu—Ag device does not have power transferred to the waveguide mode, whereas 14.4% of the total power is dissipated as the waveguide modes in the ITO device. The corresponding energy of the eliminated waveguide mode in the Cu—Ag device was distributed to the air, glass, and SPP modes, increasing power fraction of each mode. Especially, the substrate mode showed the largest increase since the decoupled waveguide modes are mostly likely to relax to the substrate. This ultrathin Cu—Ag anode suppresses formation of waveguide modes in OLEDs and transfers its corresponding energy to the substrate.

Example 3

Experimental Observation of Waveguide Mode Elimination.

Figure 4A:
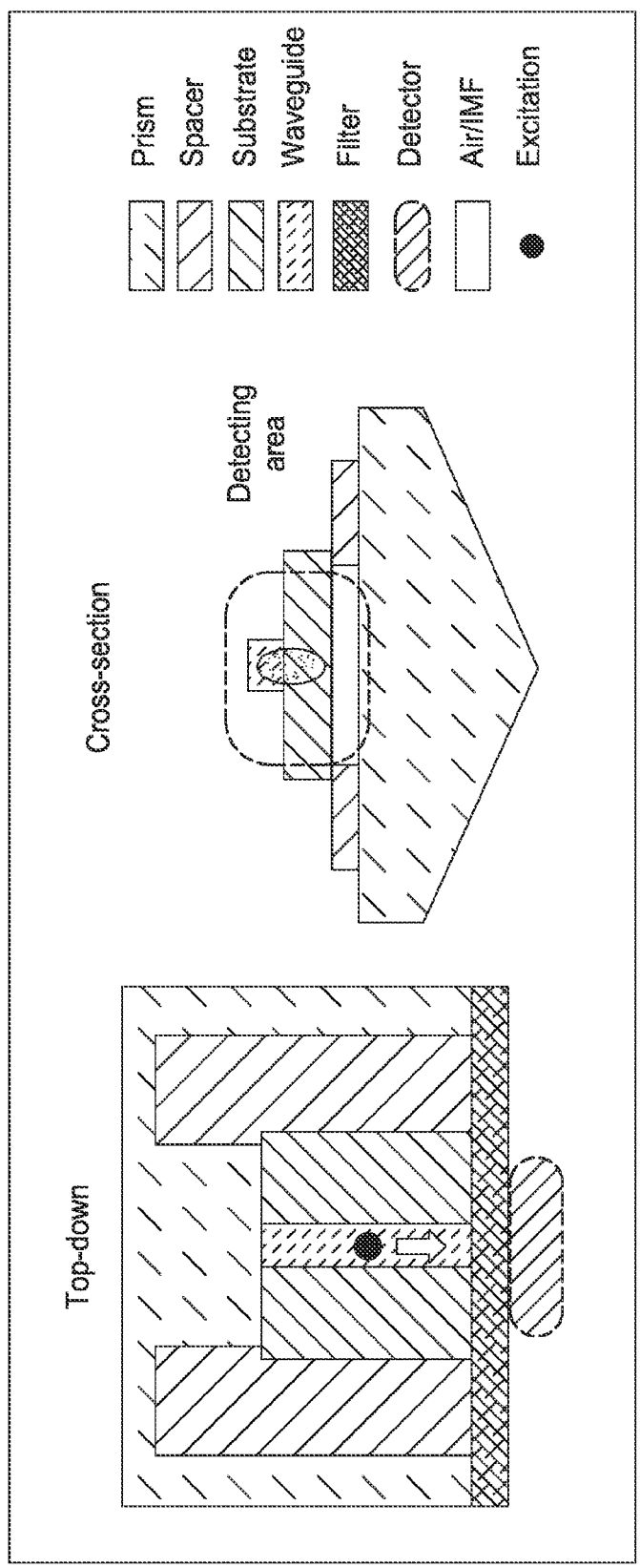

Organic waveguide samples are grown on the ITO and Cu—Ag films to experimentally verify waveguide mode elimination. Strip-line organic layers with commercial ITO on a glass substrate and Cu—Ag film on fused silica substrates were prepared. A structure of the organic layers was identical with the OLEDs designed in the previous example except for the top Al cathode. Because waveguide modes experience significant loss due to Al cathode, the top Al was removed for more accurate measurement of modal intensity. Both index-matched fluid and prism for the glass and fused silica substrates were used to remove substrate modes out of the samples. FIG. 4A shows schematic of top-down and cross-section view of the experimental setup. The strip-line waveguide sample was placed on holders of two silicon pieces having small gap underneath for IMF. A laser excitation source operating at 405 nm was directed at a center of the waveguide line and the mode intensity was measured at one end of the line. A bandpass filter with a bandwidth of 510-560 nm was used to measure intensity of the generated light at the EML that propagates through the waveguide strip while filtering out the excitation light source. The strip-line samples made on either ITO or Cu—Ag were measured with and without IMF to observe power portion of the waveguide mode. Measured light intensity without IMF results from a sum of the waveguide and substrate modes, because the substrate mode is still trapped in the sample. However, the IMF extracts substrate mode and the index-matched prism completely removes this extracted substrate mode out of the sample, leaving waveguide mode only in the sample.

Figure 4B:
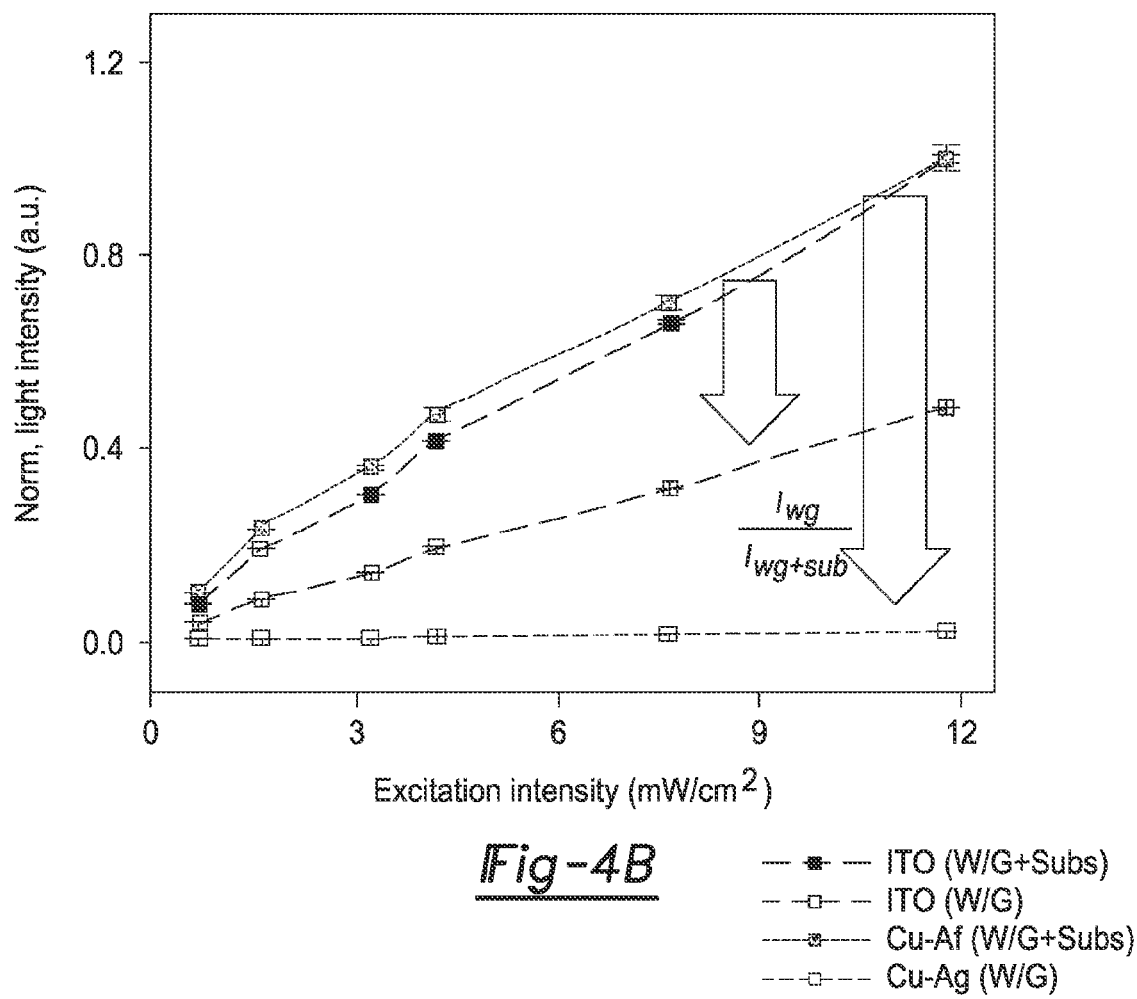

FIG. 4B shows measured intensities of the guided light in the waveguides on ITO and Cu—Ag films as a function of excitation intensity. Both waveguides show similar trends with input intensities without IMF, because similar amounts of power were excited from the laser source and the generated light was trapped in the samples in the forms of waveguide and substrate modes. However, the measured light intensities were dropped to 48.5% and 1.9% of the original intensity for the ITO and Cu—Ag waveguides after applying IMF, respectively, where that for the Cu—Ag becomes comparable to the noise level. It means that the significant amount of energy was still stored in the ITO waveguide, which results from the waveguide mode, whereas energy in the Cu—Ag waveguide was completely removed by the substrate mode extraction, showing almost flat and negligible light intensities regardless of the excitation. This result indicates that most of the excited energy was stored in the substrate and thus removed by the IMF and prism from the sample, with no energy stored in the waveguide core.

Figure 4C:
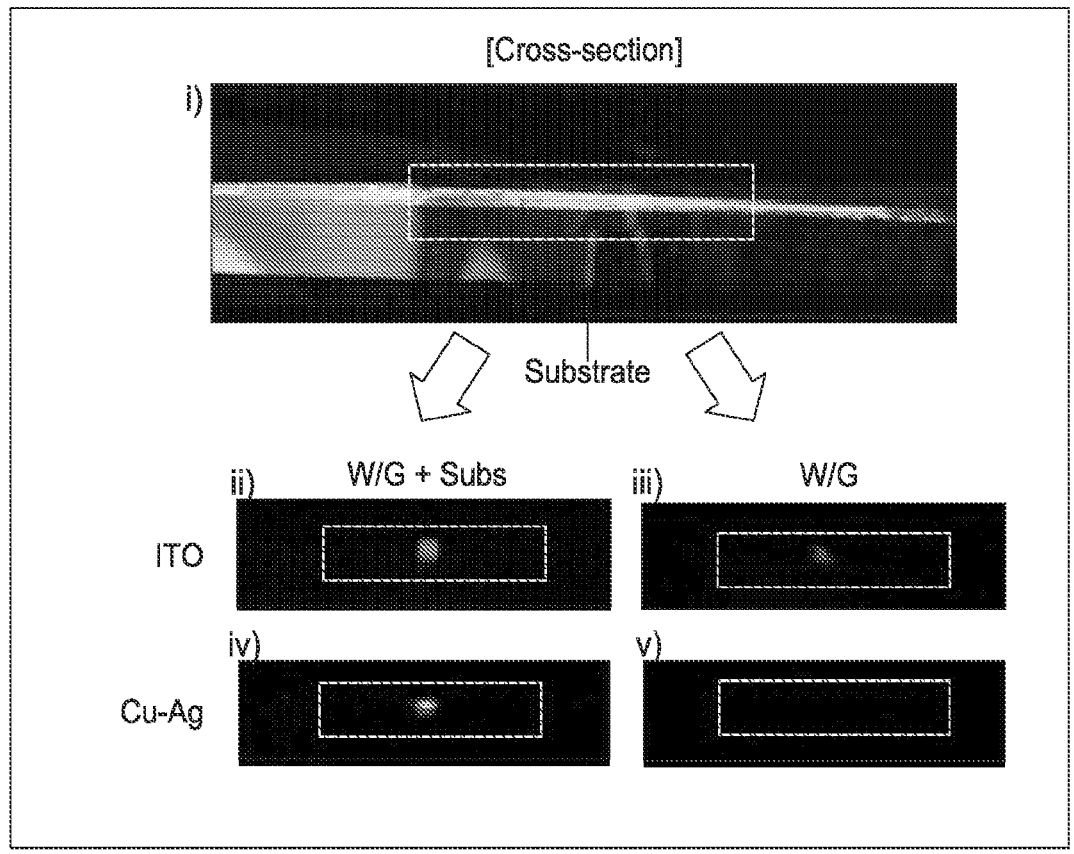

FIG. 4C shows sample emission of light from the side view of the ITO and Cu—Ag samples without and with IMF Image i) shows a sample placed on the prism through the bandpass filter under ambient light. The white dotted line indicates the sample location, where the detector was placed during the measurement. Both samples showed distinct green emission without IMF as shown in images ii) and iv), since the generated light was trapped in the waveguide and the substrates. With the substrate mode extraction, the guided light brightness of the ITO sample was largely reduced but still easily noticeable as seen in image iii). However, no green light was visible at the Cu—Ag sample with IMF as displayed in image v), indicating that no energy propagated through the waveguide.

Example 4

Device Performance

Figure 5A:
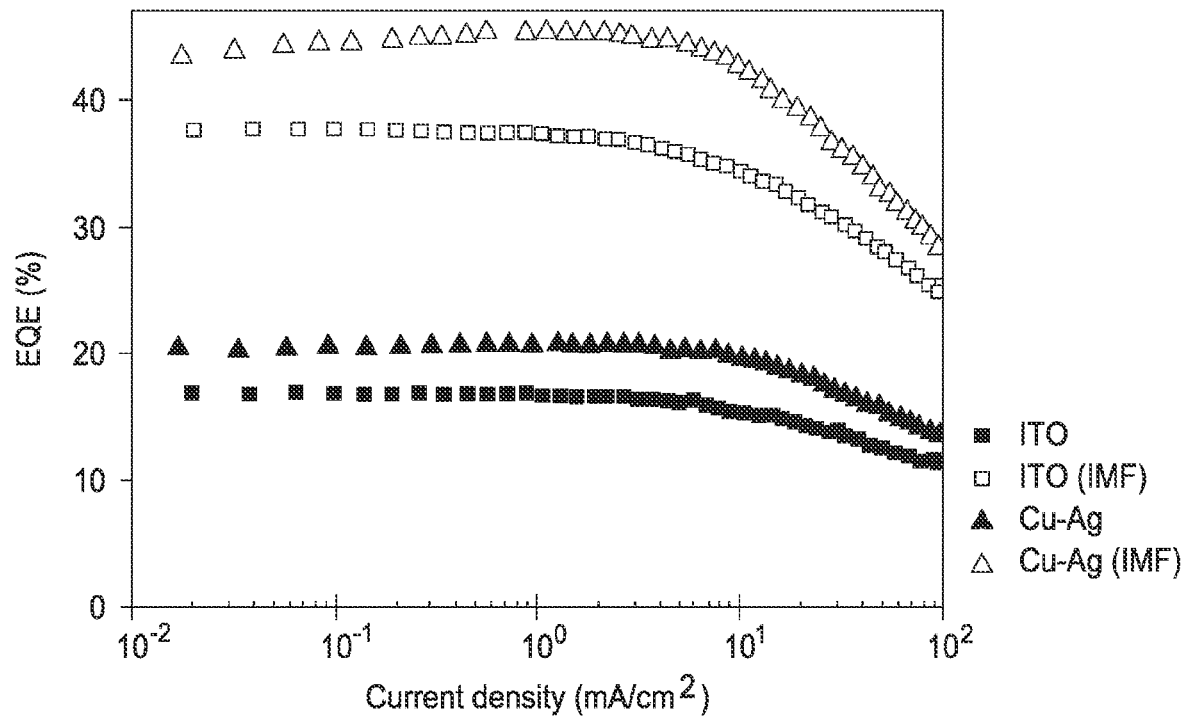

Conventional green OLEDs with an ultrathin metallic transparent conductive Cu—Ag anode were fabricated to assess the waveguide mode elimination effect on device outcoupling efficiency. Fabricated OLEDs comprise a glass substrate/150 nm ITO (comparative example of an anode) or 5 nm Cu—Ag (inventive example of an anode)/5 nm $MoO_x$ (hole injection layer (HIL))/70 nm TAPC (hole transport layer (HTL)/20 nm 10% $Ir(ppy)_2acac$ doped in CBP (organic active emissive layer (EML) where light is generated (after electron-hole recombination))/60 nm TPBi (electron transporting layer (ETL) that facilitates the transport of electrons that are injected from the cathode electrode to the EML layer)/1.5 nm LiQ (electron injection layer (EIL) that facilitates the transport of electrons that are injected from the cathode electrode to the EML layer)/150 nm Al (cathode). OLEDs with conventional ITO anodes were made for comparison. While the example here is directed to a bilayer ultrathin electrode structure, it is believed that the same effect can be expected for co-sputtered alloy films as well. FIG. 5A shows EQE versus current density characteristic of each device. EQEs of the Cu—Ag and ITO devices were 20.7% and 16.8% which are similar fractions to the calculated air mode shown in FIG. 3E, respectively. However, measured EQEs were lower than the calculated values since 100% IQE was assumed to obtain FIG. 3E and show maximum achievable EQEs. The fabricated OLEDs in this example are likely to experience exciton quenching due to triplet-triplet and triplet-polaron annihilations especially at the EML and ETL interface since CBP and $Ir(ppy)_2acac$ both transport holes more favorably than electrons. Also, exciton loss happens since organic semiconductors used in the fabrication were used as-received without further purification. Considering these exciton losses, the IQE of the fabricated devices was about 63%. When the IMF was used to extract the trapped light in the substrate, EQE of the Cu—Ag device was significantly boosted up to 45.3%, whereas the maximum EQE of the ITO device remained 37.8% as shown in FIG. 5A. This efficiency improvement due to the substrate mode extraction for each device is also consistent with the calculation result shown in FIG. 3E, further demonstrating that the Cu—Ag device has a greater portion of light trapped in the substrate due to the elimination of the waveguide mode in the active and anode layers.

Figure 5B:
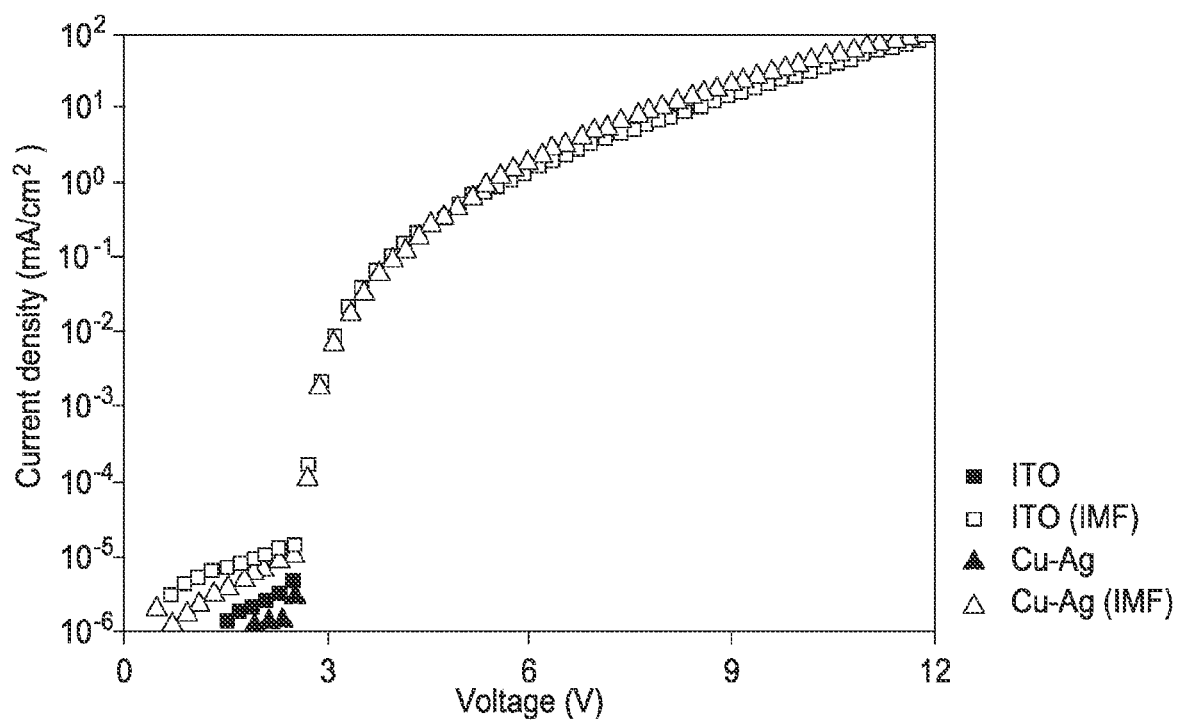
Figure 5C:
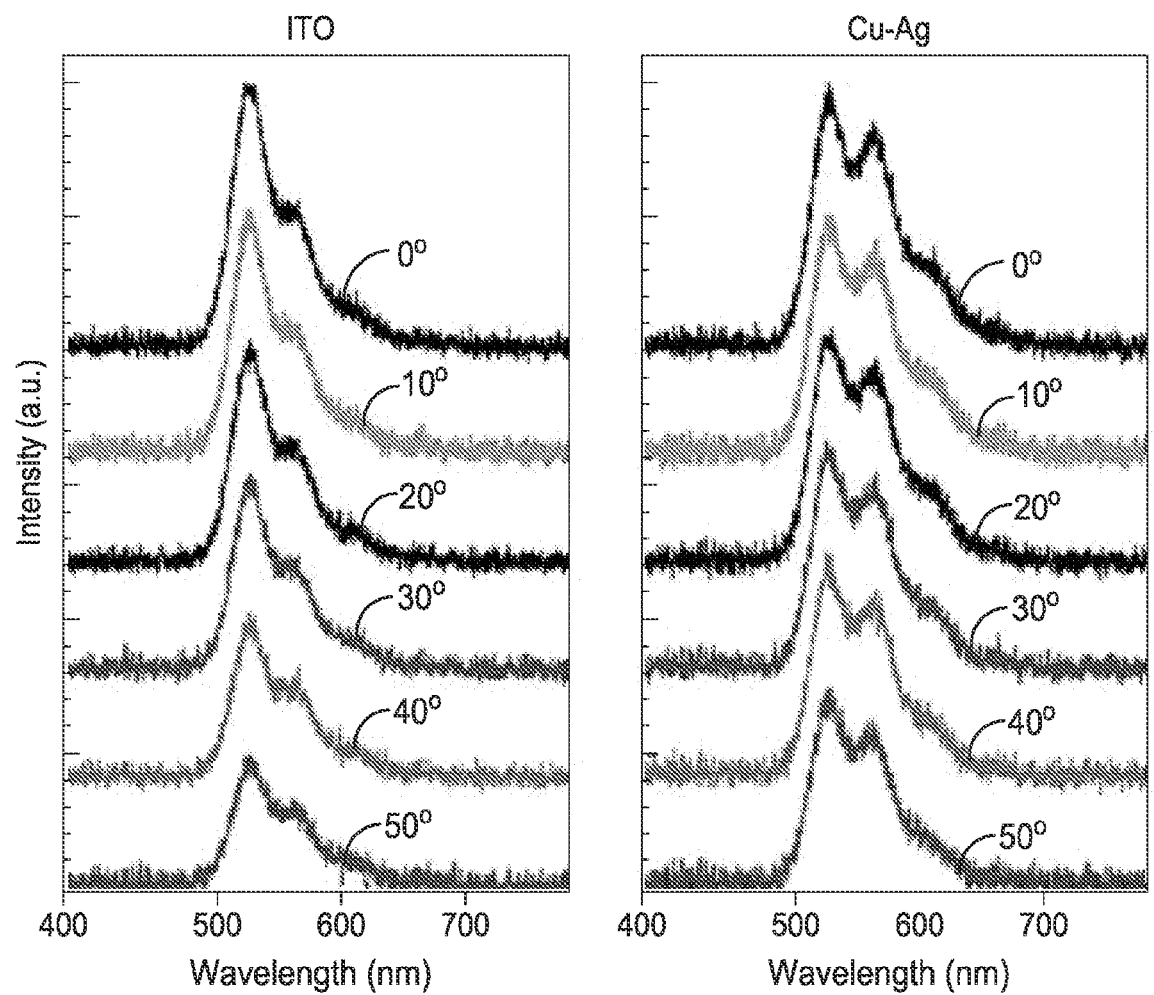

FIG. 5B shows current density-voltage characteristic of the ITO and Cu—Ag devices. The two devices showed very similar electrical properties, overlapping in the curves. This indicates that electrical property of OLEDs is unaltered due to the replacement of ITO with Cu—Ag, meaning that the EQE enhancement due to Cu—Ag is an efficient optical outcoupling method. Transmittance of the Cu—Ag film can further improve with addition of organic layers because they act as an AR coating. Due to low reflectivity of the Cu—Ag film with an AR coating, the OLED with Cu—Ag shows very stable emission color without any cavity effect. FIG. 5C shows spectra of the Cu—Ag OLEDs measured at oblique angles from 0 to 55°. The Cu—Ag device does not show distorted spectra due to negligible cavity effect and showed Lambertian emission profile as the same as the ITO device.

Example 5

Dielectric-metal-dielectric (DMD) structures are a promising flexible transparent conductor (FTC) for flexible displays, especially for organic light emitting diodes (OLEDs). Previously, it was known that the adjacent dielectric layers around Cu—Ag film can suppress reflection from the Cu—Ag film due to destructive interference and thus increase the film transmittance. Additionally, a thin conductor including a Cu—Ag film can outcouple waveguide modes and thus increase external quantum efficiency of OLEDs when it is used in the anode. In this example, modal decoupling properties of thin metal conductors and its cut-off conditions are investigated.

FIG. 17A shows the structure of OLEDs with a dielectric-metal (DM) anode, where the bottom dielectric layer (D) in the DMD structure has a thickness of 0 nm. The anode is formed of either 40 nm or 80 nm thick ITO dielectric layers on 8 nm thick Cu—Ag layer. The structure shown in FIG. 17A is a design where a bottom dielectric is omitted (e.g., for a general structure of anode having the dielectric-metal-dielectric (DMD), where the lower dielectric thickness is 0 nm (no material)). In the design shown in FIG. 17A, the organic layer includes the EML, HTL, and ETL (as described above). The organic material is deposited on top of a distinct dielectric layer.

OLEDs are formed on a glass substrate. 8 nm Cu—Ag was used for metal conductor. FIGS. 17B-17C show that effective indices of $TE_0$ and $TM_1$ modes at an operating wavelength of 530 nm, which are waveguide modes in OLEDs. 150 nm bare ITO (a typical thickness of a conventional OLED design) was also calculated and plotted in blue curve, and the waveguide without anode was plotted in black curve. The glass substrate has a refractive index ($n_{glass}$) of 1.5, therefore the two waveguide modes are not supported at $n_{eff}$<1.5. FIG. 17B shows that insertion of 8 nm Cu—Ag film increases cut-off organic thickness as compared to the anode-free case. Increasing the top dielectric layer thickness of the DM reduces cut-off thickness, meaning that it increases $TE_0$ modal confinement. As can be seen, an effective index of $TE_0$ mode is higher than $n_{glass}$ along the entire organic thickness when the 150 nm bare ITO was used for the anode. It means that the $TE_0$ mode always exists when the device has the 150 nm ITO anode.

FIG. 17C shows an effective index ($n_{eff}$) of $TM_1$ mode as a function of organic layer or emissive material thickness ($t_{organic}$) The cut-off thickness significantly increases with Cu—Ag compared to the 150 nm bare ITO, but is slightly reduced compared to the anode-free ("no anode") case. Further increasing the top dielectric layer thickness on Cu—Ag reduces the cut-off thickness. For $TM_1$ mode, the total core thickness plays the most significant role, and increasing top dielectric thickness on Cu—Ag reduces margin for the organic layer thickness in the waveguide.

FIGS. 18A-18B show the same effective index plots for $TE_0$ and $TM_1$ modes, but as functions of waveguide core thickness ($t_{core}$) at an operating wavelength of 530 nm. The core thickness includes organic and anode layers. The organic layers include the EML, HTL, and ETL, while the anode includes DMD or ITO. Core thickness includes a thickness of all organic layers and anode thickness. The waveguide cladding includes the aluminum (Al) cathode and the glass substrate. FIG. 18A shows that the dielectric/Cu—Ag devices show the similar trends with slight differences, but show stark differences compared to bare ITO and anode-free samples. However, FIG. 18B shows that all devices have similar trends. $TM_1$ mode has a plasmonic property having an electric field perpendicular to the stacks, therefore the mode does not experience significant change due to the insertion of the thin Cu—Ag film.

FIG. 19A shows the structure of OLEDs with a metal-dielectric (MD) anode, where the top dielectric layer (D) in the DMD is 0 nm thick. FIGS. 3A-3B show that effective indices of $TE_0$ and $TM_1$ modes as functions of organic layer thickness ($t_{organic}$) at an operating wavelength of 530 nm. FIG. 19B shows that increasing the bottom dielectric thickness of the MD anode reduces the cut-off thickness, meaning that $TE_0$ mode is more tightly confined with thicker bottom dielectric layer in DMD. With an 80 nm thick bottom dielectric in the MD assembly, the $TE_0$ modal confinement is significantly enhanced, reducing the cut-off thickness because the $TE_0$ mode starts to be guided along the bottom dielectric layer in MD. The black and blue curves (150 nm bare ITO and No anode cases) are the same plot shown previously. It is plotted as a reference point.

FIG. 19C shows the effective index ($n_{eff}$) of $TM_1$ mode in the MD device as a function of organic layer thickness. The same trend is observable compared to the DM device examples. The cut-off thickness largely increases with Cu—Ag compared to the 150 nm bare ITO, but slightly reduces compared to the anode-free example. Further increases of the bottom dielectric thickness of the MD anode reduces the cut-off organic thickness. For the $TM_1$ mode, the total core thickness plays the most significant role, and increasing the bottom dielectric of the MD anode reduces margin for the organic layer thickness in the waveguide.

FIGS. 20A-20B show the same effective index ($n_{eff}$) plot, but as functions of waveguide core thickness at an operating wavelength of 530 nm. The core thickness includes organic and anode layers. The waveguide cladding includes the Al cathode and the glass substrate. FIG. 20A shows that the Cu—Ag/dielectric devices have similar trends with slight differences when the bottom dielectric is thin enough, e.g., less than about 40 nm. But it starts to show huge difference when the bottom dielectric (D) has a thickness of about 80 nm, as shown in the orange curve since the modal energy can largely be stored in the bottom dielectric layer. FIG. 20B shows the effective index change of the $TM_1$ mode with the core thickness. Unlike the $TE_0$ mode, all devices show similar trends due to its plasmonic property.

FIG. 21A shows the structure of OLEDs with a DMD anode, where the bottom dielectric (D) is fixed to 40 nm. A bottom ITO was fixed to a thickness of 40 nm, and 40 nm and 80 nm ITO thicknesses were used for top dielectric. 8 nm Cu—Ag was used for metal conductor. Semi-infinite aluminum (Al) cathode and glass substrate were used. FIGS. 21B and 21C show effective indices of $TE_0$ and $TM_1$ modes as functions of $t_{organic}$ at operating wavelength of 530 nm. FIG. 21B shows that increasing the top dielectric thickness of the DMD anode reduces the cut-off thickness, meaning that $TE_0$ mode is more tightly confined with thicker DMD. This trend is consistent with the previous MD and DM anodes. The black and blue curves (150 nm bare ITO and anode-free cases) are the same plots as previously shown and used here for reference.

FIG. 21C shows effective index of $TM_1$ mode in the DMD device as a function of organic thickness. The same trend is observable compared to the MD and DM cases. The cut-off thickness largely increases with Cu—Ag film compared to the 150 nm bare ITO, but is slightly reduced compared to the anode-free case. Further increasing the top dielectric (D) of DMD reduces the cut-off organic thickness. For the $TM_1$ mode, the total core thickness determines the cut-off thickness, thus increasing the top dielectric of the DMD anode reduces margin for the organic layer thickness in the waveguide.

FIGS. 22A-22B show the same effective index ($n_{eff}$) plots as before, but as functions of waveguide core thickness at an operating wavelength of 530 nm. FIG. 22A shows that the DMD devices with similar cut-off thicknesses have only slight differences. FIG. 22B shows the effective index change of the $TM_1$ mode with the core thickness, and the devices show less difference as compared to the $TE_0$ counterpart.

FIG. 23A shows the structure of OLEDs with DMD anode, where the top dielectric layer (D) thickness is fixed at 40 nm. FIGS. 23B-23C show effective indices of $TE_0$ and $TM_1$ modes as functions of $t_{organic}$ at an operating wavelength of 530 nm. FIG. 23B shows that increasing the bottom dielectric of the DMD anode reduces the cut-off thickness. The $TE_0$ mode is more tightly confined with a thicker DMD. This trend is consistent with the previous results. Especially, a DMD structure with 40 nm ITO/8 nm Cu—Ag/80 nm ITO shows very strong modal confinement, showing little margin for organic thickness for the modal cut-off. It is because the thickness of DMD is very thick, even comparable the 150 nm ITO, and thus it shows very strong mode confinement.

FIG. 23C shows effective index ($n_{eff}$) of $TM_1$ mode in a DMD device as a function of organic thickness at operating wavelength of 530 nm. The same trend is observable compared to the previous samples. The organic cut-off thickness largely increases with the Cu—Ag film, as compared to the 150 nm bare ITO, but is slightly reduced when compared to the anode-free sample. Further, an increase of the bottom dielectric of DMD reduces the cut-off organic thickness. For the $TM_1$ mode, the total core thickness determines the cut-off thickness, thus increasing the top dielectric of the DMD anode reduces margin for the organic layer thickness in the waveguide.

FIGS. 24A-24B show the same effective index ($n_{eff}$) plots, but as functions of waveguide core thickness at an operating wavelength of 530 nm. FIG. 24A shows DMD devices with similar cut-off thicknesses, but with only slight differences, when the bottom dielectric layer (D) is thin enough. However, with an 80 nm bottom D thickness of the DMD anode, the $TE_0$ modes shows highly reduced cut-off thickness, meaning that the modal confinement of the mode becomes highly enhanced with thick bottom D in DMD. FIG. 24B shows the effective index change of the $TM_1$ mode with the core thickness, and the devices show similar cut-off thicknesses with less difference as compared to the $TE_0$ counterpart.

FIG. 25A shows the structure of an OLEDs with a DMD anode with the assumption of emission of red light. FIGS. 25B-25C show effective indices ($n_{eff}$) of $TE_0$ and $TM_1$ modes as functions of $t_{core}$ at an operating wavelength of 650 nm. FIG. 25B shows that changing the dielectric thicknesses of the DMD anode does not significantly change the cut-off thickness. This trend is different from the previous results at the green wavelength range. Because the operating wavelength is much larger than the structure, the modal cut-off phenomenon is not affected much by the small change of the core thickness. For reference, the black and blue curves correspond to the waveguides with 150 nm bare ITO and anode-free examples, respectively.

FIG. 25C shows effective index of $TM_1$ mode in the DMD device as a function of core thickness at operating wavelength of 650 nm. The same trend is observable compared to the DMD waveguides operating at green wavelength. The cut-off thickness does not change much by small changes of thicknesses of the DMD anode.

FIG. 26A shows the structure of an OLED with DMD anode with the assumption of blue light emission. FIGS. 26B-26C show that effective indices of $TE_0$ and $TM_1$ modes as functions of tore at operating wavelength of 450 nm. FIG. 26B shows that changing the dielectric thicknesses of the DMD anode does not significantly change the cut-off thickness. This trend is similar to that observed in the red wavelength example. But, the cut-off thicknesses appear at lower thicknesses $t_{core}$ than the red and green cases, due to shorter operating wavelength. For reference, the black and blue curves correspond to the waveguides with 150 nm bare ITO and anode-free, respectively.

FIG. 26C shows the effective index ($n_{eff}$) of $TM_1$ mode in a DMD device as a function of core thickness at an operating wavelength of 450 nm. The same trend is observable compared to the DMD waveguides operating at the green and red operating wavelength. The cut-off thickness does not change much by small change of thicknesses in the DMD anode thicknesses.

FIG. 27A shows a structure of an OLED with an MD anode structure, where the top dielectric (D) in the DMD assembly has a thickness of 0 nm. FIGS. 27B-27C show effective indices of $TE_0$ and $TM_1$ modes as functions of $t_{organic}$ at an operating wavelength of 450 nm. FIG. 27B shows that increasing the bottom dielectric thickness of the MD anode reduces the cut-off thickness, meaning that $TE_0$ mode is more tightly confined with thicker bottom dielectric layer in DMD. With an 80 nm thick bottom dielectric in the MD anode, the $TE_0$ mode is strongly confined in the waveguide and does not experience the cut-off even at $t_{organic}=0$ nm. It means that the anode itself can support $TE_0$ mode without help of the organic layer. For reference, the black and blue curves correspond to the 150 nm bare ITO and anode-free cases.

FIG. 27C shows effective index ($n_{eff}$) of $TM_1$ mode in the MD device as a function of organic layer thickness. The same trend is observable compared to the DM and DMD anode-based devices. The cut-off thickness largely increases with Cu—Ag compared to the 150 nm bare ITO, but is reduced compared to the anode-free case. Further, an increase of the bottom dielectric of the MD anode reduces the cut-off organic thickness. For the $TM_1$ mode, the total core thickness plays the most significant role, and increasing the bottom dielectric thickness of the MD anode reduces the margin for the organic layer thickness in the waveguide.

FIGS. 28A-28B show an effective index ($n_{eff}$) plot, but as functions of waveguide core thickness at an operating wavelength of 450 nm. FIG. 28A shows that the Cu—Ag device and Cu—Ag on 40 nm dielectric devices show the similar trends with slight differences. However, when the bottom dielectric becomes 80 nm thick, the $TE_0$ mode is strongly confined in the waveguide without modal decoupling as shown in the orange curve. FIG. 28B shows the effective index change of the $TM_1$ mode with the core thickness. Unlike the $TE_0$ mode, all devices show similar trends and cut-off thicknesses due to its plasmonic property.

FIG. 29A shows the structure of OLEDs with a DMD anode, where the top dielectric layer (D) is fixed to a thickness of 40 nm. FIGS. 29B-29C show effective indices ($n_{eff}$) of $TE_0$ and $TM_1$ modes as functions of $t_{organic}$ at an operating wavelength of 450 nm. FIG. 29B shows that increasing the thickness of the bottom dielectric of the DMD anode reduces the cut-off thickness. The $TE_0$ mode is more tightly confined with a thicker DMD. This trend is consistent with the previous results. The example of a DMD anode with 40 nm thick ITO/8 nm thick Cu—Ag/80 nm thick ITO shows very strong modal confinement, showing no modal cut-off.

FIG. 29C shows effective index of $TM_1$ mode in the DMD device as a function of organic thickness at operating wavelength of 450 nm. The same trend is observable compared to the previous cases. The organic cut-off thickness largely increases with the Cu—Ag film compared to the 150 nm bare ITO but reduces compared to the No anode case. Further increase of the bottom dielectric of DMD reduces the cut-off organic thickness. For the $TM_1$ mode, the total core thickness determines the cut-off thickness, thus increasing the top dielectric of the DMD anode reduces margin for the organic layer thickness in the waveguide.

FIGS. 30A-30B show an effective index ($n_{eff}$) plot as functions of waveguide core thickness at an operating wavelength of 450 nm. FIG. 30A shows that the DMD devices with similar cut-off thicknesses have slight differences when the bottom dielectric layer (D) is thin enough. However, with an 80 nm thick bottom D of the DMD anode, the $TE_0$ modes shows strong modal confinement and does not experience mode cut-off. FIG. 30B shows the effective index change of the $TM_1$ mode with the core thickness, and the devices show similar cut-off thicknesses with less difference compared to the $TE_0$ counterpart.

The thin metal based transparent conductor can also be used to construct both-sides or dual-sided emitting OLEDs, in which case it becomes a see-through or transparent OLED. FIGS. 31A-31C show an effective index plot as functions of organic layer thickness at operating wavelength of 530 nm. FIG. 31A shows schematic illustration of transparent OLEDs. Organic layers are assumed to be neat CBP layer. Cu—Ag or ITO is used for top and bottom electrodes. FIG. 31B shows that $TE_0$ mode exists in the entire organic layer thickness due to thick ITO layers that have relatively high refractive index. ITO strongly confines waveguide mode, therefore $TE_0$ mode in ITO transparent OLEDs have a high effective index. However, transparent OLEDs with a Cu—Ag electrode do not support TE waveguide mode at organic thickness around 200 nm, transferring its corresponding energy to substrate and air. FIG. 31C shows effective index of $TM_0$ mode of each OLED. Unlike single-sided emitting OLEDs, transparent OLEDs do not support $TM_1$ mode, but $TM_0$ mode. $TM_0$ mode does not disappear in single-sided emitting OLEDs with thick Al cathode, but $TM_0$ mode disappears in transparent OLEDs due to the absence of thick Al cathode. $TM_0$ mode does not disappear in the ITO device, but disappears in Cu—Ag device, showing great characteristic of Cu—Ag for transparent OLEDs.

FIGS. 32A-32D show spectral power dissipation plots of ITO and Cu—Ag transparent OLEDs. FIG. 32A is a conventional transparent OLED that uses ITO for top and bottom electrodes. FIG. 32B is a Cu—Ag transparent OLED that uses ultrathin Cu—Ag films for top and bottom electrodes. The emissive active layer always excites TM and TE modes in transparent OLEDs, due to thick organic and electrode thicknesses. In this structure, only $TE_0$ and $TM_0$ modes are excited in ITO transparent OLEDs. $TM_1$ mode is not excited unlike single-sided emitting OLEDs having a thick Al cathode. The two waveguide modes, $TE_0$ and $TM_0$ modes, are denoted in FIG. 32C and a significantly large amount of energy is dissipated due to these modes. However, FIG. 32D shows that Cu—Ag transparent OLED does not have any waveguide mode. It only shows glass mode that is not a waveguide mode. Glass mode can easily be extracted. Simple replacement of ITO with Cu—Ag film in transparent OLEDs eliminates the waveguide modes and transfer its corresponding energy to the glass substrate.

FIG. 33 shows transferred energy to each mode. Air mode in an ITO transparent OLED has only 10%, whereas that in Cu—Ag transparent OLED 23%. It means Cu—Ag transparent OLED already has higher brightness without outcoupling structure, and it can be further enhanced with substrate mode extraction. Thick ITO and organic layers trap significant portions of light, showing large waveguide mode portion. However, Cu—Ag transparent OLED does not have waveguide mode, thereby showing zero waveguide mode energy portion. This type of approach is very new in transparent OLEDs. All previous works of transparent OLEDs focused on outcoupling of waveguide mode. However, waveguide mode is entirely absent in certain OLED designs provided by the certain aspects of the present disclosure, because the designs incorporate waveguide mode cutoff conditions based on Maxwell's equations solved for OLED structures. Therefore, transparent OLEDs can be designed that desirably do not support waveguide mode. Even $TM_0$ mode does not exist in Cu—Ag transparent OLEDs. This approach provides benefits in that it is simple, cost-effective, and applicable to large area devices important for display/lightings industry. Due to complete waveguide mode elimination (all $TE_0$, $TM_0$, and $TM_1$ modes), significant external quantum efficiency (EQE) can be achieved, where maximum achievable EQE with the assumption of lossless Cu—Ag is theoretically 100%. This value can be reduced to 85% with loss included.

In conclusion, coupling of the generated light to the waveguide mode inside an OLED is a significant waste of energy. Conventional methods to outcouple the waveguide modes may negatively impact electrical properties of OLEDs and are cost ineffective. The present disclosure contemplates a simple, but effective method of eliminating certain undesirably waveguide modes by using a transparent ultrathin Cu—Ag anode to enhance EQE without compromising performance of the OLEDs. Due to the extremely thin nature of Cu—Ag film and the antireflective (AR) effect of the HTL, a Cu—Ag anode provided in accordance with certain aspects of the present disclosure provides excellent properties as a transparent conductor for OLED. The theoretical analysis shows that $TE_0$ waveguide mode is decoupled due to large negative permittivity of Cu—Ag reducing effective index of the $TE_0$ mode lower than the refractive index of the substrate, relaxing the mode to the substrate. Also, it was found that $TM_1$ waveguide mode is decoupled because the ultrathin transparent Cu—Ag anode reduces a total thickness of the OLEDs to be thinner than the cutoff thickness for the $TM_1$ mode. Therefore, the superior optical and physical properties of the Cu—Ag film anode suppress formation of the two waveguide modes and enhance device efficiency. As discussed above, suppression of the waveguide modes was experimentally verified by measuring its light intensities using index-matched fluid and prism. As such, the present disclosure provides the ability to completely eliminate select waveguide modes, rather than extracting it by external means in previous attempts. This desirably increases device efficiency in OLEDs.

The present disclosure thus provides ways to enhance light management and extraction in organic light-emitting diodes (OLEDs) to obtain high external quantum efficiency (EQE). Here, a novel and simple approach of using an ultrathin electrically conductive transparent film, such as one comprising Ag, as an anode can serve to completely eliminate undesirable waveguide modes and enhance outcoupling efficiency of OLEDs. The OLED structure can be easily designed to below the cutoff thickness of waveguide modes in the visible band by using such an ultrathin conductive metal electrode. The negative permittivity, extremely thin thickness (for example, approximately 5 nm), and highly conductive properties achieved by a uniform Cu-seeded Ag film as a transparent electrode enhance EQE without compromising any other characteristics of OLEDs. This simple yet effective method of suppressing waveguide modes formation provides cost-effective high efficiency OLEDs for various applications, including displays.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of increasing light emission efficiency in an organic light emitting diode, the method comprising:
eliminating or reducing at least one waveguide mode selected from the group consisting of: transverse electric ($TE_0$) mode, transverse magnetic ($TM_1$) mode, and combinations thereof by disposing an ultrathin electrically conductive transparent electrode having a first polarity within the organic light emitting diode comprising:
a transparent substrate on which the ultrathin electrically conductive transparent electrode is disposed;
an emissive active assembly for generating photons that defines a first side and a second opposite side, wherein the ultrathin electrically conductive transparent electrode is disposed along the first side; and
a second electrode having a second polarity opposite to the first polarity disposed adjacent to the second side of emissive active assembly; and
increasing an external quantum efficiency of the organic light emitting diode to greater than or equal to about 30%.

2. The method of claim 1, wherein the organic light emitting diode is free of indium tin oxide.

3. The method of claim 1, wherein the second electrode is a transparent electrode comprising a conductive oxide film or a conductive metallic film.

4. The method of claim 1, wherein the ultrathin electrically conductive transparent electrode is metallic and comprises silver (Ag).

5. The method of claim 4, wherein the ultrathin electrically conductive transparent electrode further comprises copper, aluminum (Al), titanium (Ti), nickel (Ni), chromium (Cr), gold (Au), magnesium (Mg), tantalum (Ta), germanium (Ge), Palladium (Pd), or combinations thereof.

6. The method of claim 1, wherein the ultrathin electrically conductive transparent electrode is metallic and comprises a first layer comprising a first material selected from a group consisting of: copper (Cu), titanium (Ti), nickel (Ni), chromium (Cr), gold (Au), magnesium (Mg), tantalum (Ta), germanium (Ge), palladium (Pd), and combinations thereof and a second layer comprising a second material selected from a group consisting of: silver (Ag), copper (Cu), gold (Au), platinum (Pt), and combinations thereof.

7. The method of claim 1, wherein the ultrathin electrically conductive transparent electrode has a thickness of less than or equal to about 12 nm.

8. The method of claim 1, wherein the ultrathin electrically conductive transparent electrode has a thickness of greater than or equal to about 2 nm to less than or equal to about 10 nm.

9. The method of claim 1, wherein a thickness of the emissive active assembly is greater than or equal to 20 nm.

10. The method of claim 1, wherein the EQE is greater than or equal to about 40%.

11. The method of claim 1, wherein the ultrathin electrically conductive transparent electrode is metallic and has a transparency of greater than or equal to about 60% for a portion of an electromagnetic spectrum having a range of predetermined wavelengths.

12. The method of claim 11, wherein the portion of the electromagnetic spectrum having the range of predetermined wavelengths emitted from the organic light emitting diode displays minimal angle dependence that varies less than or equal to about 20 nm at a viewing angle ranging from about 0° to about 60° with respect to the organic light emitting diode.

13. The method of claim 1, wherein the emissive active assembly comprises:
an emissive active layer;
a first charge transport layer disposed between the emissive active layer and the ultrathin electrically conductive transparent electrode; and
a second charge transport layer disposed between the emissive active layer and the second electrode.

14. The method of claim 13, wherein a combined thickness of the emissive active layer, the first charge transport layer, and the second charge transport layer is greater than or equal to 100 nm.

15. A method of increasing light emission efficiency in an organic light emitting diode, the method comprising:
eliminating a transverse electric ($TE_0$) mode and a transverse magnetic ($TM_1$) mode in the organic light emitting diode by disposing an ultrathin electrically conductive transparent metallic electrode having a first polarity within the organic light emitting diode that comprises:
a transparent substrate on which the ultrathin electrically conductive transparent metallic electrode is disposed;
an emissive active assembly for generating photons that defines a first side and a second opposite side, wherein the ultrathin electrically conductive transparent metallic electrode is disposed along the first side;
a second electrode having a second polarity opposite to the first polarity disposed adjacent to the second side of emissive active assembly, wherein the organic light emitting diode is free of indium tin oxide (ITO); and
increasing an external quantum efficiency of the organic light emitting diode to greater than or equal to about 30%.

16. The method of claim 15, wherein the ultrathin electrically conductive transparent metallic electrode comprises silver (Ag).

17. The method of claim 16, wherein the ultrathin electrically conductive transparent metallic electrode further comprises a material selected from the group consisting of: copper (Cu), aluminum (Al), titanium (Ti), nickel (Ni), chromium (Cr), gold (Au), magnesium (Mg), tantalum (Ta), germanium (Ge), palladium (Pd), and combinations thereof.

18. The method of claim 15, wherein the ultrathin electrically conductive transparent metallic electrode comprises a first layer comprising a first material selected from a group consisting of: copper (Cu), titanium (Ti), nickel (Ni), chromium (Cr), gold (Au), magnesium (Mg), tantalum (Ta), germanium (Ge), palladium (Pd), and combinations thereof and a second layer comprising a second material selected from a group consisting of: silver (Ag), copper (Cu), gold (Au), platinum (Pt), and combinations thereof.

19. The method of claim 15, wherein the ultrathin electrically conductive transparent metallic electrode has a thickness of less than or equal to about 12 nm.

20. The method of claim 15, wherein the ultrathin electrically conductive transparent metallic electrode has a thickness of greater than or equal to about 2 nm to less than or equal to about 10 nm.

21. The method of claim 15, wherein the EQE is greater than or equal to about 40%.

22. The method of claim 15, wherein the emissive active assembly comprises:
an emissive active layer;
a first charge transport layer disposed between the emissive active layer and the ultrathin electrically conductive transparent metallic electrode; and
a second charge transport layer disposed between the emissive active layer and the second electrode.

23. The method of claim 22, wherein a combined thickness of the emissive active layer, the first charge transport layer, and the second charge transport layer is greater than or equal to 100 nm.

24. An organic light emitting diode device comprising:
a transparent substrate;
an ultrathin electrically conductive transparent metallic electrode having a first layer comprising copper and a second layer comprising silver disposed over the first layer;
an emissive active layer defining a first side and a second opposite side;
a first charge transport layer disposed on the first side between the emissive active layer and the ultrathin electrically conductive transparent metallic electrode;
a second charge transport layer disposed on the second side of the emissive active layer; and
a second electrode having a second polarity opposite to the first polarity disposed adjacent to the second charge transport layer, wherein the organic light emitting diode device is free of a transverse electric ($TE_0$) waveguide mode and has an external quantum efficiency of the organic light emitting diode to greater than or equal to about 30%.

25. The organic light emitting diode device of claim 24, wherein the second electrode is a transparent electrode comprising a conductive oxide film or a conductive metallic film.

26. The organic light emitting diode device of claim 24, wherein the second electrode is transparent and comprises a second ultrathin electrically conductive transparent metallic electrode to form a dual-side emitting organic light emitting diode.

27. The organic light emitting diode device of claim 24, wherein the ultrathin electrically conductive transparent electrode has a transparency of greater than or equal to about 60% for a portion of an electromagnetic spectrum having a range of predetermined wavelengths.

28. The organic light emitting diode device of claim 24, wherein the ultrathin electrically conductive transparent metallic electrode is adjacent to at least one dielectric layer and forms part of an assembly having an electrode design selected from the group consisting of: dielectric-metal, metal-dielectric, and dielectric-metal-dielectric.

29. The organic light emitting diode device of claim 24, wherein the organic light emitting diode device is also free of a transverse magnetic ($TM_1$) mode waveguide mode.

30. The organic light emitting diode device of claim 24, wherein the organic light emitting diode device is free of indium tin oxide (ITO).

31. The organic light emitting diode device of claim 24, wherein the ultrathin electrically conductive transparent metallic electrode comprises silver (Ag).

32. The organic light emitting diode device of claim 31, wherein the second layer of the ultrathin electrically conductive transparent metallic electrode further comprises a material selected from the group consisting of: copper (Cu), titanium (Ti), nickel (Ni), chromium (Cr), gold (Au), magnesium (Mg), tantalum (Ta), germanium (Ge), palladium (Pd), and combinations thereof.

33. The organic light emitting diode device of claim 32, wherein the first layer of the ultrathin electrically conductive transparent metallic electrode consists essentially of copper (Cu) and the second layer consists essentially of silver (Ag).

34. The organic light emitting diode device of claim 24, wherein the ultrathin electrically conductive transparent metallic electrode has a thickness of less than or equal to about 12 nm.

35. The organic light emitting diode device of claim 24, wherein the ultrathin electrically conductive transparent metallic electrode has a thickness of greater than or equal to about 2 nm to less than or equal to about 10 nm.

36. The organic light emitting diode device of claim 24, wherein the EQE is greater than or equal to about 40%.

37. The organic light emitting diode device of claim 24, wherein ultrathin electrically conductive transparent metallic electrode has a transparency of greater than or equal to about 60% for a portion of an electromagnetic spectrum having a range of predetermined wavelengths and the portion of the electromagnetic spectrum having the range of predetermined wavelengths emitted from the organic light emitting diode displays minimal angle dependence that varies less than or equal to about 80 nm at an incidence angle ranging from about 0° to about 60° with respect to the organic light emitting diode.

38. The organic light emitting diode device of claim 24, wherein a combined thickness of the emissive active layer, the first charge transport layer, and the second charge transport layer is greater than or equal to 100 nm.

39. The organic light emitting diode device of claim 24, wherein the transparent substrate comprises at least one light scattering element selected from the group consisting of: an index matched fluid, a microlens, a scatterer-embedded fluid, and combinations thereof.

* * * * *